United States Patent [19]

Crow

[11] Patent Number: 5,748,063
[45] Date of Patent: May 5, 1998

[54] GENERATING HIGHLY UNIFORM ELECTROMAGNETIC FIELD CHARACTERISTICS

[75] Inventor: James T. Crow, Albuquerque, N. Mex.

[73] Assignee: Sandia Corporation, Albuquerque, N. Mex.

[21] Appl. No.: 637,952

[22] Filed: Apr. 25, 1996

Related U.S. Application Data

[63] Continuation-in-part of Ser. No. 455,819, May 31, 1995, which is a continuation-in-part of Ser. No. 328,849, Oct. 25, 1994, Pat. No. 5,640,287.

[51] Int. Cl.⁶ .................................................. H01F 5/00
[52] U.S. Cl. .......................... 335/299; 335/301; 324/319
[58] Field of Search .............................. 335/216, 299, 335/301; 324/318, 319, 320

[56] References Cited

U.S. PATENT DOCUMENTS

| | | | |
|---|---|---|---|
| 3,832,530 | 8/1974 | Reitboech et al. | 219/121.52 |
| 4,724,412 | 2/1988 | Kalafala | 335/299 |
| 4,771,244 | 9/1988 | Vermilyea | 324/320 |
| 4,833,410 | 5/1989 | Briquet et al. | 324/318 |
| 4,978,920 | 12/1990 | Mansfield, et al. | 324/318 |
| 5,006,804 | 4/1991 | Dorri et al. | 324/320 |
| 5,045,794 | 9/1991 | Dorri et al. | 324/320 |
| 5,280,154 | 1/1994 | Cuomo et al. | 219/121.52 |
| 5,307,039 | 4/1994 | Chari et al. | 335/299 |
| 5,410,287 | 4/1995 | Laskaris et al. | 335/216 |
| 5,530,355 | 6/1996 | Doty | 324/318 |

OTHER PUBLICATIONS

Banford, A.P., "The transport of Charged Particle Beams," E & F., Spon Ltd., (1966).

Crow, J.T., et al., "Beam Turning Magnet Design and Test for the Recirculation Linear Accelerator," Science Applications International Corp., (1991).

Deutsch, F., "Dipole and Quadrupole Planar Magnetic Fields Produced by Line Currents," Brit. Journal of Appl. Phys., (J. Phys. D.) Ser. 2, vol. 1 (1968).

Morris, D., "Shielded Four–Conductor Magnetic Field Assembly," Rev. Sci. Instrum., vol. 55, No. 9 pp. 1483–1485 (May 24, 1984).

New Products, Physics Today, p. 47 (Dec. 1993).

Partain, C.L., et al., "A Comparison of Resistive, Superconductive and Permanent Magnets," Chapter from Second Edition Magnetic Resonance Imaging, Second Edition pp. 1139–1144 (1988).

Peterson, V.Z., "Nuclear Research Magnets," Chapter from High Magnetic Fields—Proceedings of Int'l Conf. On High Magnetic Fields, pp. 726–736 (MIT Press Nov. 1–4, 1961).

Schmuser, P., "Superconducting Magnets for Particle Accelerators", Chapter from vol. Two, Amer. Inst. Of Phys—The Physics of Particle Accelerators, pp. 1100–1157, (1989–1990).

Primary Examiner—Michael L. Gellner
Assistant Examiner—Raymond Barrera
Attorney, Agent, or Firm—Jeffrey D. Myers

[57] ABSTRACT

An apparatus and method for generating homogenous electromagnetic fields within a volume. The homogeneity provided may be for magnetic and/or electric fields, and for field magnitude, radial gradient, or higher order radial derivative. The invention comprises conductive pathways oriented about a desired region of homogeneity. A corresponding apparatus and method is provided for substantially canceling the electromagnetic field outside of the apparatus, comprising a second set of conductive pathways placed outside the first set.

6 Claims, 55 Drawing Sheets

GENERATING HIGHLY UNIFORM ELECTROMAGNETIC FIELD CHARACTERISTICS

CROSS-REFERENCE TO RELATED APPLICATIONS

This application is a continuation-in-part application of U.S. patent application Ser. No. 08/455,819, entitled "Generating Highly Uniform Electromagnetic Field Characteristics", to Crow, filed on May 31, 1995, which is a continuation-in-part application of U.S. patent application Ser. No. 08/328,849, entitled "Generating Highly Uniform Electromagnetic Field Characteristics", to Crow, filed on Oct. 25, 1994, now Pat. No. 5,640,287 the teachings of both of which are incorporated herein by reference.

GOVERNMENT RIGHTS

The Government has rights to this invention pursuant to Contract No. DE-AC04-76DP00789 awarded by the U.S. Department of Energy.

BACKGROUND OF THE INVENTION

1. Field of the Invention (Technical Field)

The present invention relates to methods and apparatuses for generating magnetic and/or electric fields with highly uniform field strengths and directions (dipole fields), highly uniform radial gradients of the field strengths within the body of the device (quadrupole fields), or higher order fields (sextupole, octupole, and above) within the body of the device that are highly uniform in the desired radial field derivative. The invention also relates to associated methods and apparatuses for effective cancellation of fields external to the device, and for rotation of fields in space.

The uniform magnetic field and field cancellation devices apply most dramatically to medical magnetic resonance imaging (MRI) and other imaging applications, such as nuclear magnetic resonance microscopy and spectroscopy, and to charged particle beam guiding.

Uniform electric fields have application in charged particle beam guiding, for example in electron beam devices such as oscilloscopes and in mass spectrometers and charged particle energy analyzers.

Uniform dipole fields, uniform radial magnetic field gradients, and higher order multipole magnets have application in charged particle beam guiding and focusing for ion implantation, electron beam devices and in high-power charged particle accelerators.

Uniform and higher order electric field gradients have application in the separation of components of liquids or gases with different dielectric constants, or separation of components with different electric dipole moments whether electric field induced or permanent, such as metal particles in a gas or fluid, or water dispersed in oil.

2. Background Art

Background Art in the Generation of Uniform (Dipole) Magnetic Fields

Present devices for generating uniform magnetic fields in relatively large volumes are of three basic types: resistive solenoid magnets; superconductive solenoid magnets; and permanent magnets. Each device has significant drawbacks. Conventional resistive magnets are handicapped by limited field strength (approximately 0.2 T), cooling requirements, power consumption of 50 kW or more, high inductance which makes pulsed operation impractical, generation of substantial fringe fields, and poor patient access in MRI applications.

Conventional superconductive magnets, while providing for high fields (0.5 T to 2 T), have the disadvantages of high cost, need for complex cryogenic systems that are expensive to operate, high inductance (cannot be pulsed), generation of substantial fringe fields, and poor patient access.

Permanent magnets have lower fringe fields and good patient access, but have low magnetic fields (less than 0.1 T), are not adjustable in field strength, cannot be pulsed, and are very heavy (typically more than 12,000 pounds for a 0.064 T system).

An extremely important use of uniform magnetic field generation is MRI diagnostic procedures. They have the critical advantage of being non-invasive, and are not known to cause biological damage. MRI systems employ a strong constant uniform magnetic field (usually 0.3 T to 1.5 T) to align the magnetic dipoles of proton nuclear spins. These aligned dipoles are then tipped out of alignment by a radio frequency pulse. The constant applied field attempts to force the spinning dipoles back into alignment and they precess around the field direction, much like a gyroscope. This coherent precession and spin relaxation produces a radiated signal that is analyzed to produce an image. The actual process is more complicated, using field gradients and a variety of signal processing methods. In all systems, the image quality depends critically on the homogeneity and stability of the applied magnetic field.

The disadvantages of present MRI systems center primarily on the high-field magnet required and its external effects. MRI systems are expensive, with a high-field (1.5 T) system costing about $1,500,000. Much of the total cost of the facility, however, is due to site requirements pertaining to effects of the magnet's field on external objects and the effects of those objects on the magnet. The magnetic fields of conventional MRI systems extend far from the magnet. Referring to FIG. 1, in the conventional solenoidal coil magnet the current-carrying conductors wrap around the axis and the magnetic field lines must close on the outside of the magnet. This is true even if external cancellation coils or shields are used. Ferromagnetic objects near the magnet are strongly attracted toward the bore of the magnet, causing a missile hazard, and also perturb the magnetic field and the concomitant imaging process. The fields can affect pacemakers, instruments, computers, video devices, watches, and even electric motors sufficiently close to the magnet. The Food and Drug Administration (FDA) requires that human access be restricted in areas in which the magnetic field exceeds 0.0005 T (5 G). FIG. 2, taken from Partain et al., Magnetic Resonance Imaging vol. 2 (2d ed. 1988), shows the range of the field and recommended minimum distances for various items from a conventional 0.5 T magnet. These requirements are such that the MRI device often cannot be located in a hospital, but must be in a separate remote site. These costs are necessarily reflected in cost to the patient.

The conventional solenoidal magnet configuration also has other disadvantages for the patient. The imaging processes presently in use require the patient to lie as still as possible in the magnet, which is enclosed except for one end, for 30 minutes or more. While every effort is made to reduce the feeling of confinement, 5% to 10% of patients are unable to undergo the procedure because of claustrophobic effects. The procedure is especially difficult for children, particularly because the FDA mandated restricted access inside the 5 G boundary generally excludes everyone but the patient from the room. In addition, access to the patient is difficult, making it hard to ascertain patient status, position, or movement.

The present invention provides devices and methods for generating uniform magnetic fields that reduce or eliminate the disadvantages of present systems listed above. The invention uses a relatively small number of conductors parallel to the long axis, preferably connecting together at the ends. The patient, in the preferred embodiment, enters through the side in a natural opening, rather than through an end, and is not in an enclosed space. The patient may be oriented either along the axis or across the magnet (see FIG. 3). Most importantly, with the use of the field canceling system, the external fields decrease very rapidly with distance from the magnet, permitting elimination of shielding. FIGS. 4a and 4b show field lines in a 16-wire embodiment of the present invention without (FIG. 4a) and with (FIG. 4b) field canceling coils. The field lines extend well outside the magnet without the field canceling coils, but are confined inside the magnet with field canceling coils. Furthermore, the inductance of the present invention is much lower than that of conventional solenoidal magnets, permitting pulsing of the system.

Background Art in the Generation of Uniform Quadrupole, Sextupole, and Higher Order Magnetic Fields Present devices for generating uniform quadrupole (uniform radial gradient), sextupole (uniform first derivative of the radial gradient), and higher order magnetic fields are generally of three types: those that use appropriately shaped iron or a similar ferromagnetic material wound with current-carrying coils; systems of current-carrying conductors without iron cores; and shaped permanent magnet assemblies. These magnetic devices are used primarily for focusing and guiding charged particle beams.

The most common configurations use iron cores and coils as shown in FIG. 5. These devices have the following disadvantages: (1) the useful volume of the device is a small fraction of the total because the beam must be inside the pole faces and most of the volume is occupied by the coils and iron cores; (2) the iron cores are a complex shape and must be machined with high accuracy; (3) the accuracy of the system is limited by the accuracy of the machining of the pole faces and by small variations in the homogeneity of the permeability of the iron core; and (4) the maximum magnetic field strength available in this device is limited by onset of saturation of the iron core, which introduces nonuniformities in the fields and field gradients.

Systems using permanent magnets in lieu of current-carrying coils have most of the same limitations listed above, in that they usually use shaped iron pole faces or shaped permanent magnets. In addition, such systems are limited in field strength by the permanent magnets and are not readily adjustable in field strength.

Systems using coils without iron cores avoid many of the above difficulties, but generally depend on approximations to a $\sin(\phi)$ or $\cos(\phi)$ current distribution of limited accuracy, depend on shims and wedges to improve accuracies of the fields, and have a useful beam area that is small relative to the magnet size. FIG. 6 shows a schematic of a dipole magnet in use in several accelerators. Schmuser, "Superconducting Magnets for Particle Accelerators," AIP Conference Proceedings 249, vol. 2, Physics of Particle Accelerators (American Institute of Physics, 1992).

The present invention, in the configuration that produces uniform field gradients or higher order multipoles, eliminates the need for iron cores to achieve high accuracy, is simple in construction in that it requires a relatively small number of conductors to achieve high accuracy in a volume that is a high percentage of the total device volume, and is not limited in field strength by saturation of iron cores. The system is well-behaved, and can readily achieve field gradient accuracies much greater than devices using iron cores. The present invention also has the advantages of open construction and easy access. This is advantageous when employing, e.g., beam test instrumentation or other beam guiding elements, such as electrical guiding plates.

The present invention, in the quadrupole and higher order configurations, can also use a system of field cancellation coils similar to those of the uniform field configuration to reduce stray external fields to a very low value. Field cancellation in the radial gradient (quadrupole) and higher order multipole configurations is even more effective than in the dipole field configuration, since the main generating coils are quadrupole and higher order, rather than dipole, and so the external fields generated by the combination of the main and field canceling coils behave as even higher order multipoles, and decrease more rapidly with distance.

Background Art in the Generation of Uniform Electric Fields

Electric fields that are uniform in magnitude and direction are commonly generated by establishing an electric potential difference between two parallel conducting plates. Until the conception of the present invention there has been no method for locating individual charged line conductors in a configuration that produces a volume of uniform electric field that is large compared to the volume of the apparatus. In the present invention, in the configuration of linear conductors or loops that produce uniform magnetic fields when energized with a current, if the conductors each have electric charges of identical magnitudes applied (opposite polarity in the conductors that had opposite currents in the magnetic field configuration of the invention), the result is an electric field that has the same uniformity characteristics as the magnetic field configuration of the invention, but rotated ninety degrees.

Uniform electric fields have applications in guiding and turning charged particle beams, for example electron beams in oscilloscopes and similar fluorescent-screen imaging devices, in high energy particle accelerators, and in charged-particle-beam energy analyzers.

This linear-conductor large-volume electric dipole has the advantages of being light in weight and open for access to the useful center area. It also has very low capacitance, since the conductor surface area is very low compared to the parallel-plate devices, and so the generated electric field can be ramped at very high rates, which is useful for swept beams in imaging devices and time-resolved energy analyzers. In beam turning applications, a small difference in the charges applied to the conductors in each of the two halves of the device results in a small linear electric field gradient in the beam region, which is useful for beam centering in the turning system.

Leakage fields external to the device can be greatly decreased without solid shielding in the same way as with the magnetic field device. A system of conductors with the same azimuthal locations as the main field generating conductors, but at larger radius and carrying charges that are opposite in polarity and reduced in magnitude from the main conductor charges by the ratio of the main conductor cylinder radius to the field cancellation conductor cylinder radius reduces the external fields in the same manner as in the magnetic field version of the device.

Background Art in the Generation of Rotating Fields:

Highly uniform rotating magnetic fields have particular application in nuclear magnetic resonance spectroscopy, where at present solid samples are sometimes rotated at high speeds with rotation axes at or near a particular angle (about 54 degrees, the so-called "magic angle") with the magnetic field, which significantly enhances signal-to-noise ratios. The present invention allows high-speed rotation of the magnetic field, keeping the sample stationary. This permits rotation angular velocities far in excess of that achievable by mechanical systems, allowing extension to new regimes of rotation velocities, and to samples that would be destroyed when mechanically rotated in existing devices. The system of conductors that produces the rotating transverse magnetic field can be combined with an appropriately designed solenoid that produces a uniform constant longitudinal field so that the rotating net field vector makes any desired angle with the longitudinal axis of the system. Rotating fields can also be applied to imaging techniques, limited in the case of medical imaging to maximum rates of change of magnetic field set by the U.S. Food and Drug Administration (FDA).

SUMMARY OF THE INVENTION
(DISCLOSURE OF THE INVENTION)

The present invention is of an apparatus and method for generating an electromagnetic field having a region of homogeneity of a characteristic of the electromagnetic field, comprising: establishing a central axis; situating at least eight conductive pathways disposed about and substantially parallel to the central axis, azimuthal locations, current or charge magnitudes, and distances from the central axis of the conductive pathways being substantially defined by solutions to one or more equations selected from the following:

$$\frac{J}{C}\bigg|_{j=1} \left\{ 0.5 I_0 / R_0^{q(j+1)} + \sum_{n=1}^{N} I_n \cos[q(j+1)\phi_n] / R_n^{q(j+1)} = 0 \right\}$$

and $$\frac{J}{C}\bigg|_{j=1} \left\{ \sum_{n=1}^{N} I_n \sin[q(j+1)\phi_n] / R_n^{q(j+1)} = 0 \right\}$$

where N is a number of conductive pathways, $\phi_n$ are the azimuthal locations of the conductive pathways, $R_n$ are the distances from the central axis of the conductive pathways, $I_n$ are the current or charge magnitudes, J is an integer equal to one less than a total number of conductive pathways about the central axis, C is a collection of J equations to be solved, all identical except that running index j changes from 1 to J from equation to equation, $\Sigma$ is a sum of N terms in each equation over index n, q is a positive integer, and a number of planes of symmetry of the conductive pathways is less than 2q; and generating the electromagnetic field comprising a region of homogeneity of a characteristic selected from the group consisting of rate of rotation, field magnitude, radial gradient, and higher order radial derivatives of field magnitude. In the preferred embodiment, the resulting device is a magnetic resonance imager, a pulsed magnetic resonance imager, a magnetic resonance microscope, a nuclear magnetic resonance spectroscope, a charged particle beam steerer, a charged particle momentum analyzer, a high-field pulsed-beam charged particle momentum analyzer, a time-resolved charged-particle momentum analyzer, an atomic clock, an isotope separator, a charged particle beam focuser, a separator for removing ferromagnetic material from fluids, a charged particle beam guider, a charged particle energy analyzer, a separator of fluids having different dielectric properties, a separator of particles from fluids, or a rasterizer.

The invention is also of an apparatus and method for generating a shielded electromagnetic field having a region of homogeneity of a characteristic of the electromagnetic field, comprising: establishing a central axis; situating at least four primary and four secondary conductive pathways disposed about and substantially parallel to the central axis, azimuthal locations, current or charge magnitudes, and distances from the central axis of the conductive pathways being substantially defined by solutions to one or more equations selected from the following:

$$\frac{J_p}{C}\bigg|_{j=1} \left\{ 0.5[I_{0a}/R_{0a}^{q(j+1)} - I_{0b}/R_{0b}^{q(j+1)}] + \sum_{n=1}^{N} I_{na} \cos[(j+1)q\phi_{na}]/R_{na}^{q(j+1)} - \sum_{m=1}^{M} I_{mb} \cos[(j+1)q\phi_{mb}]/R_{mb}^{q(j+1)} = 0 \right\},$$

and $$\frac{J_s}{C}\bigg|_{j=1} \left\{ 0.5[I_{0a} R_{0a}^{q(j-1)} - I_{0b} R_{0b}^{q(j-1)}] + \sum_{n=1}^{N} I_{na} \cos[q(j-1)\phi_{na}] R_{na}^{q(j+1)} - \sum_{m=1}^{M} I_{mb} \cos[(j-1)q\phi_{mb}] R_{mb}^{q(j-1)} = 0 \right\},$$

and $$\frac{J_p}{C}\bigg|_{j=1} \left\{ \sum_{n=1}^{N} I_{na} \sin[(j+1)q\phi_{na}]/R_{na}^{q(j+1)} - \sum_{m=1}^{M} I_{mb} \sin[(j+1)q\phi_{mb}] R_{mb}^{q(j+1)} = 0 \right\},$$

and $$\frac{J_s}{C}\bigg|_{j=1} \left\{ \sum_{n=1}^{N} I_{na} \sin[(j-1)q\phi_{na}] R_{na}^{q(j-1)} - \sum_{m=1}^{M} I_{mb} \sin[(j-1)q\phi_{mb}] R_{mb}^{q(j-1)} = 0 \right\},$$

where N is a number of primary conductive pathways, M is a number of secondary conductive pathways, a is a suffix referring to a primary conductive pathway, b is a suffix referring to a secondary conductive pathway, $\phi$ are the azimuthal locations of said conductive pathways, R are the distances from said central axis of said conductive pathways, I are the current or charge magnitudes, $J_p$ is an integer equal to one less than a total number of primary conductive pathways about the central axis, $J_s$ is an integer equal to one less than a total number of secondary conductive pathways about the central axis, C is a collection of equations to be solved, all identical except that running index j changes from equation to equation from 1 up to $J_p$ for primary conductive pathways and $J_s$ for secondary conductive pathways, and q is a positive integer; and generating the electromagnetic field comprising a region of homogeneity of a characteristic selected from the group consisting of rate of rotation, field magnitude, radial gradient, and higher order radial derivatives of field magnitude. In the preferred embodiment, the resulting device is a magnetic resonance imager, a pulsed magnetic resonance imager, a magnetic resonance microscope, a nuclear magnetic resonance spectroscope, a charged particle beam steerer, a charged particle momentum analyzer, a high-field pulsed-beam charged particle momentum analyzer, a time-resolved charged-particle momentum analyzer, an atomic clock, an isotope separator, a charged particle beam focuser, a separator for removing ferromagnetic material from fluids, a charged particle beam guider, a charged particle energy analyzer, a separator of fluids having different dielectric properties, a separator of particles from fluids, or a rasterizer.

The invention is further of a method of improving the uniformity of a characteristic of a magnetic field, comprising: determining locations of existing means for providing the magnetic field; calculating locations of new conductive pathways to be placed outside of the existing means based on desired uniformity results; and situating the new conductive pathways at the calculated locations; wherein the characteristic is selected from the group consisting of rate of rotation, field magnitude, radial gradient, and higher order radial derivatives of field magnitude. In the preferred embodiment, locations are calculated based on desired uniformity and active shielding results.

The invention is still further of a method of providing active shielding of a magnetic field, comprising: determining locations of existing means for providing the magnetic field; calculating locations of new conductive pathways to be placed outside of the existing means based on desired active shielding results; and situating the new conductive pathways at the calculated locations. In the preferred embodiment, locations are calculated based on desired uniformity and active shielding results.

A primary object of the present invention is to provide methods and apparatuses for generating large-volume, highly uniform, magnetic and/or electric fields (dipole fields), or magnetic and/or electric fields with highly uniform gradients (quadrupole fields), or magnetic and/or electric fields with highly uniform higher order fields (sextupole, octupole, etc., fields) or magnetic and/or electric fields whose vector directions rotate in time about the longitudinal symmetry axis of the system at any chosen angle with respect to that axis.

An additional object of the magnetic field versions of the present invention is to eliminate many of the disadvantages of existing solenoid and permanent magnet and iron core systems for producing uniform magnetic fields or field gradients or higher order fields.

Another object of the present invention is to provide systems requiring little or no external shielding to greatly reduce leakage fields from the device.

Another object of the present invention is to allow the use, if needed, of external shields that protect the interior of the device from external fields without adversely affecting the homogeneity of the internal fields.

Yet another object of the present invention is to provide for large-volume, uniform magnetic fields useful for a variety of applications: MRI, pulsed MRI, NMR, chemical shift spectrometry, atomic clocks, fluid flow imagers, mass spectrometers, charged particle analyzers, guiding fields for turning charged particle beams, and the like.

Yet another object of the present invention is to provide for large volume magnetic fields with uniform gradient or higher order fields for use in focusing charged particle beams in accelerators, ion implantation, electron beams used for surface heating or welding and image producing devices, and the like.

Still another object of the present invention is to provide for highly uniform electric fields over large volumes using a highly open, low capacitance device that can be easily and rapidly pulsed or driven with high frequency varying potentials for beam steering in imaging devices and in beam energy analyzers and the like.

Yet another object of the present invention in its rotating magnetic field embodiment is to eliminate the limitations and disadvantages inherent in the rotating-sample methods of nuclear magnetic resonance microscopy and spectroscopy, by allowing much higher rotation rates of the sample with respect to the magnetic field since the low inductance rotating-field generator can be driven at high frequency and the sample remains stationary, and since the sample is stationary, allowing measurements of delicate samples that would be deformed or destroyed by the high accelerations of rotation.

The primary advantages of the uniform magnetic field embodiment of the present invention are that a large fraction of the magnet volume contains useful field and that it generates low external fields, incurs little perturbation from external objects, requires little or no additional shielding, and is low weight.

An additional advantage of the uniform magnetic field embodiment of the present invention is that it is readily located in multi-use buildings, such as hospitals, and may even be placed near other sensitive systems.

Another advantage of the present invention is that it produces no "missile effect" and operators incur negligible exposure to fields.

Yet another advantage of the imaging applications of the present invention is that it is patient friendly: the open geometry reduces claustrophobia, allows ready evaluation of patient condition, and the low external fields allow other persons (e.g., family) to remain nearby, even with large fields in the magnet interior.

Still another advantage of the present invention is that it provides improved instrument access, such as for imaging equipment and for patient positioning measurements in magnetic resonance imaging applications, and easy instrument and diagnostic access in other applications.

A further advantage of the present invention is that it can readily be scaled for specific applications; e.g., patients can lie across a compact version used exclusively for limbs, or a long, relatively small diameter magnet with its long side access slot may be employed for imaging sheets of material for defects.

Another advantage of the present invention is that it may be readily tuned during construction or on site by repositioning the small number of conductors or by using small currents in conductors near and parallel to the primary conductors.

An additional advantage of the present invention is that it can provide natural B-gradients for imaging applications requiring them.

Yet another advantage of the present invention is that it provides for low inductance in magnetic field embodiments, which permits pulsing of the invention, rendering feasible image data processing and interpretations at central locations of magnetic resonance images such as is now done with electrocardiograms (EKGs), and reducing cooling requirements for the magnet because of low duty cycle.

Still a further advantage of the present invention is that it may be incorporated into a system that is mobile, because the invention is low weight, generates small external fields, and is not subject to perturbations caused by external objects.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating the preferred embodiments of the invention and are not to be construed as limiting the invention. In the drawings.

DESCRIPTION OF THE PREFERRED EMBODIMENTS (BEST MODES FOR CARRYING OUT THE INVENTION)

The present invention produces large-volume, highly uniform, magnetic and/or electric fields, such as in a cylindrical system. The invention produces fields with high uniformity over a large fraction of the interior of a space, using a relatively small set of conductors parallel to an axis of the space. The fields external to the set of conductors can be effectively canceled by a set of conductors of larger radius in the same azimuthal positions as the primary set.

The invention is extensible to systems of higher order magnetic multipoles (uniform radial gradient quadrupole, uniform first-derivative sextupole, etc.) from the uniform field (dipole) configurations by applying appropriate spatial transformations or equation solutions as described below. The descriptions that follow will be of the uniform field embodiment of the invention. Descriptions of uniformity, linearity, and other characteristics of the fields apply equally to the higher-order multipole configurations by substituting "uniform radial gradient" in the quadrupole versions for "uniform field" in the dipole descriptions, and similarly substituting "uniform first derivative of the radial gradient" in the sextupole versions, etc. Elaboration of specific higher order characteristics will be made where needed.

There is an exact analogy between production using the invention of magnetic fields by sets of line currents and production of electric fields by line charges. If a substitution is made of line charges for line currents in the following descriptions, where the relative magnitude of the line charges follows the same relationship as the line currents in the magnetic case, electric fields are produced that have the same uniformity or gradient characteristics as the corresponding magnetic fields, but rotated 90 degrees about the cylinder axis.

Figure 7:
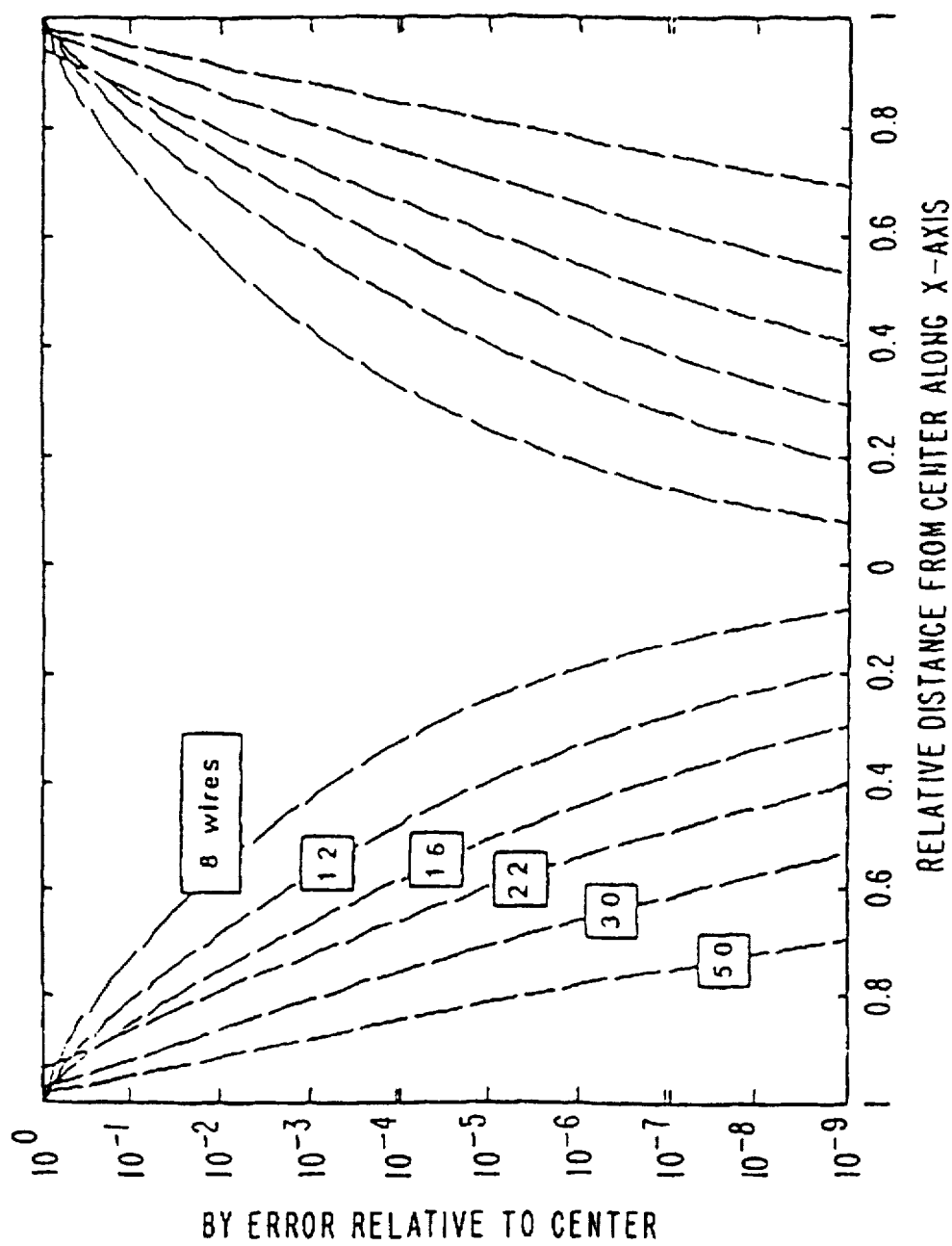
FIG. 7 is a graph of the error in $B_y$ in powers of 10 referenced against $B_y$ at the center versus distance from the center along the x-axis for 8, 12, 16, 22, 30, and 50-wire embodiments of the present invention.

Magnetic field fractional uniformity is defined as $B_{mag}(x, y)/B_{mag}(0,0)-1$, where $B_{mag}=(B_x^2+B_y^2)^{1/2}$, or, with negligible difference for high uniformity, $B_y(x,y)/B_y(0,0)-1$, with x and y in the plane of a cross-section of the cylinder. An identical definition applies to electric field uniformity with E substituted for B. The area of field of a given high uniformity is a large fraction of the cross-sectional area of the cylindrical surface on which the wires are located if the wires are positioned correctly according to the method of the invention. The size of the area of given uniformity increases with the number of wires used in optimum configurations, as illustrated in FIG. 7. Additionally, the field is well-behaved, with a nearly circular area of given uniformity, and with uniformity increasing monotonically with decreasing radius from the cylinder axis at all angles. The system scales linearly; if both x and y dimensions are scaled by the same constant, the dimensions of the area of a given field uniformity will be scaled by the same constant, the magnitude of the field increases linearly with wire current, and the magnitude of the field for a given current decreases as the inverse of the wire cylinder dimensional scaling factor. High uniformity systems can also be obtained in the present invention with conducting or high-permeability coaxial shields external to and coaxial with the wire cylinder if the current-carrying conductors are located according to solutions of the appropriate equations, as described below.

The uniform field embodiment of the invention also allows near-linear gradients in $B_y$ along x (particularly useful for magnetic resonance systems) to be produced by a simple uniform decrease in the currents or increase in the radius of the cylindrical surface on which the wires are located for the wires at negative x coordinates. This bias can also be used to compensate for the gradient produced by curving the system (to follow a charged beam being turned by the magnetic field) to return the field to uniform, or to produce a focus or increased particle energy acceptance range.

An iterative method for identifying optimum conductive pathway configurations involves plotting contours of constant fractional error in $B_y$ and contours of $B_x$. Such plots are preferably done by computer, for example with MATLAB (The Mathworks, Natick Mass.) software on the Apple Macintosh or IBM-PC-compatible platforms. The best field behavior (smoothness near the center) is achieved when the conductive pathways in the set are located such that contours of $B_x=0$ cross at the origin (center of the cylinder). The optimum (largest area of given uniformity) is achieved when the number of origin crossings of $B_x=0$ per quadrant is the largest achievable with the given number of conductive pathways; for optimum uniformity, this maximum number of crossings of the origin of $B_x=0$ contours (excluding the x and y axes, which by symmetry are $B_x=0$ contours) is generally equal to the number of free variables in the system, as described in the discussion below of the general solution. (Unless it is stated otherwise, the number of $B_x=0$ crossings refers to the origin intersections in the first quadrant, exclusive of the coordinate axis.) This can be verified by comparing plots of contours of fractional error of $B_y$ for various cases and noting that the largest area of a given uniformity occurs when the $B_x=0$ crossing criterion is satisfied. There is a small number of these optimum configurations for a given number of wires.

When the $B_x=0$ contours cross (or nearly cross) the origin, the contours of fractional error of $B_y$ form closed curves surrounding the origin that are scalloped and very nearly circular. If the $B_x=0$ contours do not cross the origin (which may happen if there are wire placement inaccuracies) the $B_x=0$ contours will close in loops. The approximate radius at which the $B_x=0$ loops close corresponds to the radius of best $B_y$ homogeneity. The $B_x=0$ contours and $B_y$ fractional error contours are, therefore, an effective tool for design of the uniform field magnets. This is further illustrated in the descriptions below.

It is convenient to distinguish two wire-set types: those in which there are no wires on the x-axis, thus producing an even number of wires in the semicircle with positive x (or negative x) coordinates; and the configuration in which there are conductive pathways on the x-axis, producing an odd number of wires in the positive-x semicircle.

Preferably, the wire sets are mirror-symmetric about both x and y planes, with the current reversed in the wires with negative x coordinates. Since the field uniformity is independent of the radius of the wire circle, the preferred wire locations are completely defined by angles measured from the x-axis. Only the first quadrant need be specified, with the remaining wires located by symmetry.

Right-circularly cylindrical systems (all wires at constant radius from the origin), with all wire currents of identical magnitude, are first discussed, including acceptable but non-preferred means for constructing highly homogenous systems. The invention is then extended to a general case means for constructing high homogeneity volumetric systems of arbitrary shape with currents that may vary from wire-to-wire, to quadrupoles and higher order multipoles, and to shielded systems and systems with active external field cancellation.

For the right-circular cylindrical cases, the invention produces a desired magnetic field $B_y$ (z being the coordinate of the long axis of the cylinder) by a current in sets of conductive pathways (such as wires or groups of wires) whose centroids are located on a cylindrical surface and located at specific angles measured from a symmetry plane. Currents in all conductive pathways are here taken to be identical in magnitude, with currents in the right half-plane opposite those in the left half-plane in the uniform field (dipole) configuration, opposite in adjacent quadrants in the quadrupole case, and so on for higher order multipoles. (At times in this application, "wire" will be used as a short-hand notation for conductive pathway, while the broader concept is always intended.)

Figure 35:
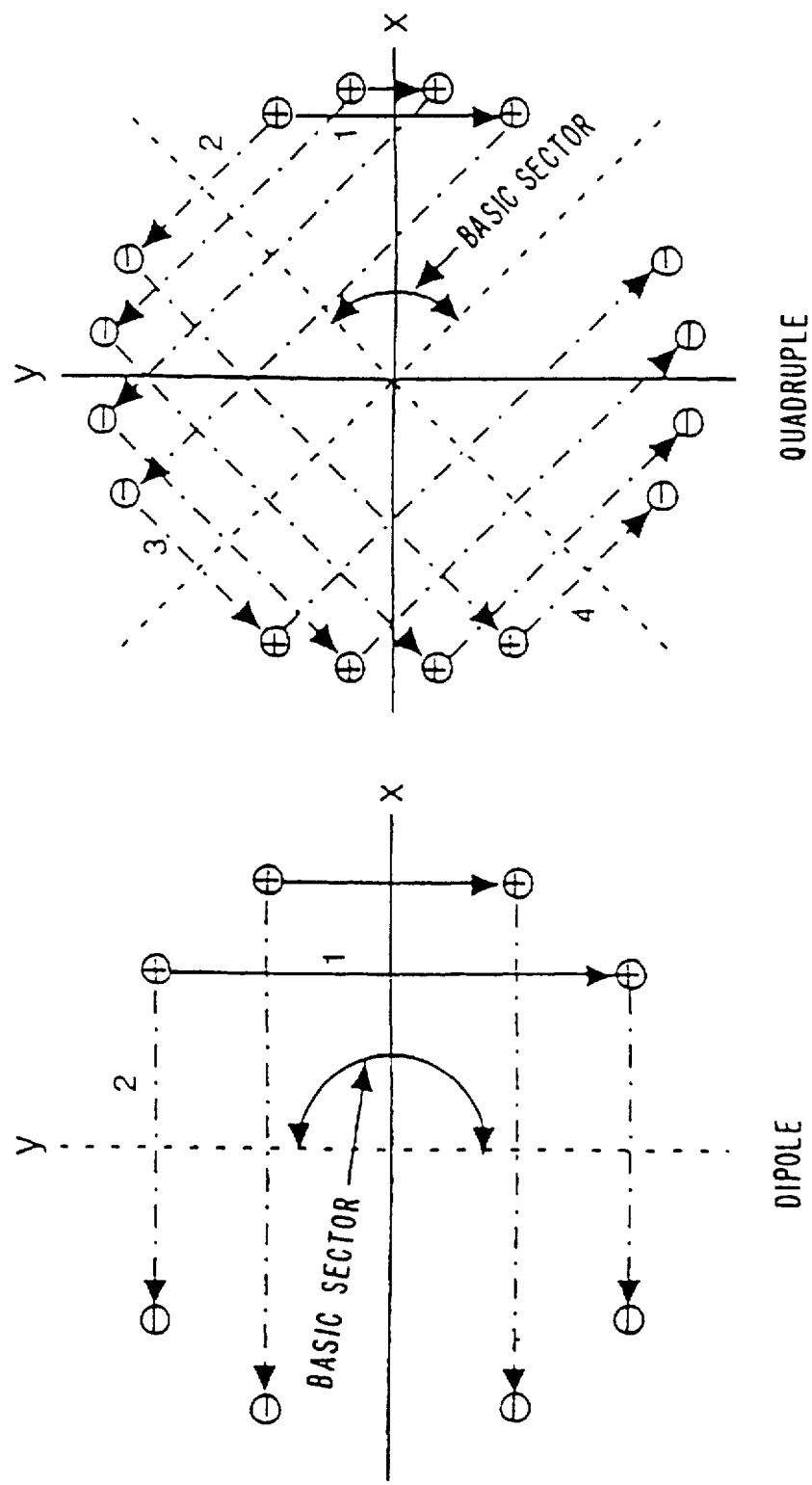
FIG. 35 illustrates the symmetry in wire placement employed by the present invention.

The first-quadrant location s for a given number of wires that will produce the optimum dipole field for right-circularly-cylindrical cases without wires on the x-axis can be derived by iteratively solving the following set of equations:

$$\cos[(2n + 1)\emptyset_n] + \cos[(2n + 1)\emptyset_{n-1}] + \ldots + \cos[(2n + 1)\emptyset_1] = 0$$
$$\cos[(2n - 1)\emptyset_n] + \cos[(2n - 1)\emptyset_{n-1}] + \ldots + \cos[(2n - 1)\emptyset_1] = 0$$
$$\cos[(2n - 3)\emptyset_n] + \cos[(2n - 3)\emptyset_{n-1}] + \ldots + \cos[(2n - 3)\emptyset_1] = 0$$
$$\vdots$$
$$\cos(5\emptyset_n) + \cos(5\emptyset_{n-1}) + \ldots + \cos(5\emptyset_1) = 0$$
$$\cos(3\emptyset_n) + \cos(3\emptyset_{n-1}) + \ldots + \cos(3\emptyset_1) = 0,$$

where n is the number of wires per quadrant, and the $\emptyset_n$ are the angular locations of the wires measured from the x-axis (if the desired field is chosen to be in the y-direction. Only the angles of the wires in the first quadrant need be specified, and the number of equations to be simultaneously solved is the same as the number of wires in the first quadrant, always beginning with the lowest order equation in cos (3$\emptyset$). Locations and current directions of wires in other quadrants are determined by reflection of the wire positions across planes with appropriate current direction changes. The reflection process is illustrated in FIG. 35. In the dipole, there are two basic sectors of wires. The first reflection is across the primary reflection plane, defined by the x-axis, which reproduces the first quadrant wires in the quadrant below the x-axis, creating the basic 180° dipole sector unit. There is no current change in this reflection. The next reflection is across the secondary reflection plane, in this case the y-axis, which includes a current direction change in all wires. This creates the second dipole 180° sector, completing the dipole. This reflection process will also apply to the higher order multipoles, as described below.

Figure 11:
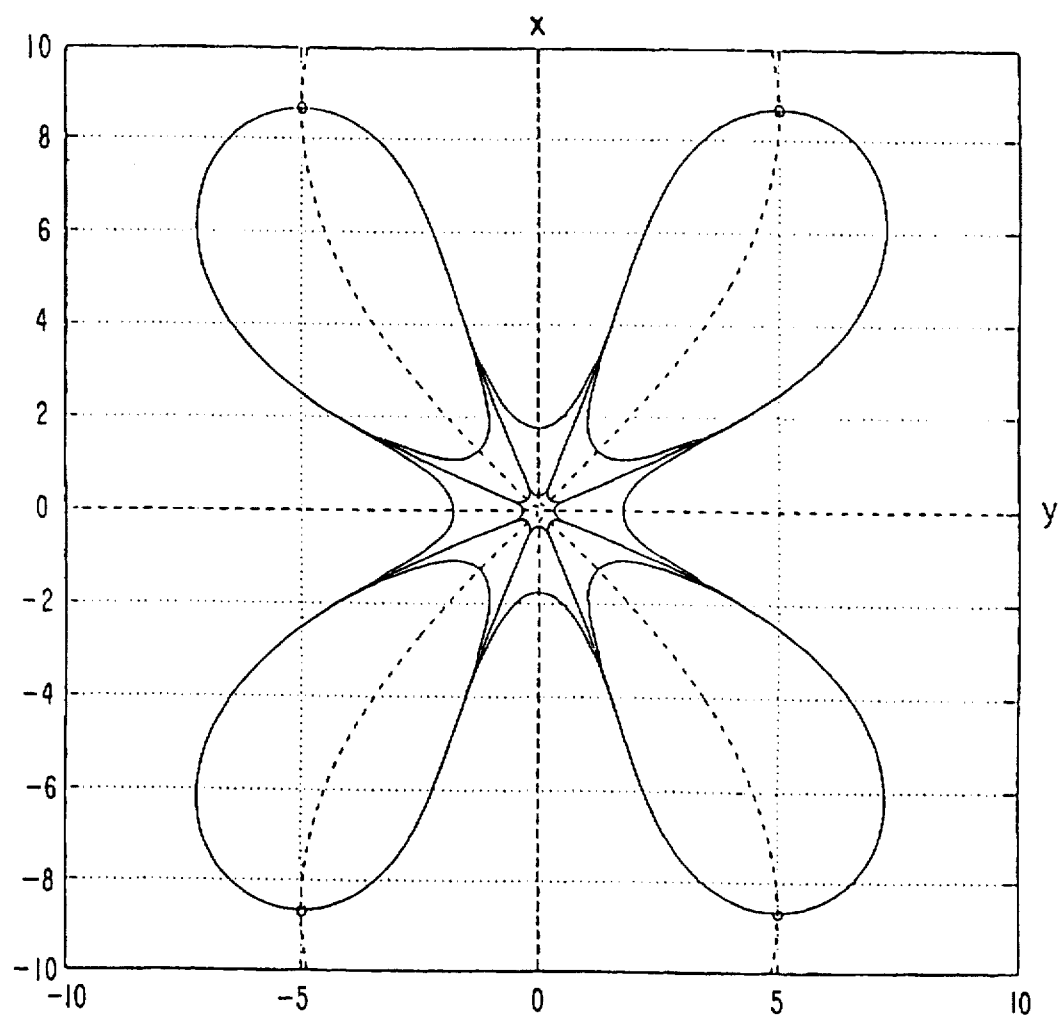
FIG. 11 shows $B_x=0$ contours (dashed) and fractional By error contours (solid lines) for a prior art 4-wire case (small scalloped circle near the origin is for a fractional error of 1 PPM, and larger circle is for 1000 PPM)
Figure 13A:
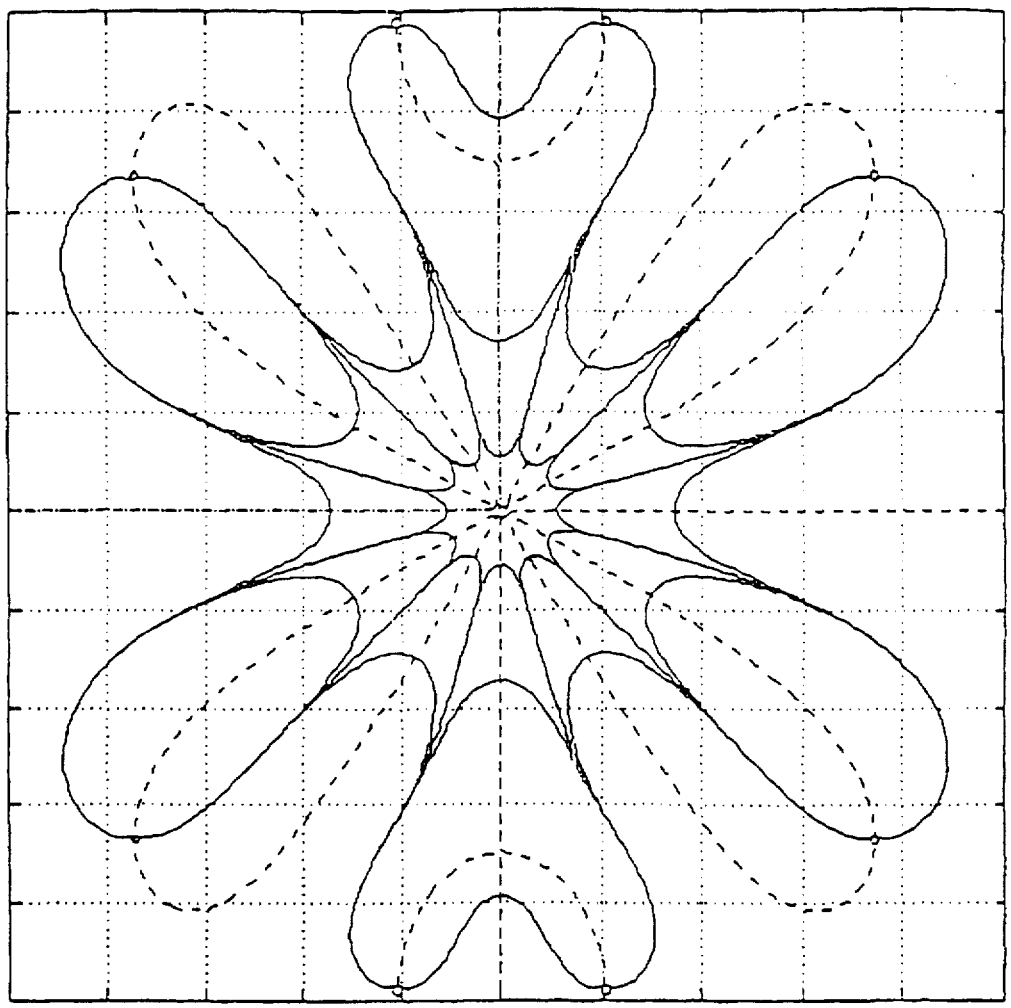
FIG. 13a shows contours of $B_x=0$ (dashed lines), and 1 PPM (inner scalloped circle) and 1000 PPM (scalloped ovoid near the wires) for an 8-wire prior-art constant-radius, uniform current configuration with wire angles of $\emptyset=[12, 48]$ degrees.
Figure 13B:
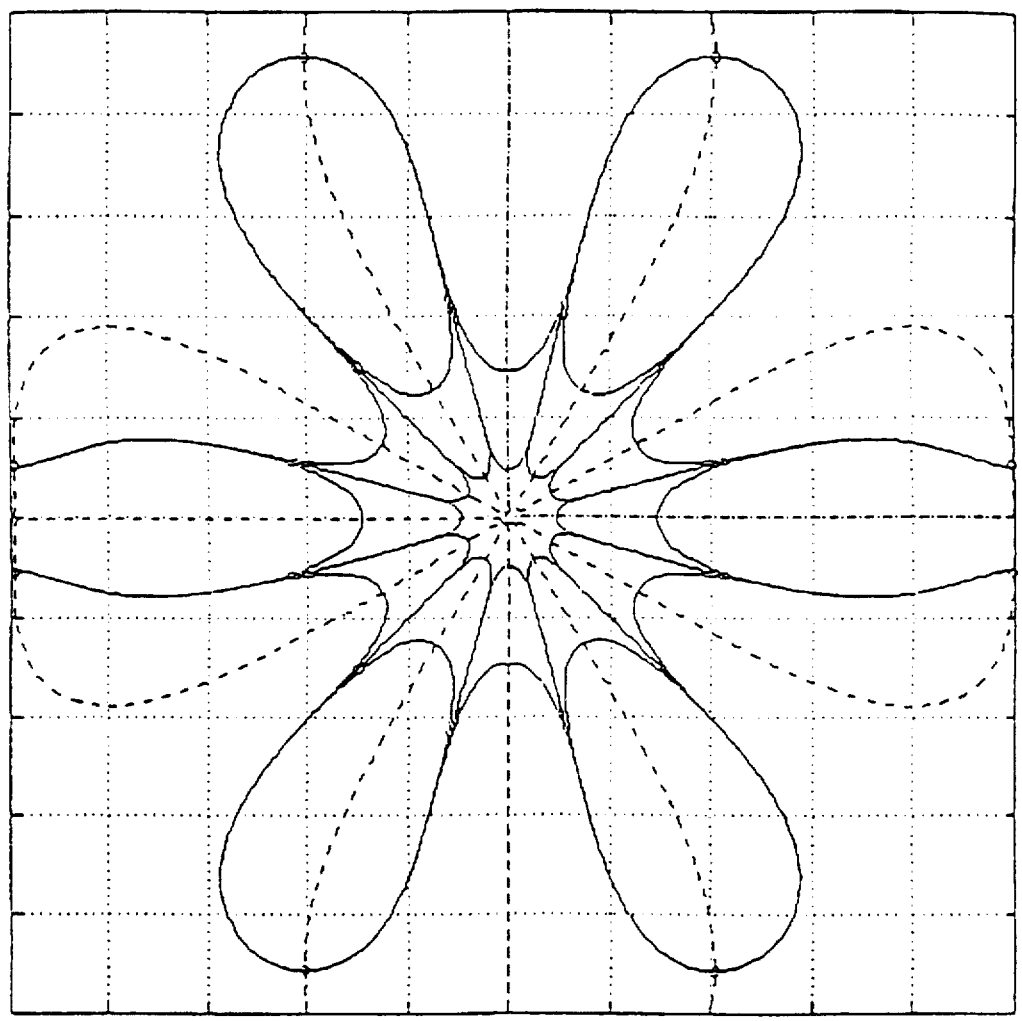
FIG. 13b shows contours of $B_x=0$ (dashed lines), and 1 PPM (inner scalloped circle) and 1000 PPM (scalloped ovoid near the wires) for an 8-wire constant-radius, uniform current embodiment of the invention with wire angles of $\emptyset=[24, 84]$ degrees.

The simplest dipole configuration (except for the trivial two-wire configuration with wires at +/−R on the x-axis) is the four-wire case derived by Deutsch ("Dipole and quadrupole planar magnetic fields produced by line currents," Brit. J. Appl. Phys. 1968, ser. 2, vol. 1, pp. 1031–38), who used a limited expansion method in the vector potential to derive a few basic circular cases. However, the region of field uniformity of 1 PPM or better in the four-wire system is limited to a circular region of less than one-twentieth the radius of the circle on which the wires are placed (see FIG. 11). In the method of the present invention, the four-wire case is the solution of the simplest form of the above equations, i.e., cos (3$\emptyset$)=0, which yields wire location angles of $\emptyset$=30°. Deutsch also identified an 8-wire circular uniform field configuration with $\emptyset$=[12, 48] degrees (in the coordinate system used here; Deutsch used a coordinate system rotated 90°). Solution of the equations of the present invention for 2-wires/quadrant yields two solutions for the most uniform field under these constraints, the one at $\emptyset$=[12, 48], and also $\emptyset$=[24, 84], which Deutsch did not identify using his expansion method. These two configurations have essentially identical uniformity characteristics, as shown in FIGS. 13a and 13b. As discussed further below in the general solution, these solutions illustrate that in general the sub-optimum cases produced by over constraining the system, in this case requiring all radii and all currents to be equal, have more than one configuration that will produce given uniformity characteristics.

Deutsch in all identified three circular uniform field (dipole) configurations: the 4-wire case described above, one of the circular uniform-current 8-wire cases cited above, and a 6-wire configuration in which the wire currents are not all identical (discussed below). He also derived two circular uniform-current quadrupole cases, one with 8 wires and one with 16 wires. The general solution of the present invention demonstrates that, except for the necessity of maintaining the appropriate reflection symmetry, highly uniform fields can be produced using an infinite number of geometric shapes, and an infinite number of systems with currents that need not be equal in each wire, and that a circular configuration need not be used, which has not previously been understood. The general solution of the present invention provides a uniform method to locate the wires and determine the wire currents for these cases, as illustrated below by a number of examples.

As an example of the extension of the circular uniform-current solutions, if there are three wires per quadrant (12 wires total), there will be three equations and three unknowns (the first-quadrant wire angular locations) as follows:

$$\cos(7\emptyset_3)+\cos(7\emptyset_2)+\cos(7\emptyset_1)=0$$

$$\cos(5\emptyset_3)+\cos(5\emptyset_2)+\cos(5\emptyset_1)=0$$

$$\cos(3\emptyset_3)+\cos(3\emptyset_2)+\cos(3\emptyset_1)=0,$$

for which two of the solutions are $\emptyset n=[11.670369701, 26.936552891, 56.056239595]$
and $\emptyset n=[11.991978538, 41.927883486, 85.674770706]$.
Wire locations in quadrants 2, 3, and 4 are obtained by reflection across the x and y axes, with negative current in wires at negative x coordinates.

Figure 8:
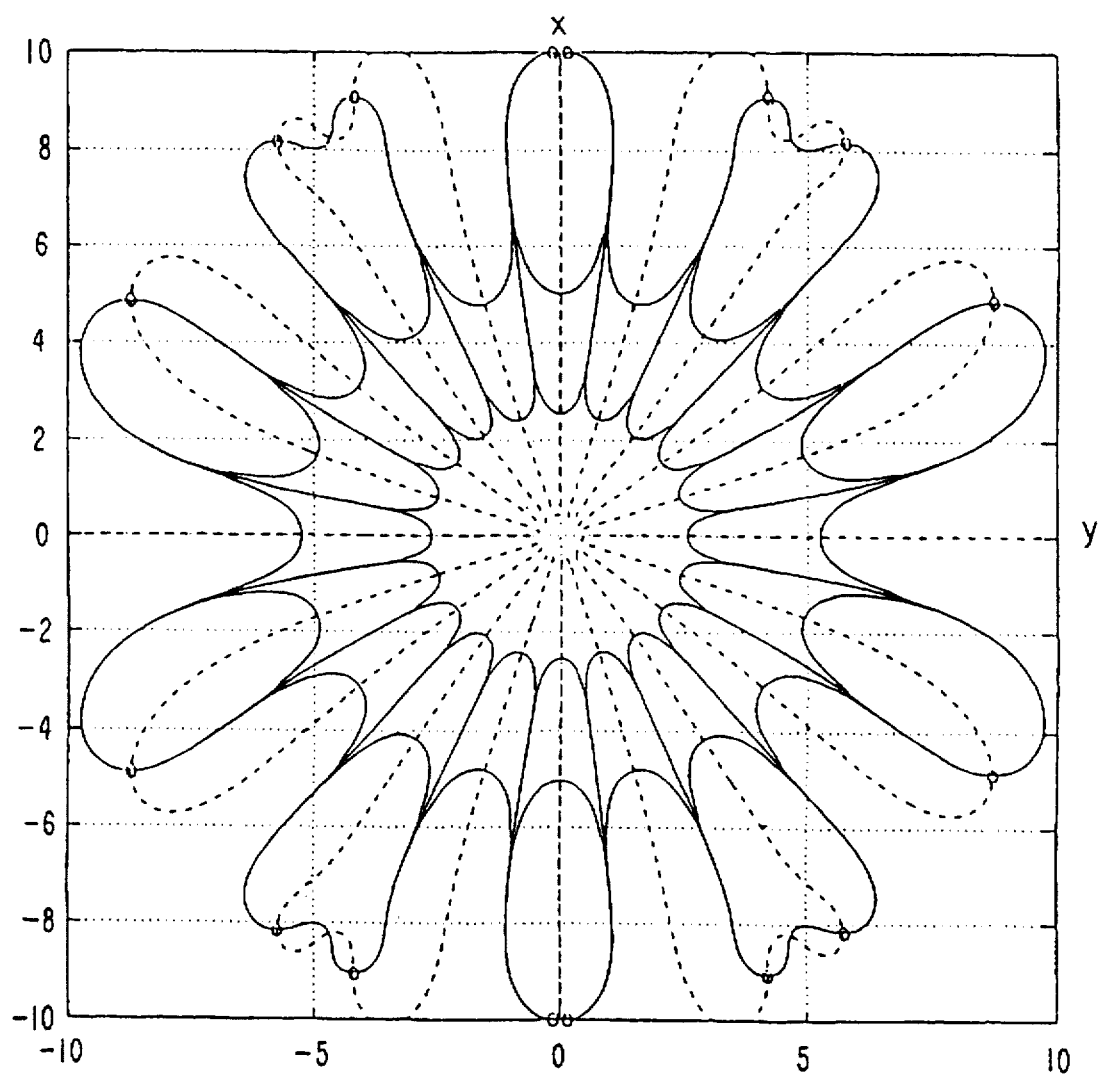
FIG. 8 shows contours of constant error in $B_y$ referred to the value on axis (solid curves), combined with a plot of contours of $B_x=0$ (dashed curves) for an optimum 16-wire configuration of the present invention (inner scalloped circle is that of $B_y$ error of 1 part per million (PPM), and larger scalloped circle is for a $B_y$ error of 1000 PPM)
Figure 9:
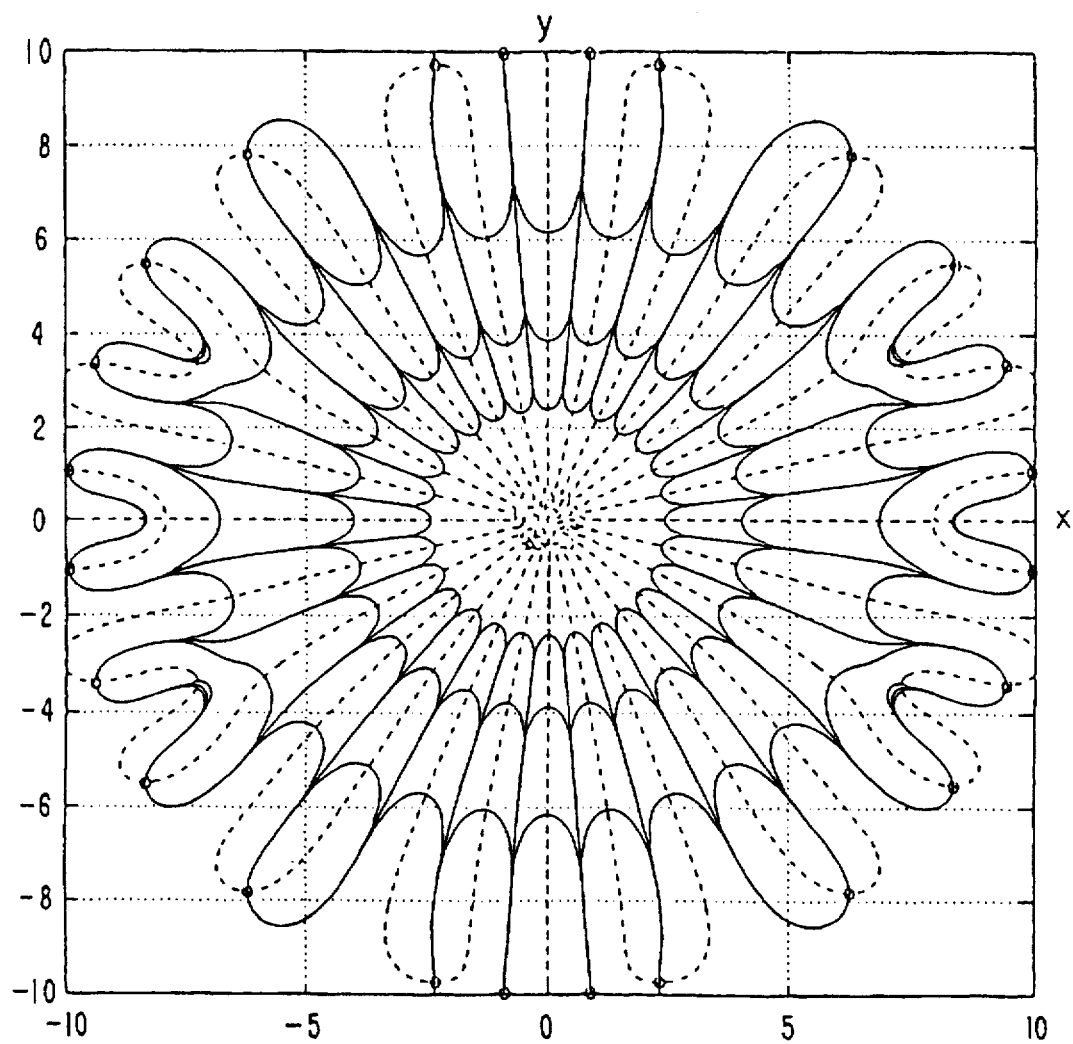
FIG. 9 shows contours of constant $B_y$ error for an optimum 24-wire configuration of the present invention (inner scalloped circle is for a $B_y$ error of 0.001 PPM, intermediate scalloped circle is of 1 PPM, and outer is of 1000 PPM; dashed curves are $B_x=0$ contours)

FIG. 8 shows contours of $B_x=0$ (dashed) and $B_y$ fractional error (solid lines) of 1 (inner scalloped circle) and 1000 (outer scalloped circle) parts per million (PPM) for a circular 16-wire case. The apparent failure of the $B_x=0$ lines to cross the origin is an artifact of the plotting. FIG. 9 shows contours of constant $B_y$ error of 0.001 (inner scalloped circle), 1 (intermediate scalloped circle), and 1000 (outer scalloped circle) PPM for a circular 24-wire configuration which shows a rapid improvement with increased numbers of wires. Note that the radius of 0.001 PPM error in the 24-wire case is almost as large as the radius of 1 PPM error for the 16-wire configuration.

Figure 10:
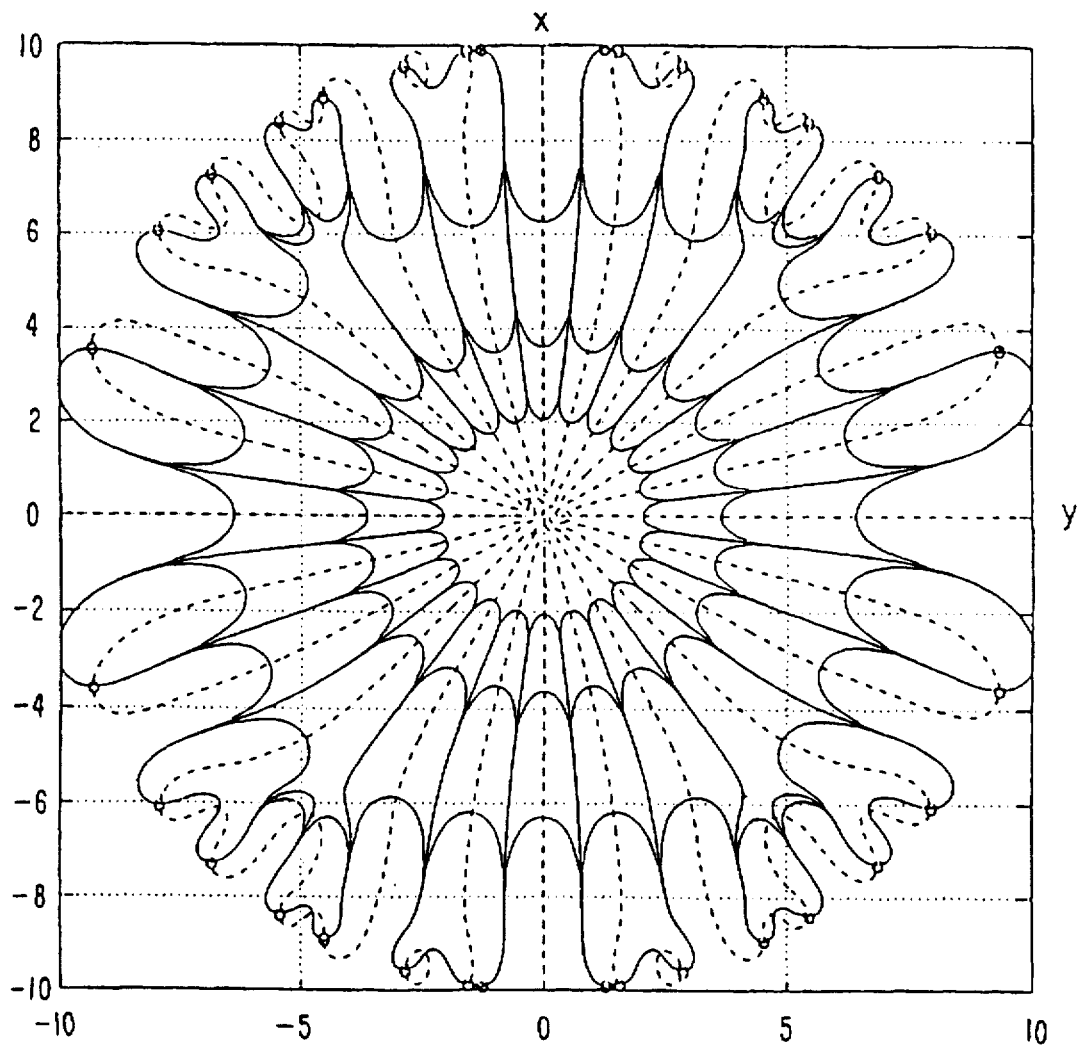
FIG. 10 shows contours of constant $B_y$ error and $B_x=0$ contours for a sub-optimum 32-wire configuration with 5-wire symmetry (note five $B_x=0$ contour origin crossings per quadrant (excluding x and y axes)

With a given number of wires, there are configurations that produce a smaller number of $B_x=0$ origin crossings than the number of wires in the set, as illustrated by the 32-wire, 5-crossing case shown in FIG. 10 with contours of $B_y$ error of 0.001, 1, and 1000 PPM. These prove to be well-behaved in $B_y$, and have areas of given uniformity similar to those produced by configurations using smaller numbers of wires that produce the same number (5) of $B_x=0$ crossings. Note that the outer (1000 PPM) contour is not nearly so circular as the inner circles, nor as circular as the 1000 PPM contour for the 24-wire case. This is usual when the wire locations produce a field that is less than optimum for the number of wires used.

Note that the number of equations is the same in each case as the number of unknowns, so it is probable that there will be at least one solution for the optimum field for that number of wires. In most cases, there will be more than one set of wire locations that satisfy the complete set of equations for that number of wires (as in the three-wire case above, and others listed below), with field accuracy characteristics that are nearly identical.

This method also produces the locations of wires sets in which there are wires on the x-axis (for the desired field in the y direction). If the wire circle has radius R, the wire will be at coordinates (R, 0). $B_y$ symmetry, there will also be a wire at (-R, 0). The wire locations for optimum fields are derived by equations similar to those above, but with the addition of a constant 0.5 in each case. For example, in the case of three wires per quadrant plus the wires on the x-axis, the equations become $$\cos(7\emptyset_3)+\cos(7\emptyset_2)+\cos(7\emptyset_1)+0.5=0$$

$$\cos(5\emptyset_3)+\cos(5\emptyset_2)+\cos(5\emptyset_1)+0.5=0$$

$$\cos(3\emptyset_3)+\cos(3\emptyset_2)+\cos(3\emptyset_1)+0.5=0,$$

with one solution being wires at $\emptyset_n=[0, 17.040932432, 32.516510874, 58.349938749]$,
which produces three $B_x=0$ origin crossings. This system has 14 wires total. Wire locations in other quadrants are again obtained by reflection across the x and y axes, but without duplicating the wires on the x-axis in reflection across the x-axis.

The simplest configuration for the case of wires on the x-axis has 6 wires total, and satisfies only the equation $\cos(3\emptyset_1)+0.5=0$, which has a solution of wires at 0 degrees and 40 degrees.

The optimum field uniformity of a given number of wires can be achieved in a large (actually infinite) number of ways by using a larger number of wires. Choosing wire angles for an n-wire/quadrant circular uniform-current system such that the n-1 lowest order equations are satisfied and not the nth equation produces a field with n-1 origin crossings with the field uniformity of n-1 wires. For example, choice of wires at 6, 30 and 54 degrees in the 3-wire/quadrant (12 wire total) system produces:

$$\cos(7\emptyset_3)+\cos(7\emptyset_2)+\cos(7\emptyset_1)=0.8281759 \text{(non-0, value immaterial)}$$

$$\cos(5\emptyset 3)+\cos(5\emptyset 2)+\cos(5\emptyset_1)=0$$

$$\cos(3\emptyset_3)+\cos(3\emptyset_2)+\cos(3\emptyset_1)=0,$$

which produces a field with two $B_x=0$ origin crossings per quadrant. Since there are two equations to solve with three variables, the number of solutions is infinite. Similarly, the 32-wire (8/quadrant) system mentioned above satisfies the lowest five equations (through $\cos(11\emptyset_n)$, but not the sixth, and so produces fields with five $B_x=0$ crossings. This is true in general: if the first n equations are satisfied, there will be n $B_x=0$ origin crossings per quadrant, and the uniformity will be very similar for all systems with n origin crossings, independently of the number of wires used.

Restriction of the wires in the solution set to the first quadrant (less than 90 degrees) is not absolutely necessary, and many solutions can be found with one or more of the specified wire angles in the second (or other) quadrant. For example, one set of solutions to the 4-wire/quadrant (16-wire) case is $\emptyset_n=[11.142857143, 36.857142857, 71.142857143, 96.857142857]$, with one wire in the second quadrant. This wire has the opposite current as the other three wires in the same quadrant, as do the wires located by reflection across the x and y axes. The system has the same field uniformity as other 16-wire solutions with 4 $B_x=0$ origin crossings per quadrant, but is less efficient in production of field per ampere of wire current. Some of these less-efficient configurations may be chosen for other advantages, such as better stress distribution on the conductors or support structure or better interior access.

Not only does the present invention provide solutions for cylindrical uniform-current systems, but also a general solution of the dipole cases with current and wire location (both radius and angle) as free parameters. This solution method is extended to quadrupole and higher multipoles as well, below. Equations for ferromagnetic and conducting shield cases have also been derived. Solutions to these equations for optimum geometries produce field homogeneities significantly better than the cases discussed above.

The equations discussed above cover only cases with all wire currents equal in magnitude, and all wires on a given circle. The preferred sets of equations for uniform fields exclude this limitation and are derived from basic field equations:

$$I_n \cos[(2j+1)\emptyset_n]/R_n^{2j+1} + I_{n-1}\cos[(2j+1)\emptyset_{n-1}]/R_{n-1}^{2j+1} + \ldots + I_1 \cos[(2j+1)\emptyset_1]/R_1^{2j+1} + w = 0$$
$$I_n \cos[(2j-1)\emptyset_n]/R_n^{2j-1} + I_{n-1}\cos[(2j-1)\emptyset_{n-1}]/R_{n-1}^{2j-1} + \ldots + I_1 \cos[(2j-1)\emptyset_1]/R_1^{2j-1} + w = 0$$
$$I_n \cos[(2j-3)\emptyset_n]/R_n^{2j-3} + I_{n-1}\cos[(2j-3)\emptyset_{n-1}]/R_{n-1}^{2j-3} + \ldots + I_1 \cos[(2j-3)\emptyset_1]/R_1^{2j-3} + w = 0$$
.
.
.
$$I_n \cos(5\emptyset_n)/R_n^5 + I_{n-1}\cos(5\emptyset_{n-1})/R_{n-1}^5 + \ldots + I_1\cos(5\emptyset_1)/R_1^5 + w = 0$$
$$I_n \cos(3\emptyset_n)/R_n^3 + I_{n-1}\cos(3\emptyset_{n-1})/R_{n-1}^3 + \ldots + I_1\cos(3\emptyset_1)/R_1^3 + w = 0,$$

where j is the number of free variables in the system (those not initially specified), n is the number of wires per quadrant, the $\emptyset_n$ are the angular locations of the wires measured from the x-axis (if the desired field is chosen to be in the y-direction), $R_n$ are their radii from the origin, $I_n$ is the current in the $n^{th}$ wire, and w is a normalized parameter that equals 0.5 if there is a wire on the x-axis, and 0.0 otherwise. The system scales linearly in all dimensions and currents without affecting the uniformity characteristics, so the system can be normalized to the values of one current and one radius, which is the source of the constant w=0.5 for wires on the x-axis. The constant 0.5 is derived from $I_0 \cos(0)/R=1$ when $R_0$ and $I_0$ are normalized to 1, but multiplied by 0.5 to avoid doubling the wire current in the reflection across the x-axis. Wire locations and currents in quadrants other than the first are determined by appropriate reflections across the x and y axes, as previously described.

The above equations are solved numerically by standard methods to determine the values of wire locations or currents, as desired. Each of the above equations represents a coefficient of a harmonic error term in the dipole field, so that the field homogeneity improves with each additional equation satisfied (beginning with the lowest order and working upward). The number of equations to be solved should equal the number of free parameters for the solutions to be calculated. While it appears that there can be as many as three free parameters for each wire (radius from the origin, angle, and current), it is believed that optimum solutions do not exist for cases with more than two free parameters per wire. Examination of the patterns of the plots of $B_x=0$ contours suggest that two free parameters per wire produce the optimum fields, and that there are no solutions for more.

For example, all currents may be constrained to be certain values, say all equal in magnitude. (If all radii are also constrained to be equal, we return to the circular configurations described above.) Then for n wires with none on axis, there will be n angles, and n-1 radii (one normalized away), so it is necessary to solve j=2n-1 simultaneous equations to determine all the independent parameters for the best solution. For n wires plus one on the x-axis, radii are normalized to that of the on-axis wire, and there are j=2n equations to be solved for optimum field homogeneity. Similarly, the radii can be constrained in some way, on a circle, rectangle, or other shape, and the angles and currents determined for the optimum uniformity. It is also possible to reduce the number of free parameters for a given number of wires by specifying individual wire locations or currents, and solving the reduced number of equations for the remaining variables.

There is, of course, no guarantee that a unique solution exists for a given configuration in which some of the parameters are specified. There may be no solution, a single solution, or several solutions. Examples of several solutions for a given number of free parameters less than j=2n or j=2n-1 (as appropriate) are found in the wire sets that are constrained to lie on a circle and have identical current magnitudes.

As an example of the above variations, a 16-wire system (4 wires per quadrant) has the following equations to be solved, specifying some parameters to reduce the number of free parameters and the number of equations to j=2(4)−1=7:

$$I_4(\cos 15\emptyset_4)/R_4^{15} + I_3(\cos 15\emptyset_3)/R_3^{15} + I_2(\cos 15\emptyset_2)/R_2^{15} + I_1(\cos 15\emptyset_1)=0$$

$$I_4(\cos 13\emptyset_4)/R_4^{13} + I_3(\cos 13\emptyset_3)/R_3^{13} + I_2(\cos 13\emptyset_2)/R_2^{13} + I_1(\cos 13\emptyset_1)=0$$

$$I_4(\cos 11\emptyset_4)/R_4^{11} + I_3(\cos 11\emptyset_3)/R_3^{11} + I_2(\cos 11\emptyset_2)/R_2^{11} + I_1(\cos 11\emptyset_1)=0$$

$$I_4(\cos 9\emptyset_4)/R_4^9 + I_3(\cos 9\emptyset_3)/R_3^9 + I_2(\cos 9\emptyset_2)/R_2^9 + I_1(\cos 9\emptyset_1)=0$$

$$I_4(\cos 7\emptyset_4)/R_4^7 + I_3(\cos 7\emptyset_3)/R_3^7 + I_2(\cos 7\emptyset_2)/R_2^7 + I_1(\cos 7\emptyset_1)=0$$

$$I_4(\cos 5\emptyset_4)/R_4^5 + I_3(\cos 5\emptyset_3)/R_3^5 + I_2(\cos 5\emptyset_2)/R_2^5 + I_1(\cos 5\emptyset_1)=0$$

$$I_4(\cos 3\emptyset_4)/R_4^3 + I_3(\cos 3\emptyset_3)/R_3^3 + I_2(\cos 3\emptyset_2)/R_2^3 + I_1(\cos 3\emptyset_1)=0.$$

There is no $R_1$, since it is normalized to 1.

Figure 24:
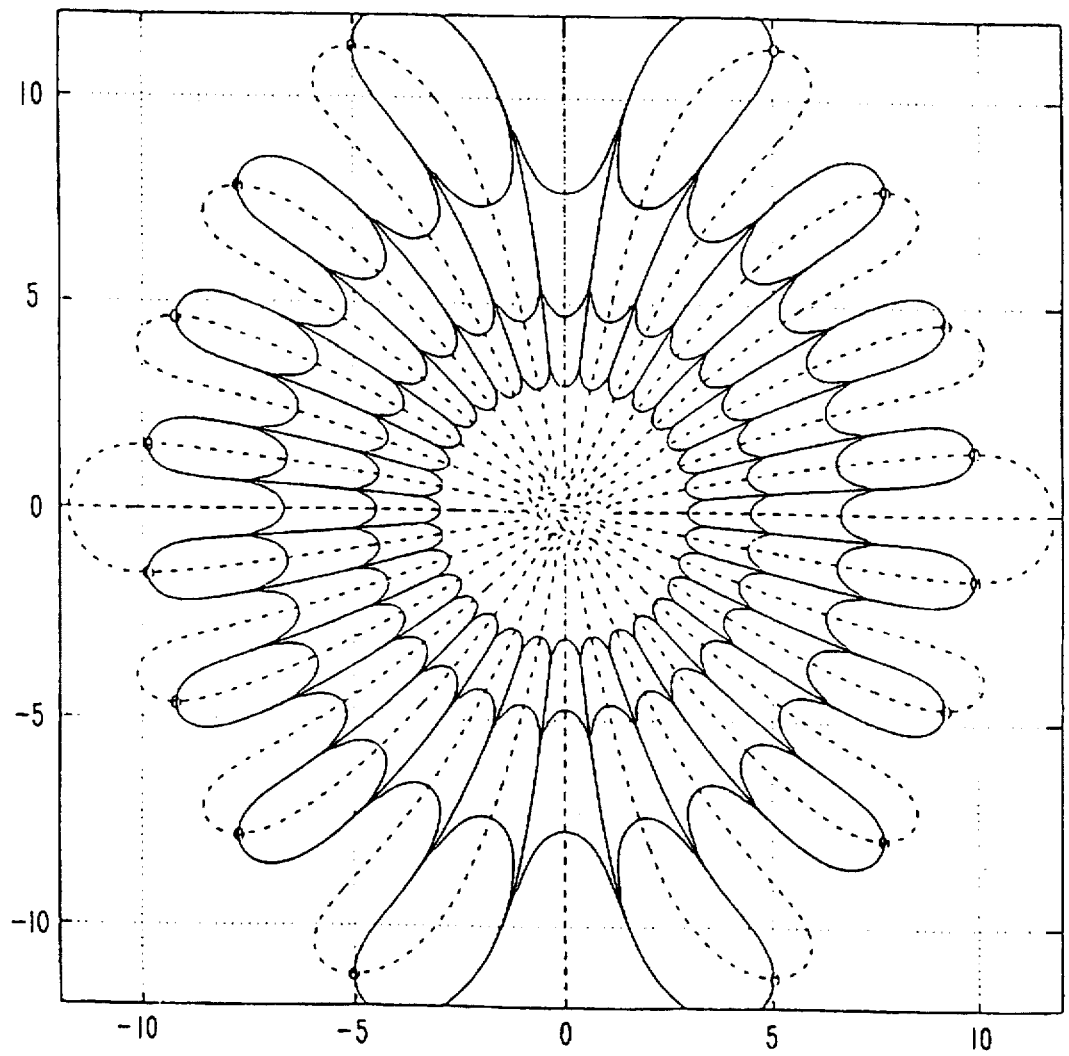
FIG. 24 shows, for the general solution method for a 16-wire case, the optimal result of selection of identical current magnitudes in FIG. all wires, leaving radii and angles free.

FIG. 24 shows the result of the choice of identical current magnitudes in all wires in the above equations, with the radii and angles being determined by the solution. In this figure, the dashed lines are contours of $B_x=0$ the inner scalloped circle (r~0.3) is a contour of 0.001 PPM error in the magnitude of B, and the next outer scalloped circle (r~0.45) is a contour of 1 PPM error, and the outer (r~0.7) is 1000 PPM error. Satisfying the first seven equations produces a field in which there are seven origin intersections of the $B_x=0$ contours per quadrant (arbitrarily not counting the x and y axes), indicating the frequency of the variation of $B_x$ in rotating in azimuth at a given radius. It is characteristic of all solutions that if the lowest m equations are solved, and not the m=1 equation, that there are m $B_x=0$ origin intersections per quadrant. Also, for the optimum solutions, the total number of $B_x=0$ origin intersections including the x and y axes is twice the total number of wires in the set. The number of $B_x=0$ origin crossings is an indication of the homogeneity of the field, as can be seen by comparing the following examples. Higher order equations than m+1 may also be coincidentally satisfied, with some slight effect on the field homogeneity, but the field characteristics are determined primarily by the lowest order equation not satisfied.

Figure 25:
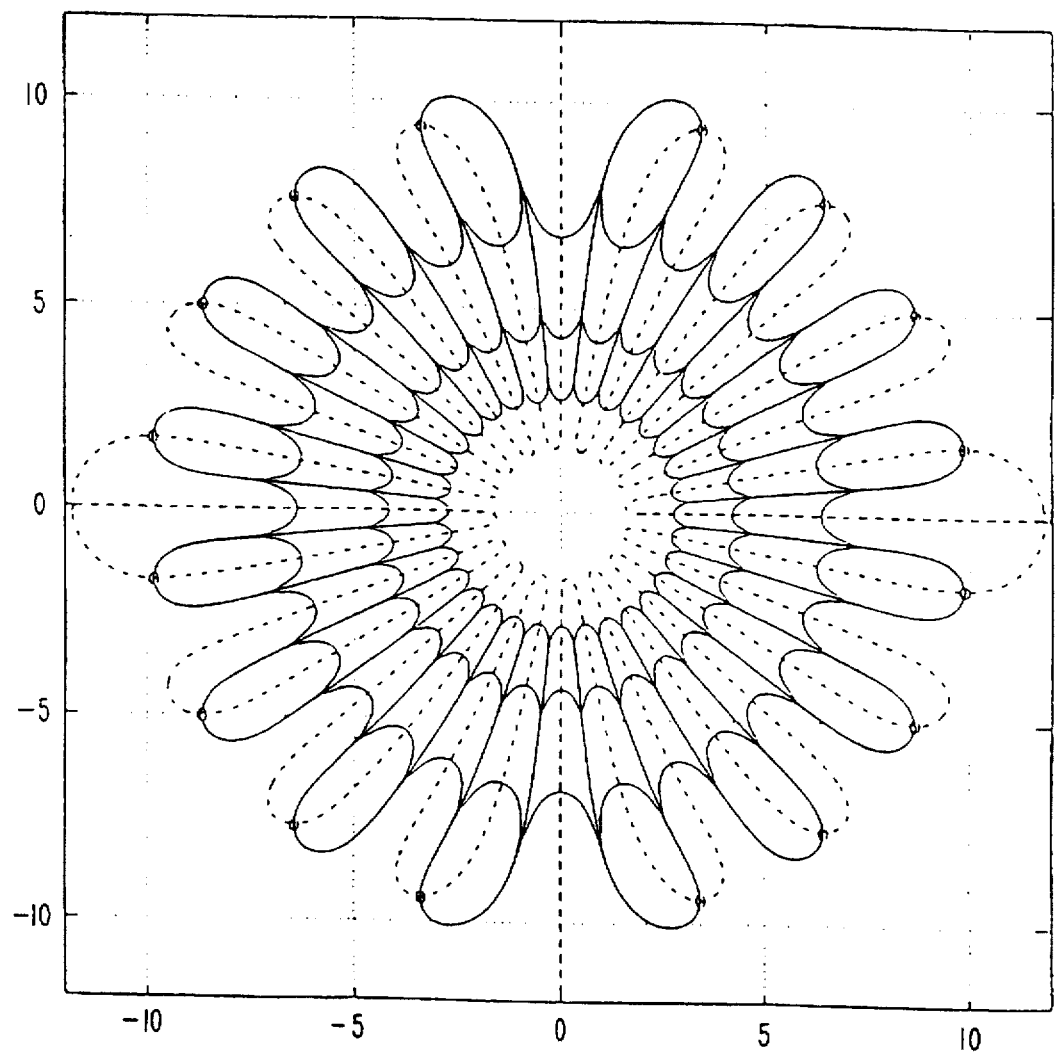
FIG. 25 shows, for the general solution method for a 16-wire case, the optimal result of selection of identical radii for all wires, leaving angles and line current free.

FIG. 25 shows the results of solving the above equations with the wires at a constant radius, and determining the angles and currents for each wire. There are seven free parameters, and the field plot again shows seven $B_x=0$ FIG. O origin crossings per quadrant. Examination of solutions of this form of the equations shows that the angles are uniformly spaced at 10, 30, 50, and 70 degrees, and the wire currents are proportional to the cosines of these angles.

Figure 26:
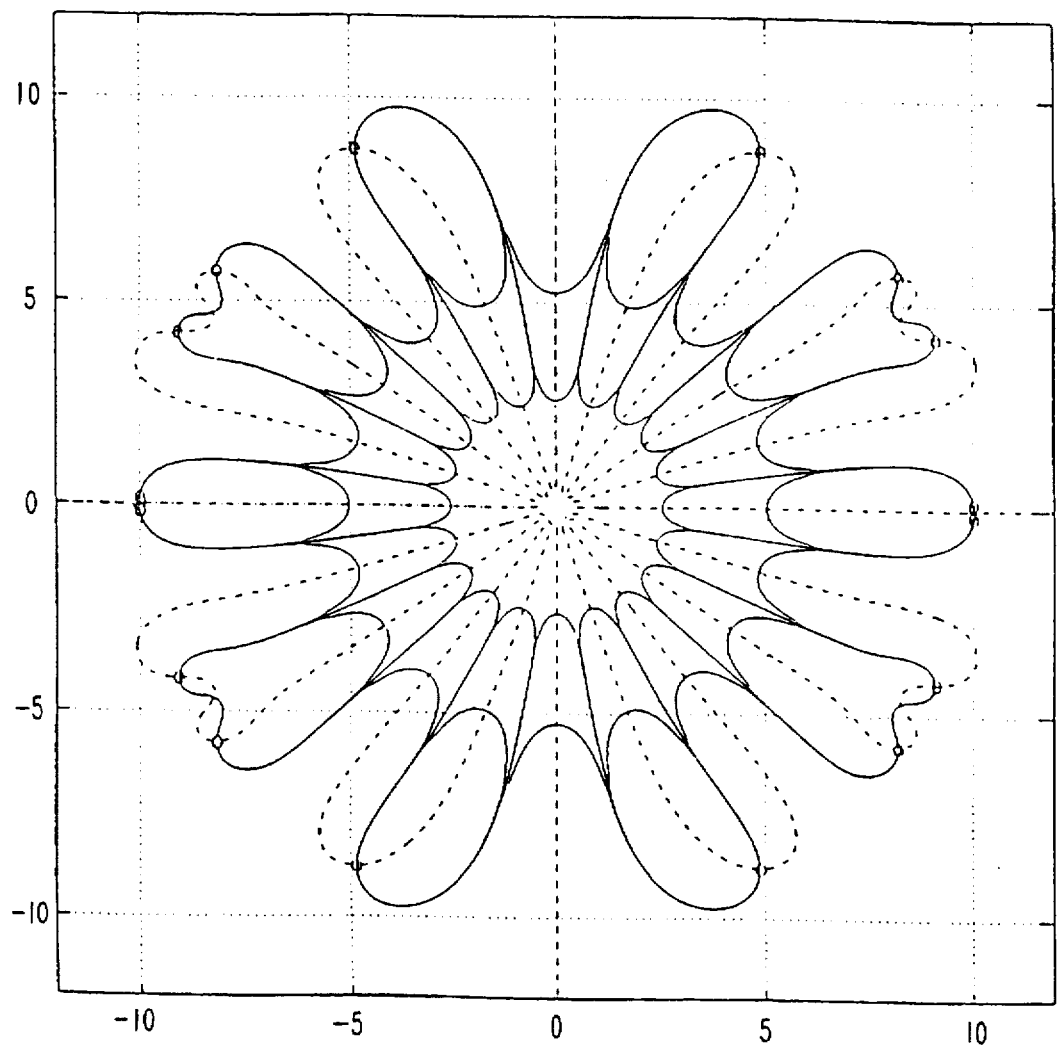
FIG. 26 shows, for the general solution method for a 16-wire case, an optimal result for all current magnitudes and radii identical, leaving angle free.

FIG. 26 shows one solution of the four-equation set that results from setting all current magnitudes to be identical, and all wires on a circle. It is interesting that the wire positions for this solution do not approximate the cos (∅) spacing that one might expect. Since there are four equations solved, there are four $B_x=0$ origin crossings per quadrant, and the areas of 1 PPM and 1000 PPM accuracies (the only ones shown in this plot) are correspondingly reduced. There are a large number of solutions for this 16-wire, 4-equation set. The 16-wire configuration shown in FIG. 8 is another solution to this set of equations.

Figure 27:
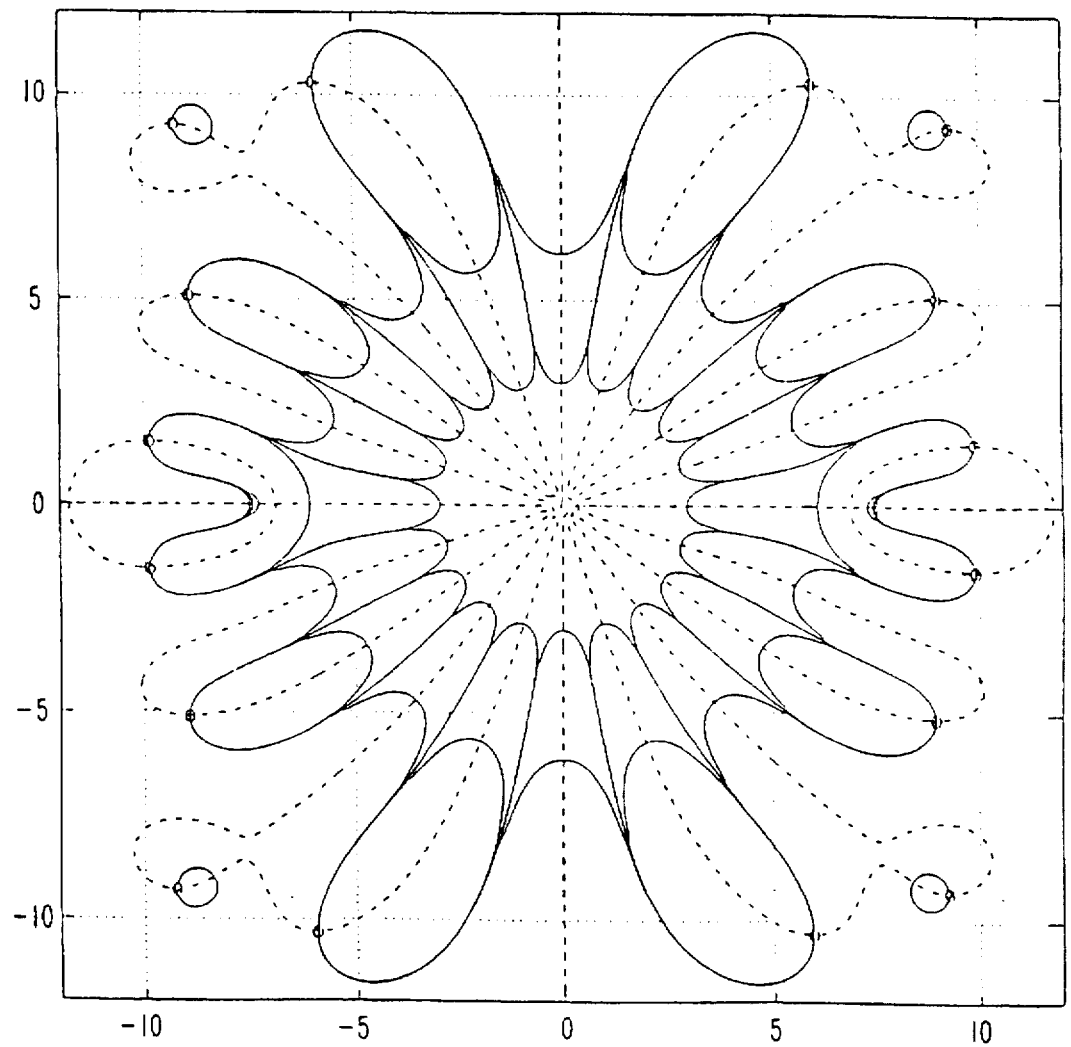
FIG. 27 shows, for the general solution method for a 16-wire case, an optimal result where angle is set for eight wires and radii for eight wires, with current set for all wires.

FIG. 27 shows that some arbitrariness is possible in specifying wire positions. In this configuration, all wire currents are identical, the angles of two of the wires were set at 45° and 60°, and the radius of the wire located at 60° set at R=1.19, leaving four free parameters, i.e., two radii and two angles. The solution produced radii of (1, 1.03, 1.32, 1.19), and corresponding angles of (8.86, 29.7, 45, 60) degrees, with four $B_x=0$ origin crossings per quadrant. Angles and radii are calculated in double precision, and are given here as rough approximations for convenience. Comparison of FIGS. 26 and 27 show similar areas of given field uniformity, with the difference being attributable partly to the larger average wire cylinder radius in FIG. 27.

Figure 28:
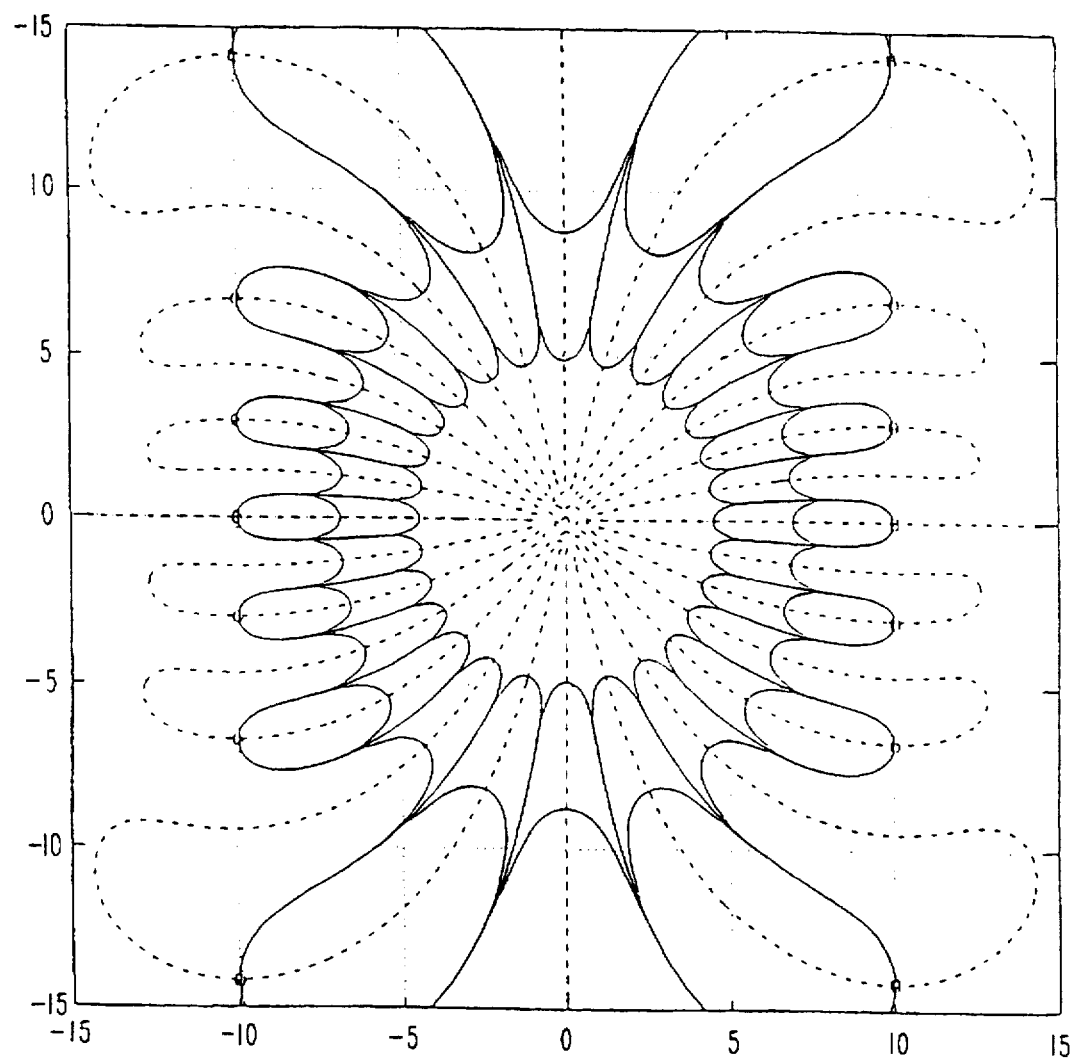
FIG. 28 shows, for the general solution method for a 16-wire case, an optimal result where wires are constrained to fall on two parallel lines.

Many different constraints on radii are possible. FIG. 28 shows a 14-wire set with wires constrained to lie on parallel lines. To have a dipole field, the reflection symmetries across the x and y axes must be maintained, but the wire angles and currents are free parameters, so the first six dipole equations (wire-on-axis forms) can be solved. There are 28 $B_x=0$ origin intersections for this 14-wire system, so this is an optimum configuration.

Many configurations have been found for many numbers of wires per set. All have the characteristics described above. Optimum, sub-optimum, and near-optimum configurations exist, with "optimum" now being applied to those configurations that for n wires per quadrant (n not including an on-axis wire, if any) satisfy the first j=2n (wire-on-axis), or j=2n-1 (no wires on axis) equations in the above sets, and therefore have the maximum number of $B_x=0$ origin intersections within the accuracy of the calculation method used. Sub-optimum configurations are those in which some additional parameters have specified values, and a smaller number of equations are satisfied (beginning always with the lowest order, cos (3∅), and increasing in order). The circular sets with identical currents in all wires now are seen to be sub-optimum. Near-optimum configurations are those optimum or sub-optimum configurations in which there are small wire placement errors, resulting in $B_x=0$ contours that nearly reach the origin, but do not, closing in loops at some radius. As described above, the radius of the $B_x=0$ loop closures can be used to predict the best homogeneity of the field.

Figure 29:
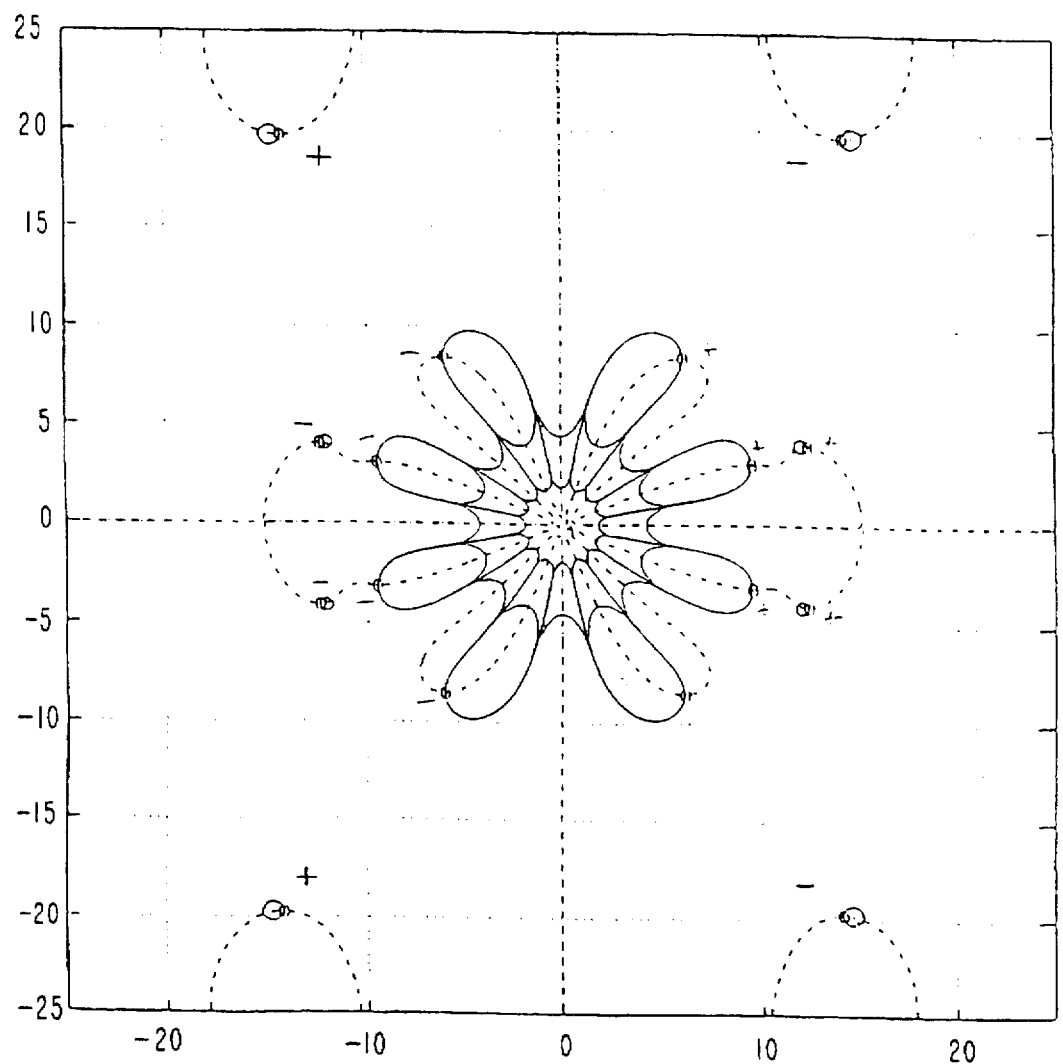
FIG. 29 shows, for the general solution method for a 16-wire case, an optimal result where for one wire in each quadrant current is constrained to flow in the opposite direction of that of the other three wires.

The basic equations can also be solved for configurations in which one or more of the wires in a given quadrant have currents that flow in the opposite direction from others in that quadrant. An example is shown in FIG. 29. Currents were constrained to be in the directions shown, wires constrained to be at only two angles, currents in the two wires at larger radii fixed at a given ratio to the two inner wire currents, and angles and radii determined by solution to the above equations. The configuration has no immediately apparent practical value, except to illustrate the versatility of the preferred solution method of the present invention.

Transverse magnetic fields are used to turn and guide charged particle beams in high energy particle accelerators and in other applications. The system of conductors described above is linear, that is no allowance is made for curving the system to follow a turning beam. If the system is curved to follow the beam, field homogeneity is affected unless wire currents or positions are adjusted for compensation. The field in a circularly curved system (appropriate to a beam turning in a constant field) can be calculated, and compensation made to restore field uniformity by observing the behavior of the $B_x=0$ contour lines, iteratively reducing the turning radius to the desired value while adjusting wire positions or current to return the $B_x=0$ contours to near their optimum origin crossing.

Figure 12:
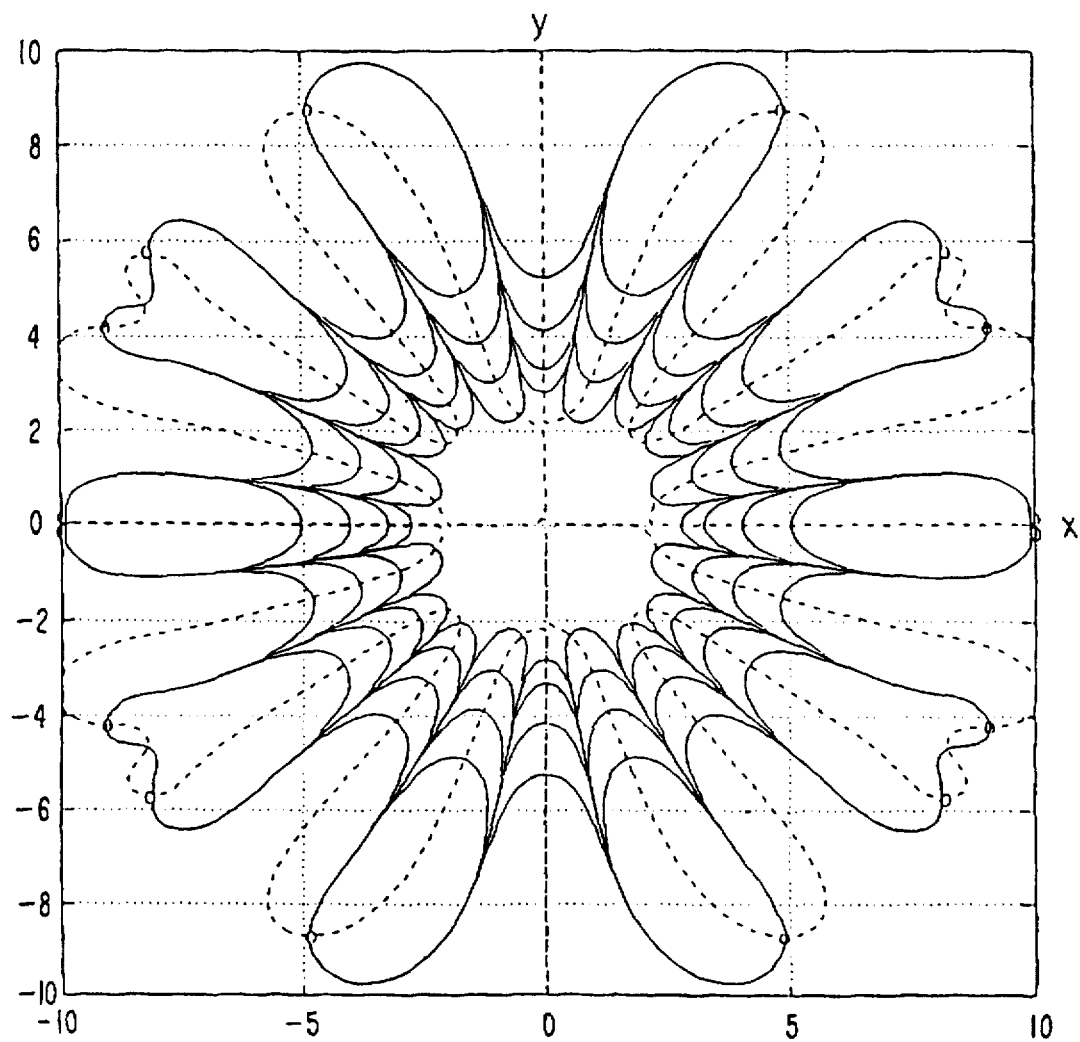
FIG. 12 shows a near-optimum 16-wire configuration derived from the case of FIG. 8 by a 30 PPM angular shift of one wire in each quadrant, and the closure of $B_x=0$ contours into loops near the origin, and minimal perturbation of the field at the 1 PPM $B_y$ fractional error level.

For the $B_x=0$ contours exactly to cross the origin, the wires must be perfectly located. If the wires are slightly off-position, the $B_x=0$ contours do not cross the origin, but close in loops near the origin. The field at radii greater than this $B_x=0$ contour loop closing has characteristics that correspond to the perfectly-located configuration. Fields at radii smaller than the approximate circle through the smallest radius extent of the $B_x=0$ contours are not well-behaved, that is, the field uniformity no longer improves monotonically as the radius decreases. However, the fields inside this radius have uniformity characteristics that are no worse than the uniformity at that transition radius. For example, FIG. 12 shows the 16-wire case of FIG. 8 with a perturbation of 30 PPM of the location of one of the wires in each quadrant. The $B_x=0$ contours (dashed) form a closed contour with loops near the origin. The solid lines are contours of constant By fractional error at 1, 10, 100 and 1000 PPM. The contour of 1 PPM is approximately at the radius of closure of the $B_x=0$ contour loops, and is slightly perturbed. There are no contours of $B_y$ error greater than 1 PPM at radii smaller than the 1 PPM contour, showing that the field in that region has accuracy of at least 1 PPM. This allows manufacturing tolerances to be adjusted for the specific application without danger of having regions of uncontrolled field, and shows the utility of the $B_x=0$ contour plots in the design of these systems.

In all the configurations of the present invention, the uniformity characteristics of a given wire set are independent of the scale of the system. If all wire location x and y dimensions are doubled, the field plot appears exactly the same, but inflated in both x and y dimensions by a factor of two, and the field magnitude everywhere is decreased by a factor of two if the wire current has not changed. This characteristic allows the use of superposition of many wire sets that are identical except for radius. That is, to achieve a larger conductor size for larger currents, it is not necessary to use larger radius wires, but to simply parallel many wire sets. This concept can be extended to blending the wires into plates or current sheets that extend radially outward at the proper wire angle, to reduce resistance.

Figure 4A:
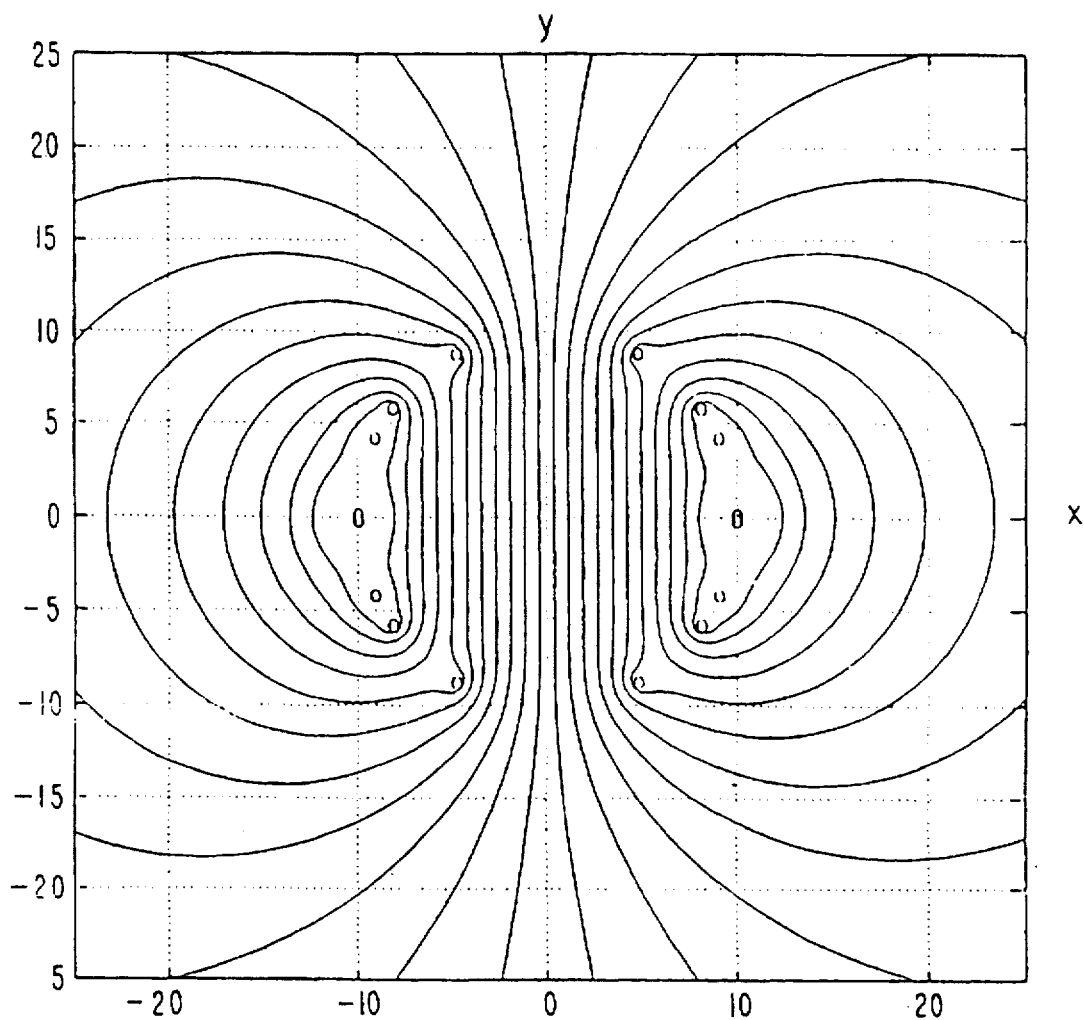
FIG. 4a shows field lines for a 16-wire configuration of the present invention without field cancellation.
Figure 4B:
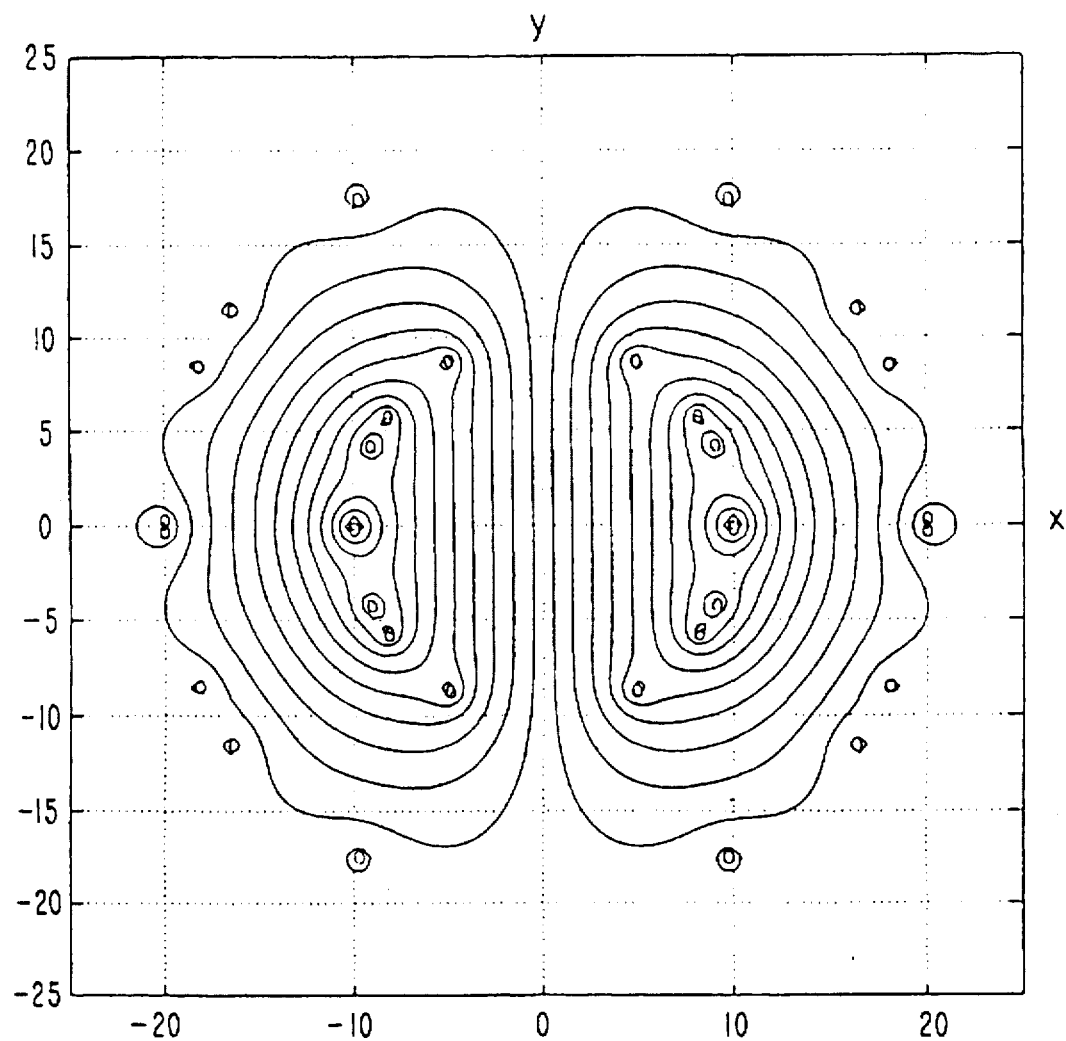
FIG. 4b shows field lines for a 16-wire configuration of the present invention with field cancelation.
Figure 5:
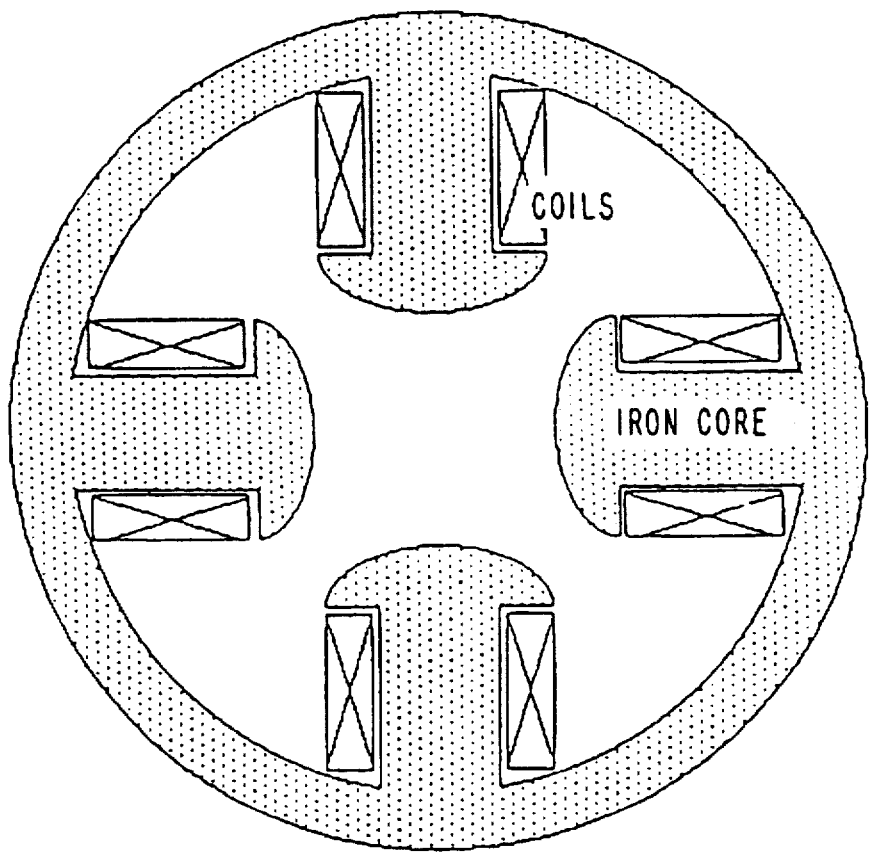
FIG. 5 shows a prior art quadrupole iron core magnet typically used for charged particle beam focusing, with interior faces of the cores precision ground to hyperbolic shape to optimize the field.
Figure 6:
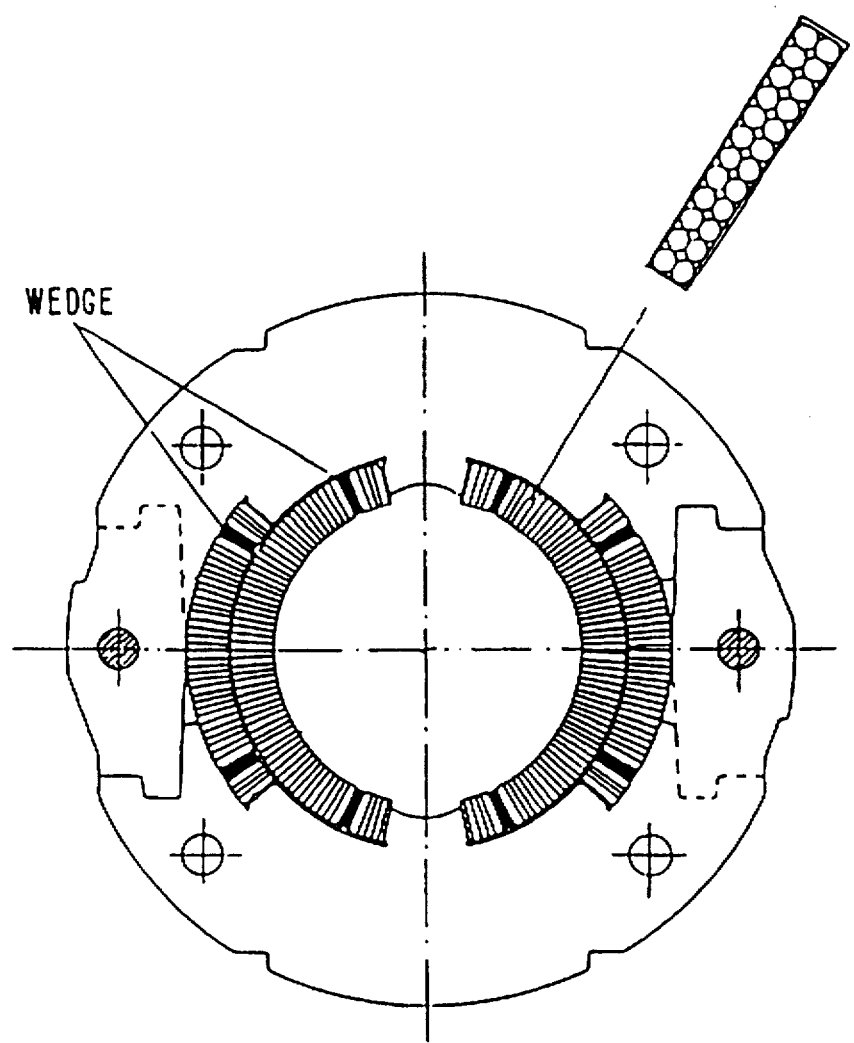
FIG. 6 shows a prior art two-shell air core dipole magnet that approximates a $\sin(\phi)$ angular current distribution, which is used in many high-energy particle beam accelerators.

As discussed above, a wire set with wires on a larger radius circle but identical in angles to a primary field-generating wire set will not affect the field uniformity of the primary wire set, but the choice of current directions can produce fields that either aid or oppose the fields of the primary wire set. If the currents on the outer set oppose the primary wire set currents, and have the proper magnitude, the fields generated by the combined wire sets external to the system decrease very rapidly. The outer wire set can be at any radius, but for optimum cancellation of external fields must have wire currents that are the currents in the primary (inner) wire set multiplied by the ratio of the radius of the inner wire set circle to the radius of the outer wire set circle. That is, if the inner set has a radius of 1 and the outer set a radius of 2, the current in the wires of the outer set is half the current of the wires on the inner set, and opposite in direction. FIG. 4b is a plot of field lines for a 16-wire (in the core field conductive pathway set) case, showing the field lines confined between the inner main wire set and the outer field-canceling set of wires.

Since the field of the outer set decreases the field in the useful region, the total current must be increased to achieve a given field. This inefficiency is the cost of the external field cancellation. In the above example, the current in the outer set is half the current of the inner set, and the radius is double, so the outer set reduces the field of the inner set (in the useful region) by one-fourth from the value without the field cancellation coils. To regain the previous field magnitude, the current in both sets must be increased by one-third.

The use of the outer field canceling coils converts the system from a linear dipole whose external fields decrease as $1/r^2$ to a multipole whose order depends on the number of wires in the system. For a 16-wire set (plus 16-wire field canceling coils), the fields fall off approximately as $r^{-12}$ with distance from the system center outside the field canceling coils. At four times the radius of the primary set, the field is decreased by a factor of $10^{-4}$ from the field at the system center.

The use of the outer set of field-canceling coils has the penalty of increased current requirements for a given desired field strength, with increased power dissipation in resistive systems, and somewhat increased size and complexity. The return is open geometry because of no (or minimal) traditional shielding requirements, easy access, and a reduction in site cost and complexity for large, high-field-strength systems. However, a traditional shielded system may have an advantage in some cases, particularly in small, resistive systems, or for very-high-field-strength systems where efficiency is a primary concern and a light, open geometry is less important. In such cases, the right-circular-cylinder transverse-field system preferred under the present invention has the advantage that a coaxial cylindrical ferromagnetic shield around the primary conductors does not affect the field homogeneity. The shield must be located far enough from the conductors that it does not approach saturation at any point, because that would produce nonlinearities and field distortions. For low-field-strength systems, the shield cylinder can be near the primary conductors, which in this case significantly enhances the efficiency, because the virtual (image solution) currents due to the shield are in the same direction as the actual currents in the conducting pathways, enhancing the field in the core region.

A conductive cylinder may be used for shielding the circular systems of the present invention if the system currents are pulsed or vary at a rate such that the magnetic field skin depth in the shield is small compared to the shield thickness. The field inside the shield is again calculated with the method of images, but in this case the image currents in a conducting cylinder are such as to oppose the core field, so this form of shield decreases the system efficiency.

For systems with wires located on right-circular cylinders, use of a shield does not affect the locations of the wires needed to achieve a uniform field. However, for shield use in non-circular systems, it is necessary to solve the appropriate number of the equations described below to achieve uniform fields.

There are two main cases of interest in shielding: the first uses ferromagnetic material, effective for static and time-varying magnetic fields, and the second uses a conducting shell, effective for rapidly varying fields. The cases are solved separately, with the assumption in the first case of a nonconducting shell of infinite permeability, and in the second, an infinite conductivity and free-space permeability.

The method of images is used in each case, and the addition of the shields does not add any free parameters to a system with a given number of wires. The equations derived for determining the free parameters in a uniform field system are similar to those above, with the addition of terms for the image currents.

$$I_n \cos[(2j+1)\emptyset_n](1 + R_n^{4j+2}/R_s^{4j+2})R_n^{2j+1} +$$
$$I_{n-1}\cos[(2j+1)\emptyset_{n-1}](1 + R_{n-1}^{4j+2}/R_s^{4j+2})R_{n-1}^{2j+1} + \ldots +$$
$$I_1\cos[(2j+1)\emptyset_1](1 + R_1^{4j+2}/R_s^{4j+2})R_1^{2j+1} +$$
$$wI_0(1 + R_0^{4j+2}/R_s^{4j+2})R_0^{2j+1} = 0$$

$$I_n \cos[(2j-1)\emptyset_n](1 + R_n^{4j-2}/R_s^{4j-2})R_n^{2j-1} +$$
$$I_{n-1}\cos[(2j-1)\emptyset_{n-1}](1 + R_{n-1}^{4j-2}/R_s^{4j-2})R_{n-1}^{2j-1} + \ldots +$$
$$I_1\cos[(2j-1)\emptyset_1](1 + R_1^{4j-2}/R_s^{4j-2})R_1^{2j-1} +$$
$$wI_0(1 + R_0^{4j-2}/R_s^{4j-2})R_0^{2j-1} = 0$$

$$I_n \cos[(2j-3)\emptyset_n](1 + R_n^{4j-4}/R_s^{4j-4})R_n^{2j-3} +$$
$$I_{n-1}\cos[(2j-3)\emptyset_{n-1}](1 + R_{n-1}^{4j-4}/R_s^{4j-4})R_{n-1}^{2j-3} + \ldots +$$
$$I_1\cos[(2j-3)\emptyset_1](1 + R_1^{4j-4}/R_s^{4j-4})R_1^{2j-3} +$$
$$wI_0(1 + R_0^{4j-4}/R_s^{4j-4})R_0^{2j-3} = 0$$

$$\vdots$$

$$I_n\cos(5\emptyset_n)(1 + R_n^{10}/R_s^{10})R_n^5 +$$
$$I_{n-1}\cos(5\emptyset_{n-1})(1 + R_{n-1}^{10}/R_s^{10})R_{n-1}^5 + \ldots +$$
$$I_1\cos(5\emptyset_1)(1 + R_1^{10}/R_s^{10})R_1^5 + wI_0(1 + R_0^{10}/R_s^{10})R_0^5 = 0$$

$$I_n\cos(3\emptyset_n)(1 + R_n^6/R_s^6)R_n^3 +$$
$$I_{n-1}\cos(3\emptyset_{n-1})(1 + R_{n-1}^6/R_s^6)R_{n-1}^3 + \ldots +$$
$$I_1\cos(3\emptyset_1)(1 + R_1^6/R_s^6)R_1^3 + wI_0(1 + R_0^6/R_s^6)R_0^3 = 0,$$

where, as before, j is the number of free variable in the system (those not initially specified), n is the number of wires per quadrant (not including any on-axis wires), the $I_n$, $R_n$, $\emptyset_n$ are the currents, radii and angles of the off-axis wires, $I_0$ and $R_0$ are the current and radius of the on-axis wire if any, and $R_s$ is the radius of the ferromagnetic shield. The parameter $w=0.5$ if there are wires on the x-axis, and $w=0$ if there is no on-axis wire.

As an example, the four equations to be solved for a two-wire per quadrant system with additionally one wire on the positive x-axis (and on the negative x-axis by reflection) (10 wires total) with a ferromagnetic shield are:

$$I_2\cos(9\emptyset_2)(1+R_2^{18}/R_s^{18})R_2^9 + I_1\cos(9\emptyset_1)(1+R_1^{18}/R_s^{18})R_1^9 + wI_0(1+R_0^{18}/R_s^{18})R_0^9 = 0$$

$$I_2\cos(7\emptyset_2)(1+R_2^{14}/R_s^{14})R_2^7 + I_1\cos(7\emptyset_1)(1+R_1^{14}/R_s^{14})R_1^7 + wI_0(1+R_0^{14}/R_s^{14})R_0^7 = 0$$

$$I_2\cos(5\emptyset_2)(1+R_2^{10}/R_s^{10})R_2^5 + I_1\cos(5\emptyset_1)(1+R_1^{10}/R_s^{10})R_1^5 + wI_0(1+R_0^{10}/R_s^{10})R_0^5 = 0$$

$$I_2\cos(3\emptyset_2)(1+R_2^6/R_s^6)R_2^3 + I_1\cos(3\emptyset_1)(1+R_1^6/R_s^6)R_1^3 + wI_0(1+R_0^6/R_s^6)R_0^3 = 0,$$

where $I_1$, $R_1$, $\emptyset_1$, and $I_2$, $R_2$, $\emptyset_2$ are the currents, radii and angles of the two off-axis wires, $I_0$ and $R_0$ are the current and radius of the on-axis wire, and $R_s$ is the radius of the ferromagnetic shield. The parameter $w=0.5$ since there is a wire on axis. Four of these eight parameters must be specified to obtain a solution. One possibility is to specify all radii (e.g., on a circle) and normalize $I_0$ to 1. Another is to set all currents to be identical, and normalize $R_0$ to 1. The shield radius $R_s$ is taken to be a specified value in all cases.

Equations for the conducting shield cases are identical except for a change of sign. The general equations for the conducting shield cases are:

$$I_n\cos[(2j+1)\emptyset_n](1 - R_n^{4j+2}/R_s^{4j+2})R_n^{2j+1} +$$
$$I_{n-1}\cos[(2j+1)\emptyset_{n-1}](1 + R_{n-1}^{4j+2}/R_s^{4j+2})R_{n-1}^{2j+1} + \ldots +$$
$$I_1\cos[(2j+1)\emptyset_1](1 - R_n^{4j+2}/R_s^{4j+2})R_1^{2j+1} +$$
$$wI_0(1 - R_0^{4j+2}/R_s^{4j+2})R_0^{2j+1} = 0$$

$$I_n\cos[(2j-1)\emptyset_n](1 - R_n^{4j-2}/R_s^{4j-2})R_n^{2j-1} +$$
$$I_{n-1}\cos[(2j-1)\emptyset_{n-1}](1 - R_{n-1}^{4j-2}/R_s^{4j-2})R_{n-1}^{2j-1} + \ldots +$$

-continued
$$I_j\cos[(2j-1)\emptyset_1](1 - R_j^{4j-2}R_s^{4j-2})/R_j^{2j-1} +$$
$$wI_0(1 - R_0^{4j-2}/R_s^{4j-2})/R_0^{2j-1} = 0$$
$$I_n\cos[(2j-3)\emptyset_n](1 - R_n^{4j-4}/R_s^{4j-4})/R_n^{2j-3} +$$
$$I_{n-1}\cos[(2j-3)\emptyset_{n-1}](1 - R_{n-1}^{4j-4}/R_s^{4j-4})/R_{n-1}^{2j-3} + \ldots +$$
$$I_j\cos[(2j-3)\emptyset_1](1 - R_j^{4j-4}/R_s^{4j-4})/R_j^{2j-3} +$$
$$wI_0(1 - R_0^{4j-4}/R_s^{4j-4})/R_0^{2j-3} = 0$$

$$\vdots$$

$$I_n\cos(5\emptyset_n)(1 - R_n^{10}/R_s^{10})/R_n^5 +$$
$$I_{n-1}\cos(5\emptyset_n - 1)(1 - R_{n-1}^{10}/R_s^{10})/R_{n-1}^5 + \ldots +$$
$$I_j\cos(5\emptyset_1)(1 - R_j^{10}/R_s^{10})/R_j^5 + wI_0(1 - R_0^{10}/R_s^{10})/R_0^5 = 0$$
$$I_n\cos(3\emptyset_n)(1 - R_n^6/R_s^6)/R_n^3 +$$
$$I_{n-1}\cos(3\emptyset n - 1)(1 - R_{n-1}^6/R_s^6)/R_{n-1}^3 + \ldots +$$
$$I_j\cos(3\emptyset_1)(1 + R_j^6/R_s^6)/R_j^3 + wI_0(1 - R_0^6/R_s^6)/R_0^3 = 0,$$

where the variables are defined in the same way as for the ferromagnetic shield case. The equations for the above 10-wire set with a conducting instead of ferromagnetic shield are:

$$I_2\cos(9\emptyset_2)(1-R_2^{18}/R_s^{18})/R_2^9 + I_1\cos(9\emptyset_1)(1-R_1^{18}/R_s^{18})/R_1^9 + wI_0(1-R_0^{18}/R_s^{18})/R_0^9 = 0$$

$$I_2\cos(7\emptyset_2)(1-R_2^{14}/R^{14})/R_2^7 + I_1\cos(7\emptyset_1)(1-R_1^{14}/R_s^{14})/R_1^7 + wI_0(1-R_0^{14}/R_s^{14})/R_0^7 = 0$$

$$I_2\cos(5\emptyset_2)(1-R_2^{10}/R_s^{10})/R_2^5 + I_1\cos(5\emptyset_1)(1-R_1^{10}/R_s^{10})/R_1^5 + wI_0(1-R_0^{10}/R_s^{10})/R_0^5 = 0$$

$$I_2\cos(3\emptyset_2)(1-R_2^6/R_s^6)/R_2^3 + I_1\cos(3\emptyset_1)(1-R_1^6/R_s^6)/R_1^3 + wI_0(1-R_0^6/R_s^6)/R_0^3 = 0,$$

with the definitions of variables being the same as in the ferromagnetic case.

Figure 32:
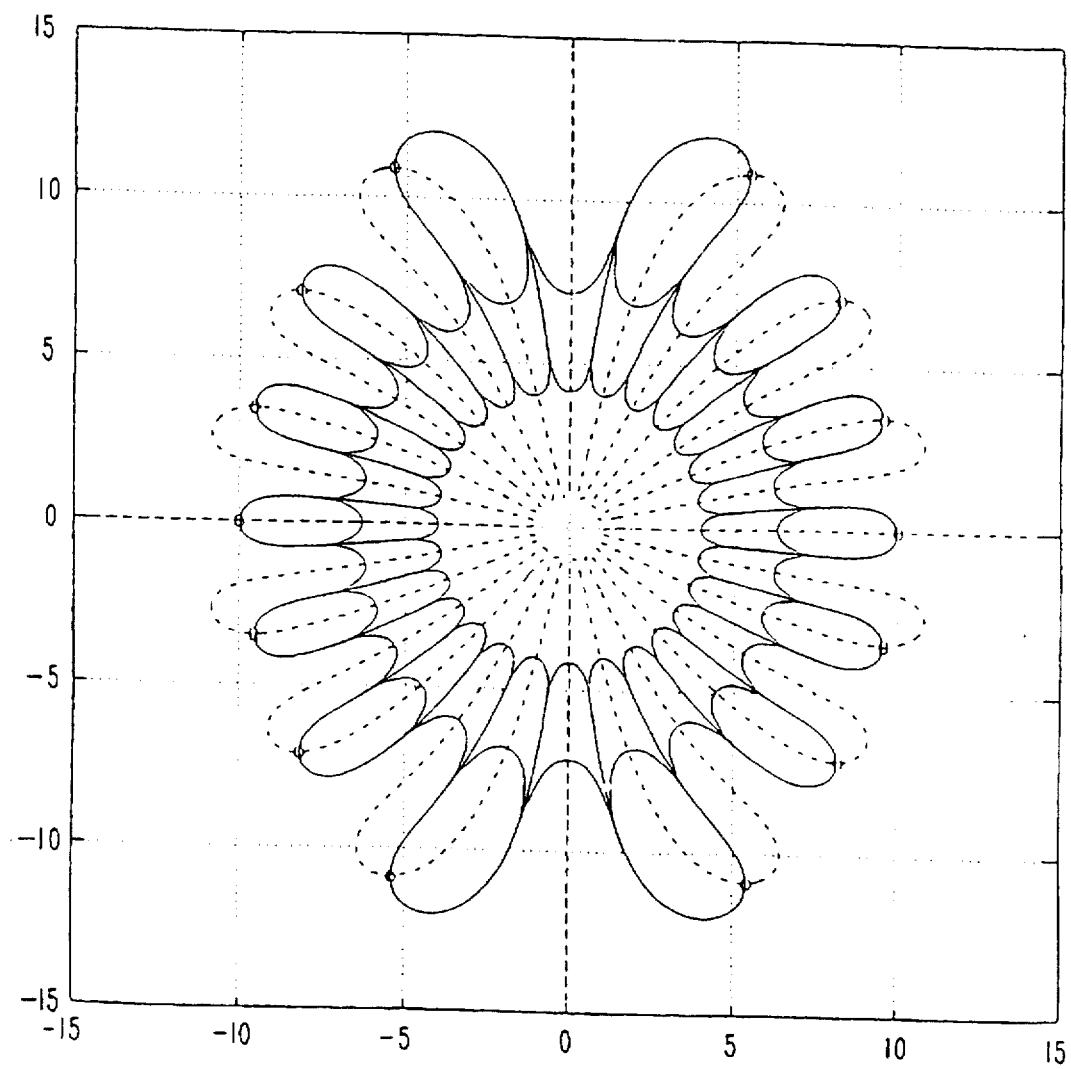
FIG. 32 shows, for the general solution method for a 14-wire dipole configuration with identical current in all wires, an optimal solution with no shielding.
Figure 33:
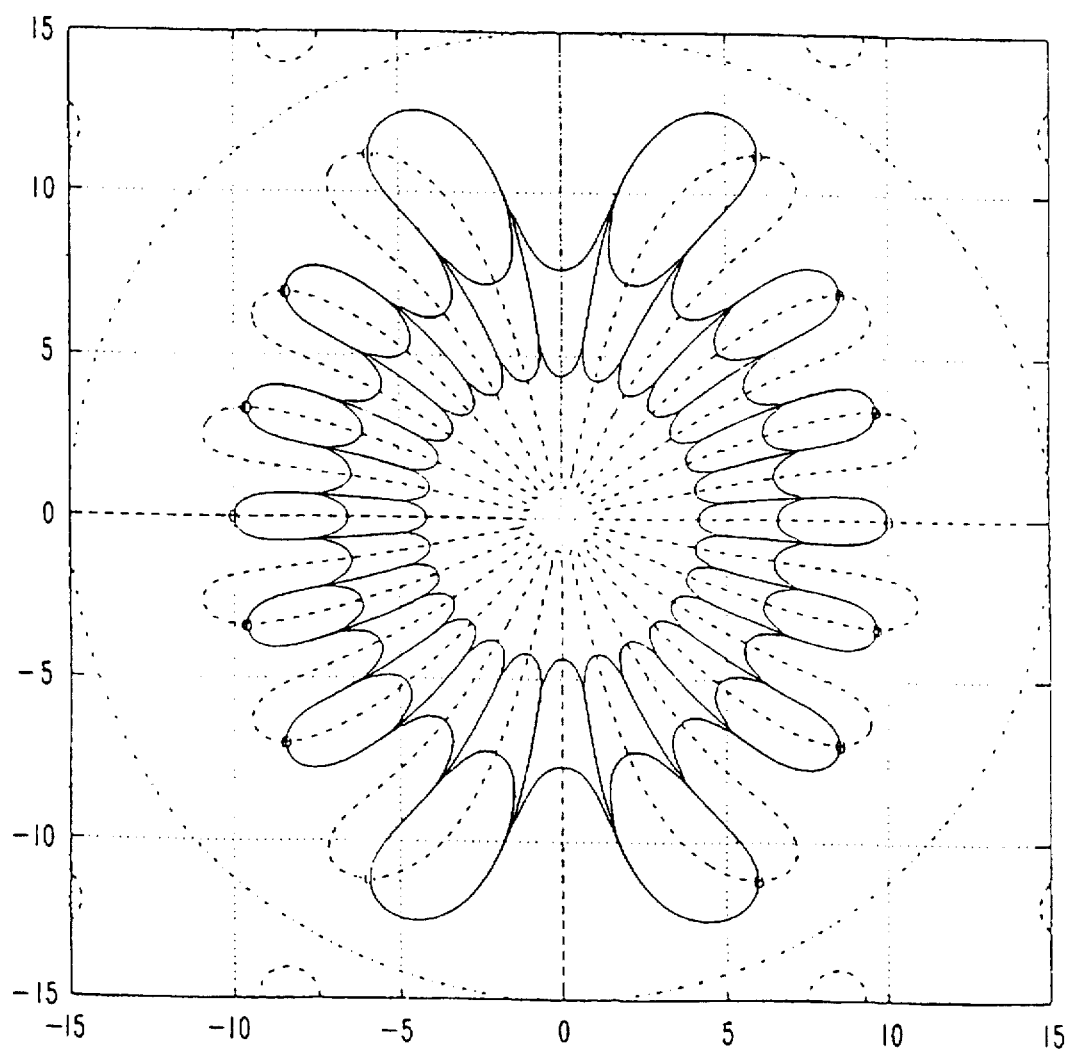
FIG. 33 shows an optimal solution for the case of FIG. 32 with a ferromagnetic shield.
Figure 34:
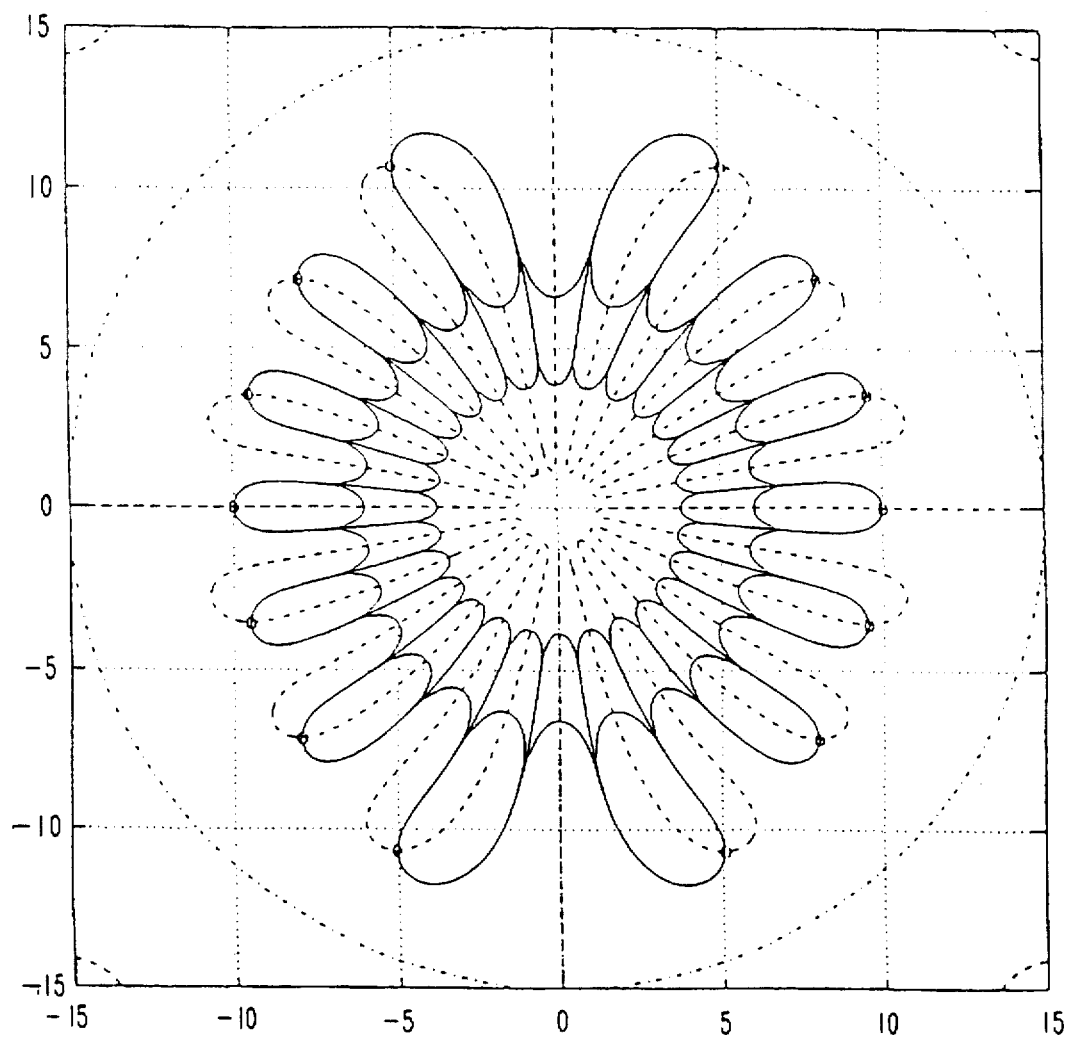
FIG. 34 shows an optimal solution for the case of FIG. 32 with a conducting shield.

FIGS. 32–34 show a 14-wire dipole configuration for no shield, a ferromagnetic shield, and a conducting shield for cases with identical currents in all wires, with radii and angles being determined by the equation solutions. The homogeneity characteristics are essentially unchanged, with a slight improvement in area of a given uniformity with the ferromagnetic shield, and slight degradation with the conducting shield.

Combinations of ferromagnetic and conducting shields can be similarly calculated, and compensation made for finite resistivity and permeability.

Figure 14A:
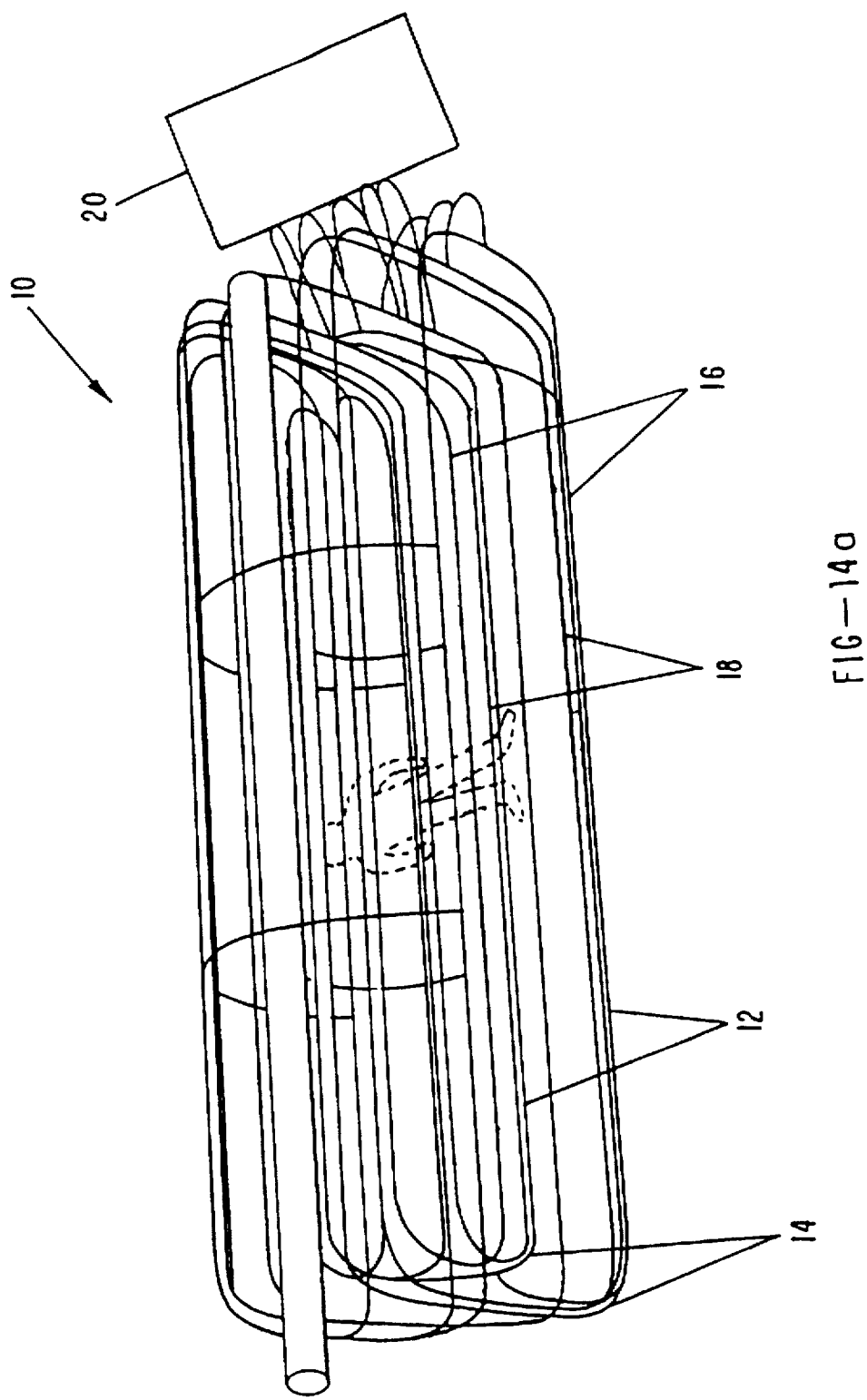
FIG. 14a is a perspective view of the preferred apparatus of the uniform-magnetic-field embodiment of the invention employing field cancellation and a homopolar generator to provide pulsing.
Figure 14B:
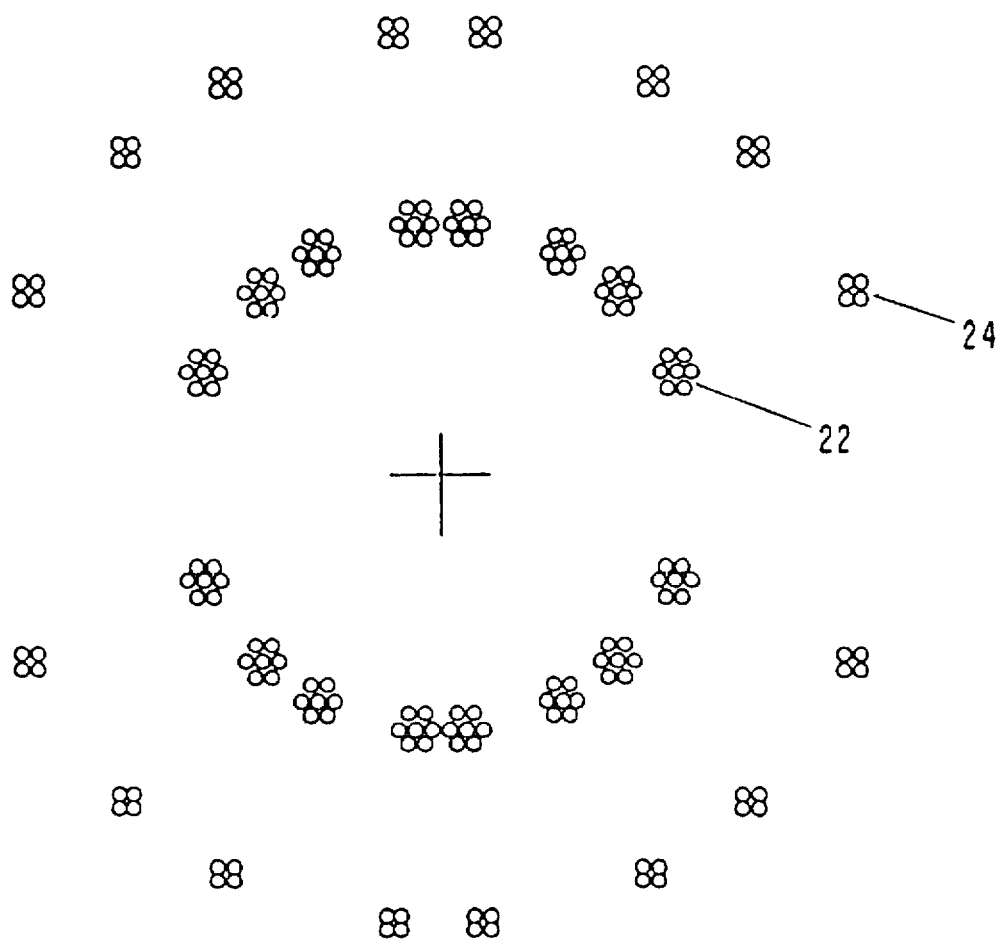
FIG. 14b illustrates the preferred use of multiple wires within the conductive pathways for both field generation and field cancellation.
Figure 14C:
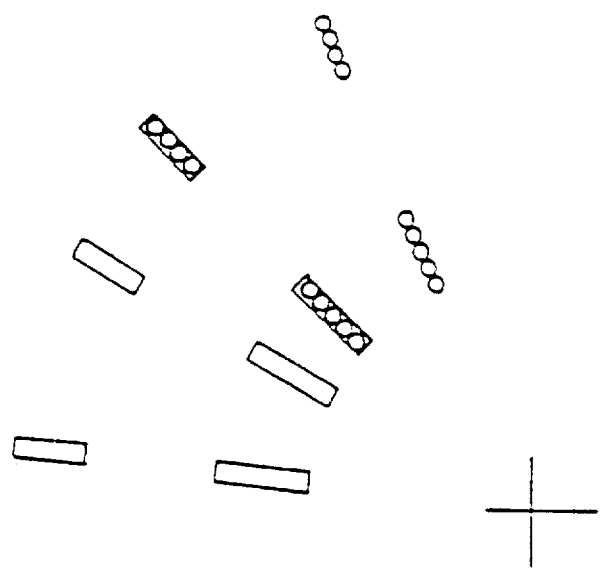
FIG. 14c illustrates the use of current sheets to provide both field generation and field cancellation.

Referring to FIG. 14a, in the preferred uniform field generation apparatus 10 of the present invention, the line currents 12 are closed at the ends 14, forming long roughly rectangular loops 16 with straight sides 18. Power and pulsing capability is provided by a high-stability power supply, or, in the case of pulsed fields, a homopolar generator 20. The rectangular loops may be composed of one or many turns of wire, and may be resistive or superconducting. The external field cancellation circuits are also closed at the ends. Referring to FIG. 14b, the same current supply (preferably fully series, both primary and field cancellation coils) can be used in both sets of conductors if the inner (primary) set is composed of loops each having n wires 22, with the field cancellation loops having m wires 24, with the radii of the two sets related as $R_{cancel}=(n/m)R_{primary}$, and the currents in the two sets related as $I_{cancel}=(m/n)I_{primary}$. The series circuit insures that the currents are exact for optimal internal field homogeneity and external field cancellation. Separately controlled currents in each loop or leg (parallel circuits) may be used, with sufficient current regulation accuracy. Referring to FIG. 14c, current sheets 26 may be used to provide both field generation and field cancellation currents.

Figure 15:
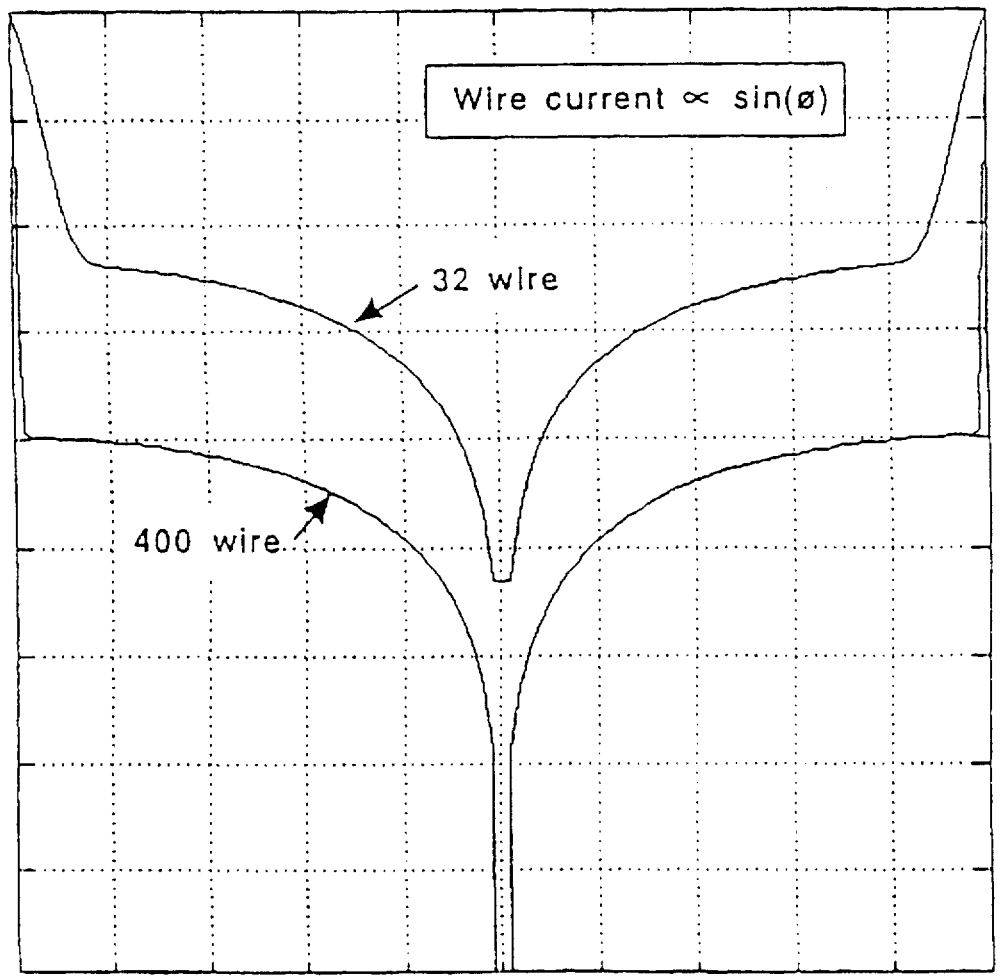
FIG. 15 is a graph identical to that of FIG. 4 for 8 and 100 wires per quadrant employing the prior art method of locating wires using $I=I_0\sin(\emptyset)$.

A surface current distribution on a straight cylinder that varies as $I=I_0\sin(\emptyset)$ will produce a uniform field inside the cylinder. Peterson, "Nuclear Research Magnets," Proceedings of the Int'l Conference on High Magnetic Fields ch. 88 at 726-36 (MIT Press, 1961). This surface current distribution can be approximated by wires carrying equal currents whose angular locations vary as sin ($\emptyset$). However, the discrete wire approximation converges very slowly. FIG. 15 shows the homogeneity results for 8-wire per quadrant (32 wire total) and 100-wire per quadrant (400 wire total) optimized sinusoidally-distributed sets, for comparison with the sets of the invention whose results are shown in FIG. 7. In FIG. 15, there is a negligible region of 10 PPM homogeneity in the 32-wire set, and only a small region in the 400-wire set. The sinusoidal method (and apparatuses based thereon) is impractical for the high accuracy required by many applications of uniform magnetic and/or electric fields. In any case, for a given number of wires the optimum configurations of the present invention always produce a field that is superior to the sin ($\emptyset$) field. Also, field cancellation by an outer set of cancellation coils is much more effective (a factor of 10 or more at a given radius) in the present invention than in the case where the wires are spaced with a sin ($\emptyset$) dependence.

The transverse field system of the present invention requires only a small number of conductors to produce highly uniform fields over a large area. These conductors (preferably rectangular loops) can be constructed of few or many turns, with the system tradeoff being current versus inductance. An inductance can be achieved that is very small compared with solenoidal systems, allowing a pulsed field to be efficiently produced with moderate voltages. Uses of pulsed systems according to the present invention in particular applications are discussed below.

The present invention is particularly useful in magnetic resonance imaging (MRI) applications. For MRI applications, the necessary field homogeneity over the volume of interest (a cube about 40 cm per dimension) is approximately 10 PPM, with field strengths ranging from 0.05 T to 2 T. These fields are traditionally provided by solenoids, resistive for low fields and superconducting for high fields. The transverse field system of the present invention provides the necessary homogeneity but provides several advantages over a solenoid-based system. Access to the homogeneous field region at the center of a solenoid must be made through the ends, which must be left open. Magnetic fields of a solenoid decrease relatively slowly with distance. Shielding of the external environment from these fields is an important and expensive part of the system installation. Shielding is heavy, and must be located far enough away that perturbations of the core field can be corrected by shim coils. Loose iron or steel objects near the magnet are accelerated strongly towards its core, creating a severe safety hazard. Moving conductors will have currents induced by the stray fields. Because the field lines extend well outside the solenoid system, external objects also perturb the core field of the magnet, affecting the imaging process. Because of these effects, the high-field (greater than 1 T) systems are generally located outside the hospital environment, and often in relatively remote locations.

Figure 1:
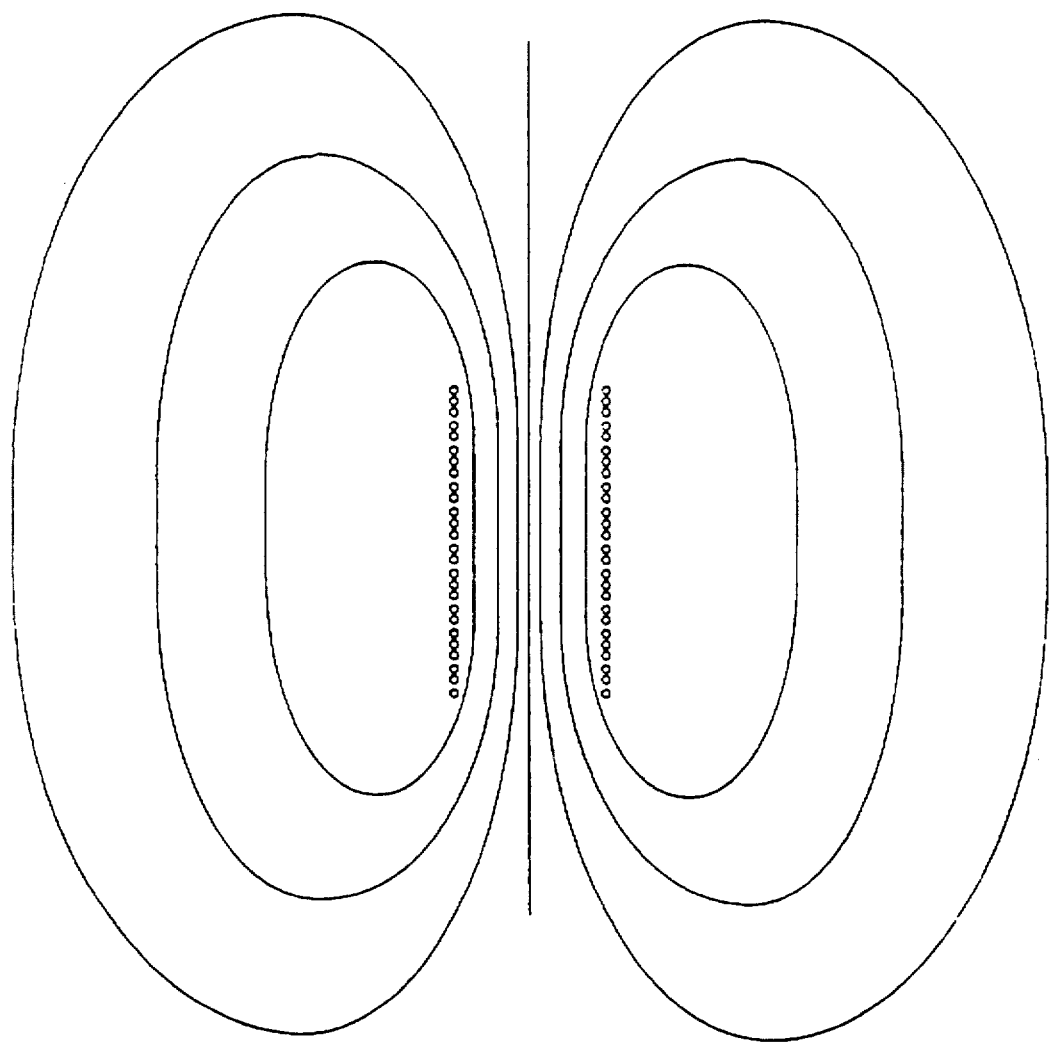
FIG. 1 shows in cross-section the field lines of a prior art solenoidal magnet closing at large distances outside the solenoid.
Figure 2:
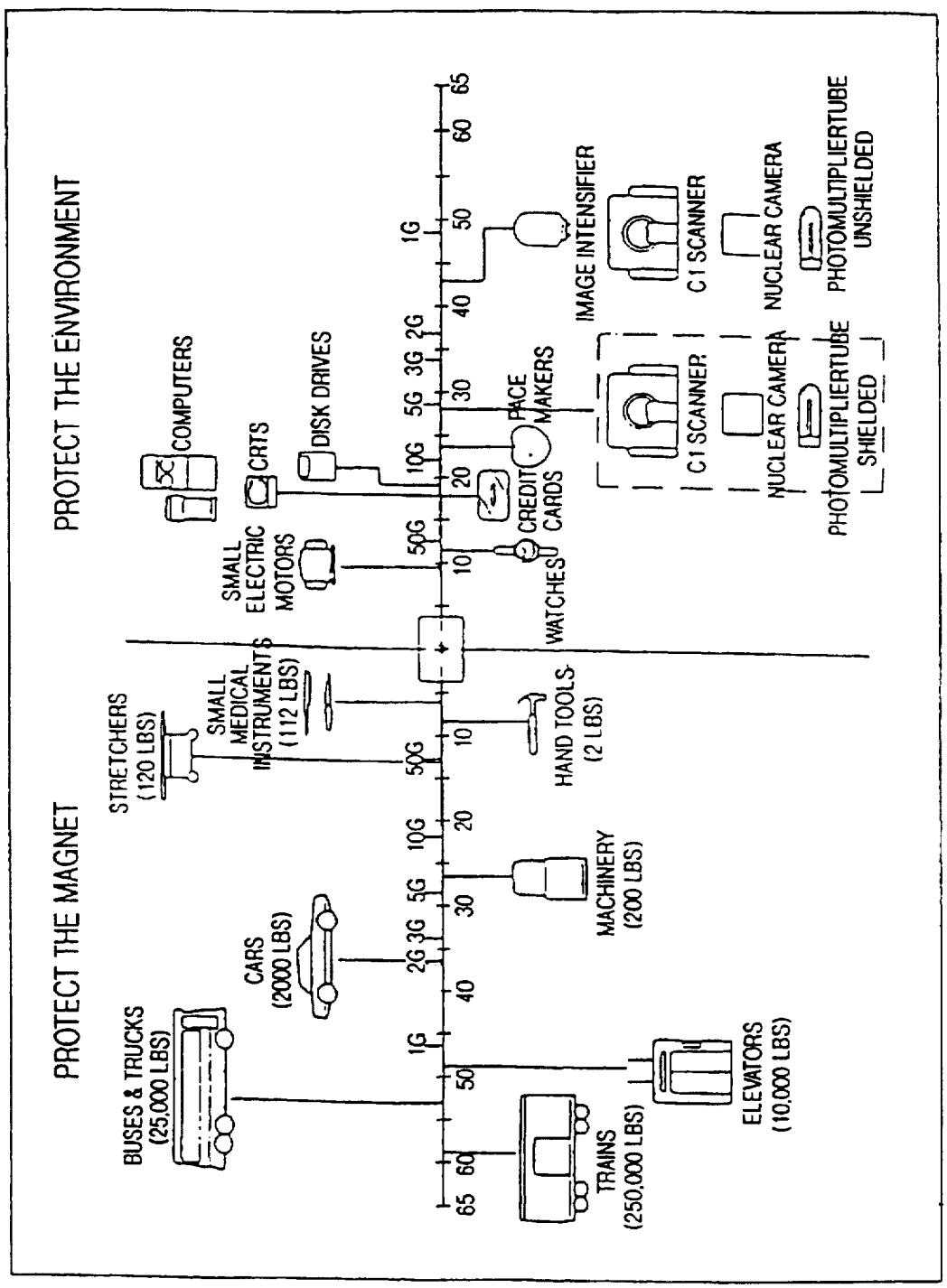
FIG. 2 shows the range of the field and recommended minimum distances for various items from a conventional 0.5 T solenoidal magnet for medical MRI applications.

Systems according to the present invention with field cancellation coils have fields that decrease very rapidly outside the system, even without shielding. The field lines in the center connect entirely within the system of coils, and external objects are not accelerated toward the core. Perturbation of the field by external ferromagnetic objects is virtually eliminated. The 5 G surface (Food and Drug Administration maximum for unrestricted access) is less than two meters (2 m) radially from the center of a 2 T, one meter (1 m) core diameter transverse field system. This can be compared with the 0.5 T system of FIG. 2, where the 5 G magnitude is at 8.5 m (28 ft) from the magnet center; if this system were increased in field strength, the 5 G magnitude would be nearly 14 m (46 feet) from the magnet center. The greatly reduced shielding needs result in a much lighter system and reduced site costs, thus rendering it more feasible to locate the system within hospital buildings.

Figure 3:
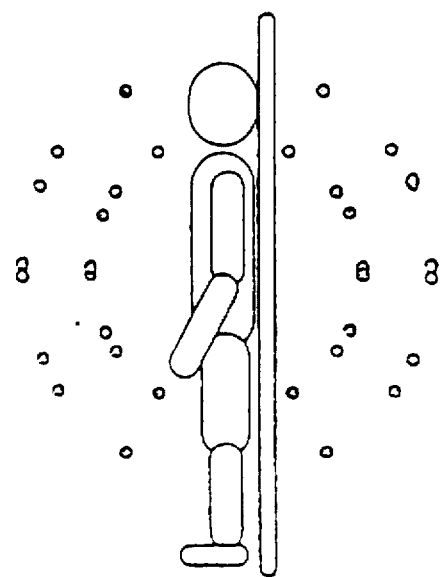
FIG. 3 schematically illustrates a configuration of the present invention in an MRI application permitting access for patients along and across the magnet.
Figure 3:
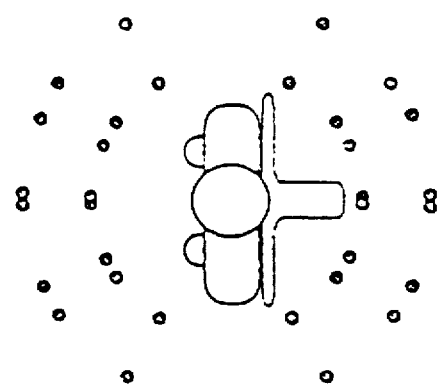

The ends of the preferred embodiment for MRI applications are closed by the continuation of the conductive paths, and patient access is through the large gap along two sides of the field coil assembly in particular configurations of the present invention (see FIG. 3). This gap is a natural part of the conductor assembly, and is not a perturbation on the core field or a source of field leakage. Persons to be scanned can be entirely within the core, along the long axis, or across the long axis. The minimum length of the system (along the axis) depends on the length necessary for adjusting the field homogeneity along the axis. The cross position possible with the present invention allows the possibility of short, compact, lower-cost systems for scanning limited regions, for limbs or for mammography, for example.

Forces on the conductor system of the present invention will on the average be the same as in a same diameter solenoid at the same field, but forces are concentrated more on the smaller number of conductors. Forces on conductors in a one meter interior diameter, one Tesla system are about 20,000 pounds per foot of length, which would produce approximately 0.010 inch deflection in a one inch steel rod supported at 18 inch intervals. These are manageable levels of force, although in some areas of a high field magnet, it may be necessary to trade some of the openness of the system for strength. The forces decrease as the square of the magnetic field strength, so a medium-field MRI system of 0.2 T would have $\frac{1}{25}$ the stress.

The preferred embodiment is open, with visual and instrument access through the large side openings and between conductors. The solenoid-based MRI units presently in use are solid-wall tubes, with open ends. MRI scans of some patients are impossible because of claustrophobic reactions to the confined bore of the solenoid. The transverse-field system of the present invention reduces this difficulty, being much more visually open, and its reduction of external fields without shielding can allow closer access to patients by others (particularly important with children).

Magnets for conventional MRI systems are on continuously, or at least for long periods, because imaging times are several minutes. Closed-loop superconducting magnets have the added advantage of long-term current (and therefore magnetic field) stability. Parallel processing computer technology will soon allow image acquisition times to drop to a few seconds, and so the relatively low inductance of the present invention makes long-pulse resistive magnets useful, preferably driven by homopolar generators or similar pulsers. This eliminates the initial and maintenance costs of cryogenics, which add significantly to the costs of an MRI system.

The present invention is also useful with nuclear magnetic resonance (NMR) and chemical shift spectrometry and imaging. The resolution required for NMR can require field homogeneities approaching 1 part per billion. The present invention is well behaved, and has a large region of this level of field accuracy, assuming the conductors are located and kept in position with the needed accuracy. As noted above for MRI systems, the present invention is much more immune to perturbations by external objects than solenoidal systems, and the relatively small number of individual separate conductors makes it possible to tune the field by position adjustment of the conductors during construction and/or installation. Alternatively, small independently adjustable currents can be located along the primary conducting loops. The open geometry is an advantage for instrument and sample-positioning access.

Figure 16:
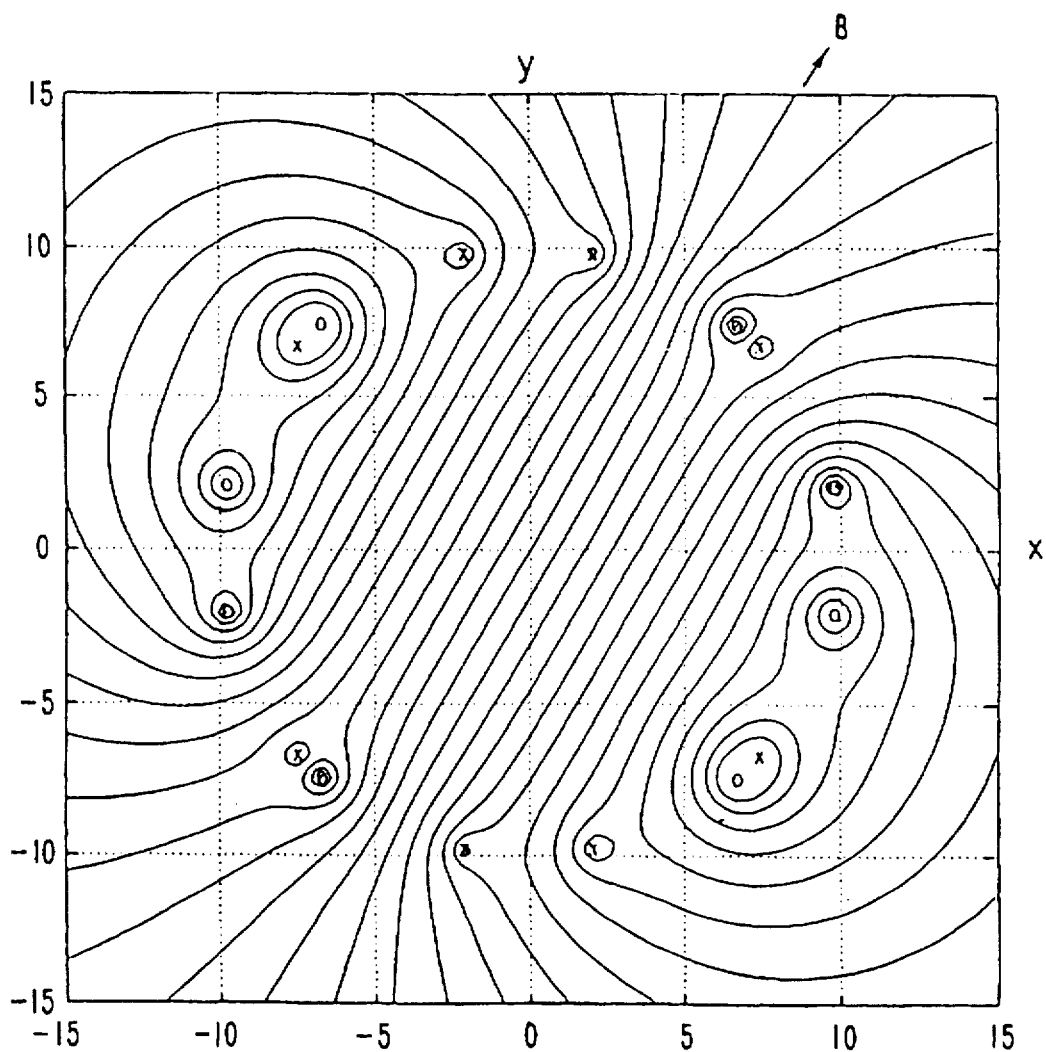
FIG. 16 shows field lines for a dipole embodiment of the present invention whose uniform field can be caused to rotate in time (shown 30° rotation)

Another embodiment of the invention provides for field rotation in time. By combining two identical wire sets such that both have the same longitudinal axis, but with one set rotated 90° with respect to the other, a system is produced in which the field vector can be rotated by adjusting the relative currents in the two wire sets. Since the area of uniformity of field or gradient is independent of the current, the combined system retains the uniformity of a single wire set. Furthermore, if the two sets are fed with sinusoidally-time-varying power supplies that are 90° out of phase (sine and cosine) they will produce a field with the original uniformity characteristics whose field vector direction rotates in time at the frequency of the applied currents. The magnitude of the field is unchanged if the peak currents in each of the two sets is identical. FIG. 16 shows lines of B for such a pair of 8-wire sets (one set indicated by "o" symbols, the other by "x" symbols) combined with the sinusoidal currents at a time when there is a 30° rotation.

Figure 17:
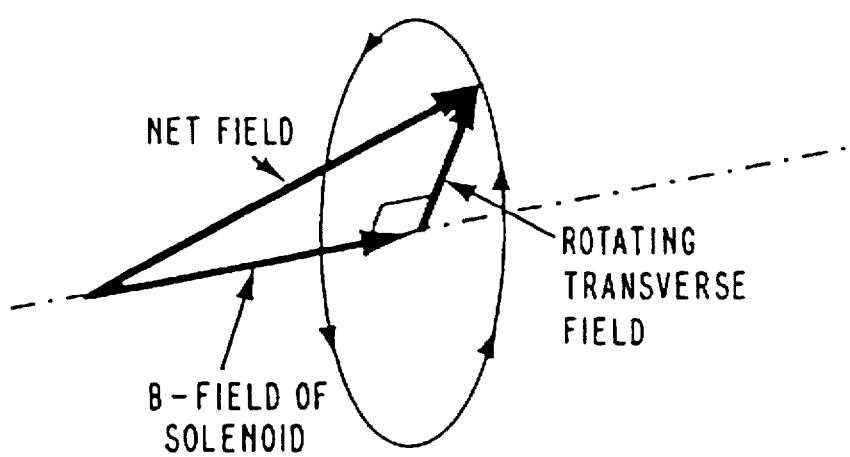
FIG. 17 is an illustration of the combination of rotating angled field vectors obtained by combining the rotating field of FIG. 16 with the field of a solenoid wound around the wire cylinder axis.

The system of rotating fields can be further adapted to produce a field vector that has a constant component in the longitudinal (z) direction by combining the two transverse-field sets described in the previous paragraph with the field of a solenoid wrapped around the two systems. Increasing the current in this solenoid superposes a constant z-component on the magnetic field, which adds to the rotating component in the cross-section plane. The net field vector at a point in the interior of the device thus sweeps out a cone as it rotates, as illustrated in FIG. 17. Changing the ratio of the peak currents of the sinusoidally varying, transverse-field supplies will produce a cone that is flattened, rather than right-circular; that is, the field magnitude will vary as the field vector rotates. This can have application in establishing spatial gradients for imaging.

A rotating dipole field, either electric or magnetic, has application in a time-resolved charged particle momentum or energy analyzer. A beam whose energy varies with time that passes through a rotating transverse field will trace out a curve on exiting the field. Given knowledge of the field values, a time-resolved record of the beam energy (electric dipole) or momentum (magnetic dipole) is obtained. The advantage of the present invention is its low capacitance and inductance, which allows high frequency rotation of the field.

The rotating-field configurations are particularly useful in NMR and in chemical shift spectrometry and imaging. The low inductance of the system allows field vector rotations at high frequencies. To achieve the required high field accuracy, the two orthogonal wire sets must be driven by currents that are orthogonal in time (sine and cosine dependence on time) and have phase and peak current accuracies comparable to the field accuracy desired. These orthogonal currents may be achieved with two separate high-accuracy power supplies combined with an active phase and amplitude sensing and correction system, or may be achieved with a single supply by coupling the two orthogonal sets with appropriate capacitors in a resonant system to produce the orthogonal currents. The rotating-field system can also include external field cancellation, just as do the static field configurations. The field-cancellation coils companion to a wire set are duplicated from the wire set and rotated 90° to provide cancellation for the fields generated by the orthogonal set.

Another application concerns the video image in a television picture tube, which is produced by a highly focused electron beam that is swept across the phosphor coated face of the tube, then stepped down a short distance and again swept across, ultimately sweeping the entire tube face. This rastering process is accomplished by a pair of magnetic coils oriented 90° to each other, placed around the picture tube neck. The set of coils, referred to as a yoke, have complex multi-turn windings and must be individually tuned or compensated for errors. Shielding of the yoke is generally not done, since image currents in a nearby shield would affect the field accuracy.

The high-uniformity magnetic field configurations described above may be used in a new rastering configuration that would have advantages of simpler construction (inherently high accuracy with few conductors), ability to be shielded without affecting field uniformity or accuracy, higher efficiency (less volume filled with magnetic field), lower inductance for faster sweep capability, possibly fewer total system parts and less adjustment labor in assembly if the inherent high accuracy requires less compensation, and with additional advantages in a high-accuracy application such as high-definition television. Other applications, such as electron beam etching or welding may also use this system.

The high-accuracy dipole system would be configured for rastering applications by having two dipole sets oriented at 90° to each other, using one to provide sweep in one direction, while the current in the second is stepped at a rate that deflects the beam in small increments perpendicular to the sweep. The configuration is similar to the rotating field configuration described above, but with the two coils driven independently and appropriately for the raster deflection of the beam. The same system could equally well be applied to beams of positively charged ions.

For field equations which can be solved in the electric cases for wires that have their potentials specified (as opposed to wire charges specified, which correspond to current in the magnetic cases) then a new class of useful electric beam deflection devices becomes possible. Electrostatic beam deflectors are used in oscilloscopes to direct the electron beam. Magnetic sweep is not used, because the high inductance of deflection coils restricts the frequency response. (The low inductance magnetic yoke described above is also useful here, particularly for large-screen devices.) A low-capacitance (therefore high frequency response) deflection plate system may constructed using the present invention.

The invention may be extended to produce fields that are uniform both magnetically and electrically. This is useful in charged-particle-beam energy analyzers and other beam handling uses. Making the uniform E-field requires that magnetic current configurations be replaced by a system whose line charges (not potentials or voltages) are identical. The method for achieving this is to calculate the potential needed on each conductive pathway to produce that charge, and build a system to regulate those different potentials. The presence of the conductors of a magnetic field system changes the charge/potential relationship of the E-field system. It is necessary to calculate the potential distribution on a set of conductors with given charges. This is a two-dimensional calculation, not three. It is not necessary to identify new conductive pathway configurations, only the potentials that will produce the desired charges on the conductive pathways that are at positions identified by the above methods.

Mass spectrometers and charged particle analyzers require a uniform magnetic field transverse to the direction of the charged particle beam to be measured. The higher the uniformity of the transverse field, the better the resolution of the instrument. The transverse field system of the present invention offers very high uniformity compared to existing systems, as well as the option of pulsing to high fields. The method of locating conductors in the present invention produces analyzers with E parallel to B, or E rotated 90° to B. The electric fields in these types of analyzers are presently produced by parallel plates, which must be close together to obtain high uniformity near the center, where the beam passes. The present invention produces highly uniform electric fields over a large circular cross-section of a cylinder, or of other shapes, including parallel planes.

Uniform magnetic fields perpendicular to a tube axis are used as beam-turning fields in various types of charged-particle accelerators. In these systems, field nonuniformities tend to heat the particle beam, so large area uniformity is important.

In a practical application of the present invention, the currents must be supplied to the wires such that the wire currents are identical. A convenient way to do this is to configure the system into rectangular loops with all loops in series. This is not the only possibility, however. Wires may be fed individually with separate current supplies, or the two halves of the dipole set (the wires at positive x being one half and the wires at negative x being the other) may be fed with separate supplies. There is an advantage to this in uniform-field applications where a slight field gradient in the x-direction is desired (discussed below).

Figure 18:
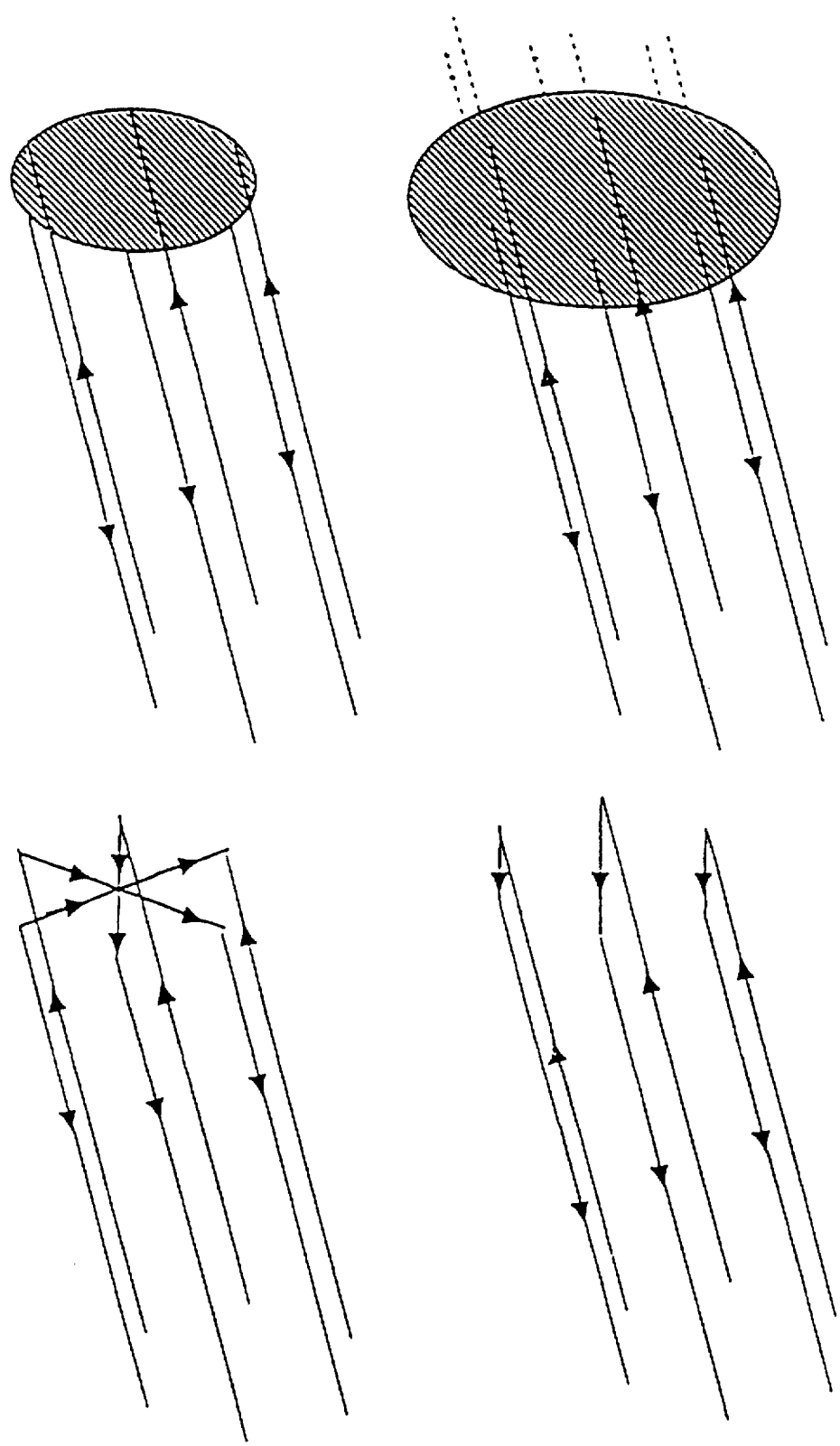
FIG. 18 illustrates an embodiment of the present invention wherein the current paths at the ends of the wire loops are closed.

The wire loops may be closed at the ends in a variety of ways, as in FIG. 18. Those configurations in which the wires terminate in a plate require some individual current adjustment to compensate for resistance differences of different paths. The drawing in the lower right shows the wires terminating in a plate that is considerably larger than the wire circle. In a pulsed system, in which the pulse rate or frequency is sufficiently high that the skin depth in the plate is less than its thickness, there will be image currents in the plate that will produce a field structure that will reduce the end effects of the finite length of the system.

Figure 19:
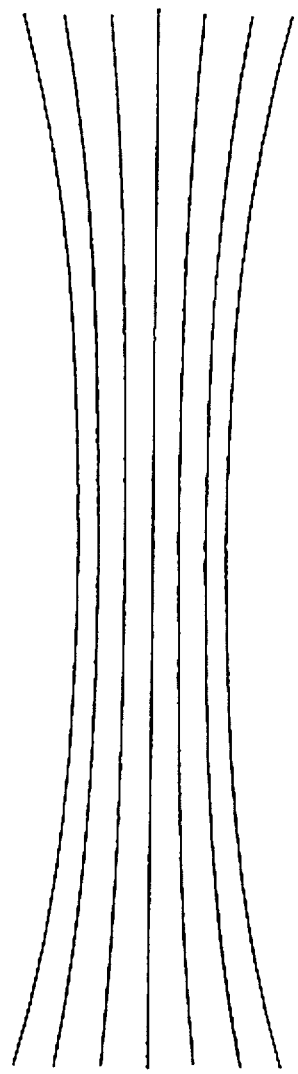
FIG. 19 illustrates an embodiment of the present invention wherein the wire loops are biconic to compensate for increased field in approaching the ends of the magnet.

Considering just the rectangular loop case, although all configurations will show effects of finite length (end effects), a simple calculation shows that the field increases in moving from the center of the system toward either end, in a manner analogous to that of solenoids, whose fields decrease in approaching the ends. The functional dependence near the center of a solenoid is very nearly the inverse of that of a comparable length transverse field system. Compensation for end effects in a solenoid is made using shim coils to increase the fields at the ends. In the transverse field system of rectangular loops of the invention, compensation may be made by, e.g., increasing the system radius as some function of the distance from the system center as the ends are approached, making the configuration approximately biconic (see FIG. 19). The rate of radius increase must be calculated. End effects on the useful area near the center can also be decreased by making the system longer with respect to its radius, just as with a solenoid.

The transverse field system of the invention can be either superconducting or resistive. Superconducting systems have the advantages of current stability and essentially no power to maintain the field after the current is brought to final value. This means that superconducting systems can generally be operated at much higher fields than resistive systems, where power requirements and heat dissipation become prohibitive. Superconductive systems have the major disadvantages of complexity, high operating costs for the cryogenic systems, danger of failure (quench), need to operate continuously (long time to power up and down), and high initial cost.

To be used in cryogenic modes, the transverse field system of the present invention requires configurations where mechanical forces can be conveniently transferred through vacuum walls, so that individual wires (or conducting paths) can be cooled to cryogenic temperatures. For example, the wires may be supported by a more or less solid cylinder and the cooling methods similar to those for solenoids applied. Cryogenic is not necessarily superconducting. Cooling the conductors to liquid nitrogen temperatures (77K) reduces copper resistance by a factor of 7, reducing power dissipation (and voltage requirements) by a factor of 7 for a given field. This may not require vacuum thermal insulation, although such insulation is usual in liquid nitrogen systems.

High fields are achievable in a resistive version of the transverse field system of the invention by operation in a pulsed mode, that is, at low duty cycle. The specific heat of the copper windings and supports absorb the heat from the short high-power pulse, and the heat is dissipated or carried away with moderate cooling rates. This is possible with the transverse field system because of its low inductance (a few to tens of millihenries vs. many henries for a large solenoid).

Pulsers for the system may be any of a variety of types. In general, a principal advantage of a pulsed system is that energy can be stored locally over a time long compared to the pulse length, then can be switched into the low-duty-cycle magnet. This minimizes the requirements for high wall-plug power. Pulse lengths will depend on the state of the art of imagers and the specific application. FDA limits rates of change of magnetic fields on patients to 2 T/s. Currents that have on-times of a few seconds may be best supplied by rotating machinery such as homopolar generators or storage systems such as rechargeable batteries. Short pulses may be supplied by capacitor banks.

Figure 20:
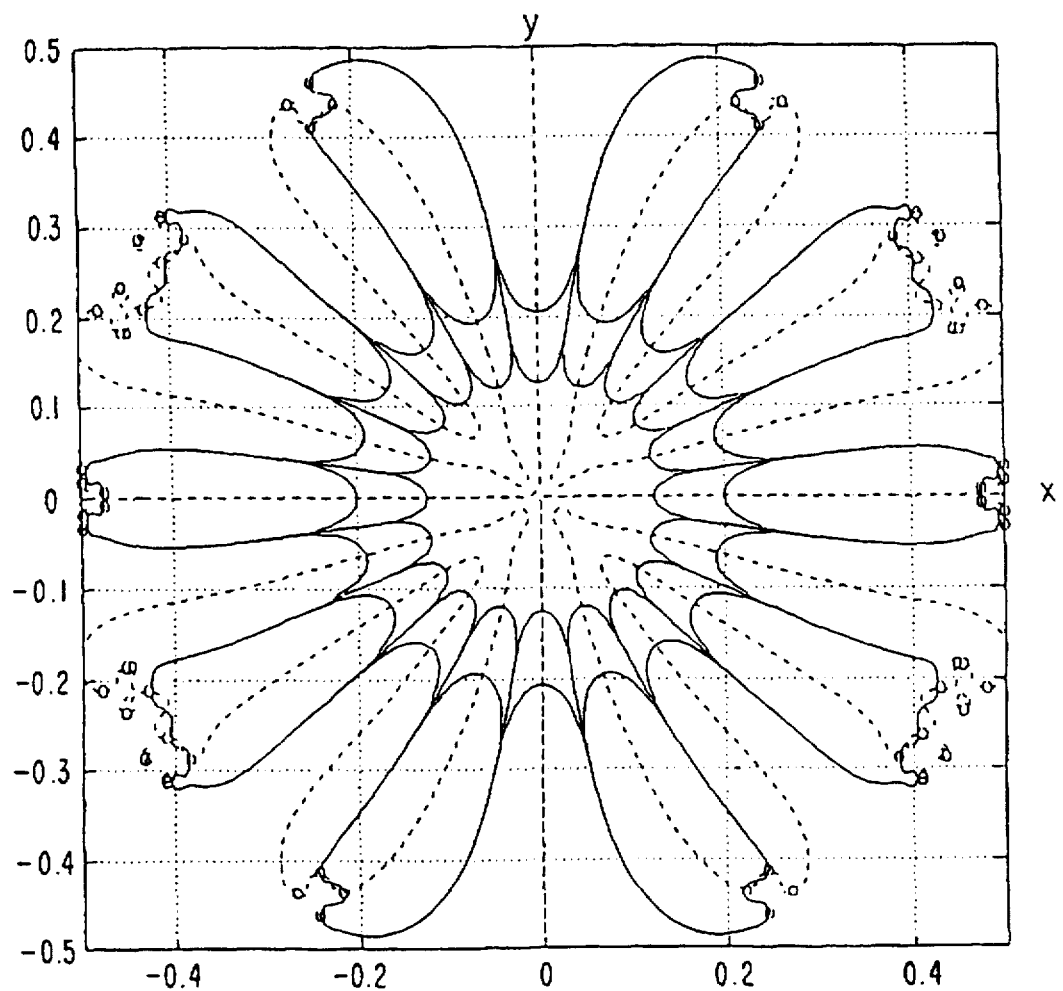
FIG. 20 shows the 16-wire optimum case of FIG. 8 with each wire separated into four wires grouped around the original wire positions, showing negligible perturbation of the 1 PPM contour (the two contours are 1 PPM and 100 PPM)

The calculation of the fields generated by the various embodiments of the present invention was done assuming perfectly located wires and filamentary currents. An examination of the effect of finite wire size was made by doing calculations in which each wire was split into four wires clustered about the location of the original single wire, with the wires each being displaced by the same distance in the x and y coordinates. The field was then calculated. The result was a very small effect on the accuracy of the field for reasonable displacements. An example is shown in FIG. 20, where each of the four wires in a set were separated into groups with diameters of 10% of the system radius. The $B_y$ fractional error contours are at 1 PPM and 100 PPM. Comparison of the 1 PPM contour with the same contour in the unperturbed case of FIG. 8 shows negligible perturbation of the 1 PPM contour by the simulated large finite-size wire. Splitting the conducting paths into several is useful in configurations where two wires in a set are very close together, such that it is impossible to locate wires of the needed wire diameter (for sufficient current capacity) at their proper locations. The wires may be split into a sets of four or more, grouped around the proper centroid, leaving room inside the group for the other wire or wires.

A computer routine may be written that introduces a random error in the simulated location of each filamentary current in a wire set, so the effect of manufacturing inaccuracies can be evaluated. To a first approximation, one would expect that it would be necessary to locate t he wires to an accuracy of 10 parts per million to achieve a field accuracy of 10 PPM. However, if the wire errors are random, the randomness aids by averaging out errors. In the 16-wire case, a wire location accuracy of about 100 PPM was needed for 20 PPM field uniformity in the useful center region. This is about 2 thousandth of an inch in a full body scale MRI without trimming coils. This is a reasonable level of accuracy. Wire location errors that are systematic and not random may introduce no field uniformity errors. For example, if the wire angles are correct, but the radius is incorrect, the field magnitude will change, but the uniformity will not be affected. If the wire angles are all shifted by the same rotation, the field will be rotated, but the uniformity will be unaffected.

A wire may also be split into a plurality of wires at low current surrounding a central wire carrying the primary current. By adjusting the currents in the surrounding wires, a device according to the present invention may be tuned. Depending on the magnitudes of the small surrounding currents, the centroid of the field produced by the wire se t is altered. By manipulating the currents, the apparent location of the wire is modified.

The preferred embodiment described above is a dipole magnet. It preferably has wires in each quadrant located at exactly the same angles as those in all other quadrants. The system is therefore mirror-symmetric about both the x and y axes, but the currents in the wires at negative x have the opposite sense as those with positive x. This produces a B field in the y direction having very high uniformity.

Figure 30:
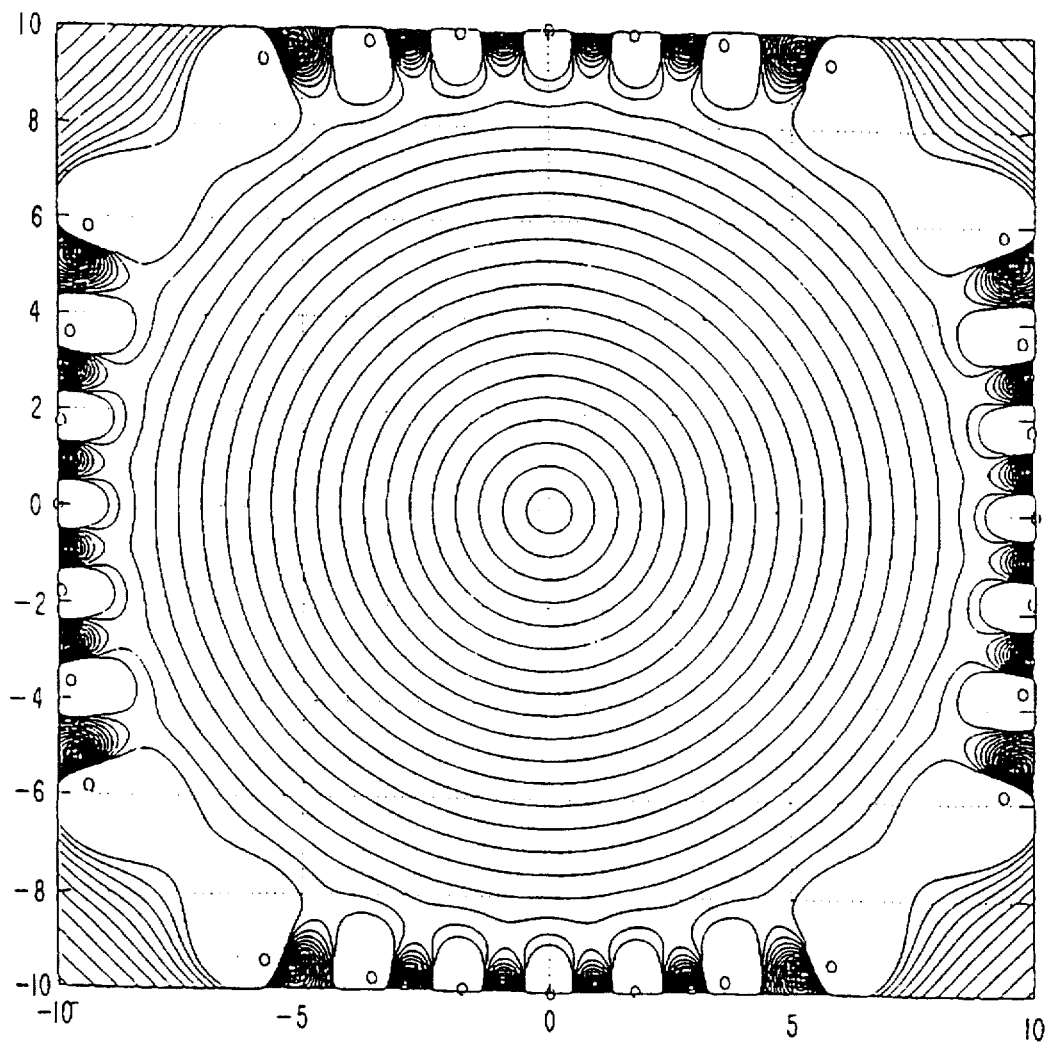
FIG. 30 shows, for the general solution method for a 28-wire quadrupole, contours of constant magnitude of B for the optimal solution.
Figure 31:
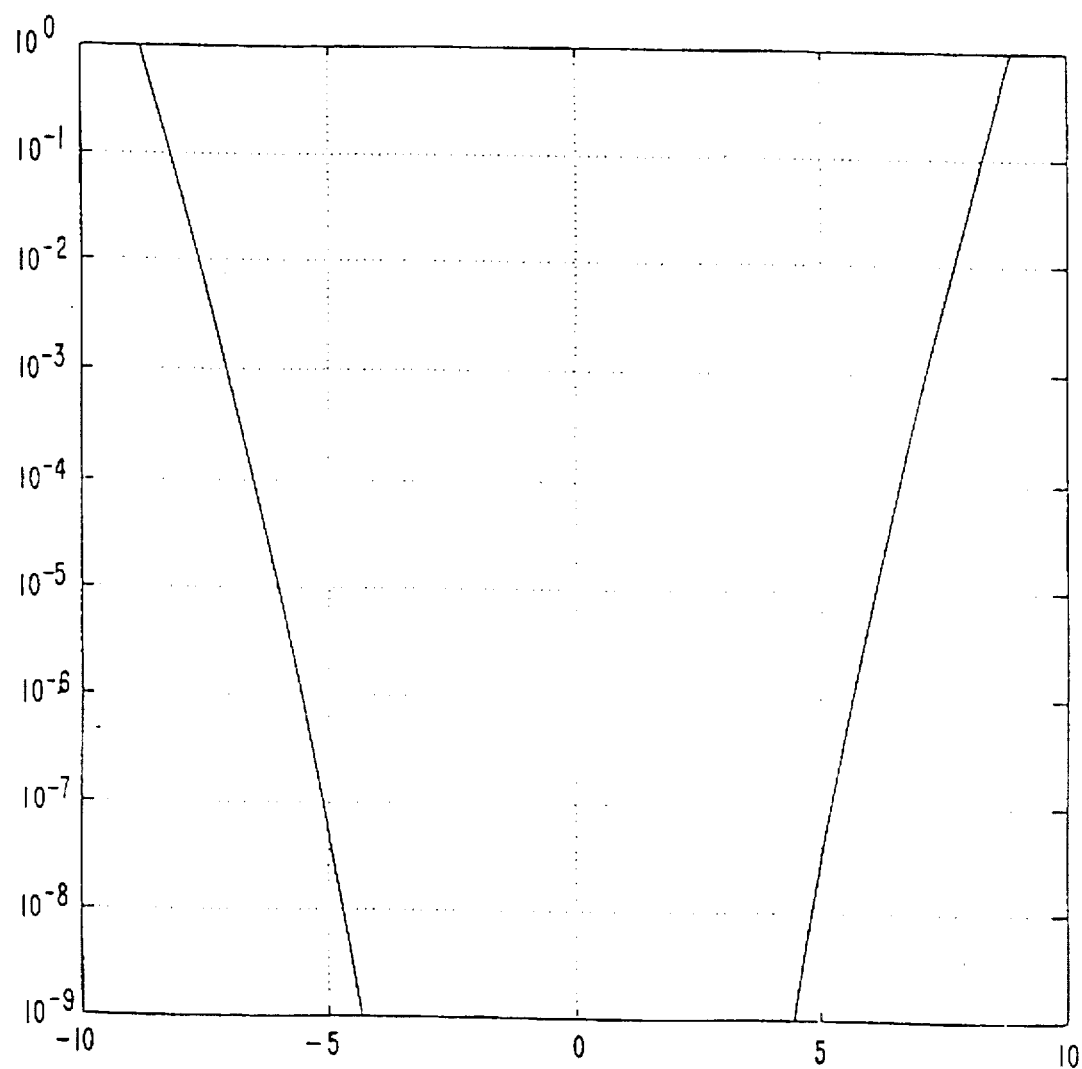
FIG. 31 shows the logarithm of the error in radial gradient taken along the x-axis for the case of FIG. 30.

The present invention is also of a quadrupole magnet for generating a large volume of very high uniformity of the gradient of B. That is, the increase of the magnitude of the magnetic field with increasing radius (distance from the center of the wire circle) is highly linear. In a perfect quadrupole, the increase in field magnitude with radius is perfectly linear. For the general case of quadrupoles, an analysis similar to that for dipoles (involving the magnitude of B, rather than $B_x$) produces the following equations that are solved to obtain fields with uniform radial gradients:

$$I_n \cos[(4j+2)\emptyset_n]/R_n^{4j+2} + I_{n-1}\cos[(4j+2)\emptyset_{n-1}]/R_{n-1}^{4j+2} + \ldots +$$
$$I_1 \cos[(4j+2)\emptyset_1]/R_1^{4j+2} + w = 0$$
$$I_n \cos[(4j-2)\emptyset_n]/R_n^{4j-2} + I_{n-1}\cos[(4j-2)\emptyset_{n-1}]/R_{n-1}^{4j-2} + \ldots +$$
$$I_1 \cos[(4j-2)\emptyset_1]/R_1^{4j-2} + w = 0$$
$$I_n \cos[(4j-4)\emptyset_n]/R_n^{4j-4} + I_{n-1}\cos[(4j-4)\emptyset_{n-1}]/R_{n-1}^{4j-4} + \ldots +$$
$$I_1 \cos[(4j-4)\emptyset_1]/R_1^{4j-4} + w = 0$$

$$\vdots$$

$$I_n \cos(10\emptyset_n)/R_n^{10} + I_{n-1}\cos(10\emptyset_{n-1})/R_{n-1}^{10} + \ldots + I_1 \cos(10\emptyset_1)/R_1^{10} + w = 0$$
$$I_n \cos(6\emptyset_n)/R_n^{6} + I_{n-1}\cos(6\emptyset_{n-1})/R_{n-1}^{6} + \ldots + I_1 \cos(6\emptyset_1)/R_1^{6} + w = 0,$$

where all variables have the same meaning as in the dipole case, and w again takes the value of 0.5 if there is a wire on the x-axis, and 0.0 otherwise. In the quadrupole cases, there are four basic sectors in the wire circle, with currents alternating in direction in adjacent sectors. As in the dipole case, solution of the above equations produces the locations and currents of the wires in the half-sector (45°) above the primary reflection plane (x-axis). Reflection across the x-axis with no current change creates the basic 90° quadrupole sector unit. The next reflection is of all the wires in this 90° sector across the first secondary reflection plane at 45° with a change in the current direction, which creates the second sector. This sector is reflected across the next secondary reflection plane at 135° with a current change to produce the third sector, and reflected again to complete the quadrupole. This process is illustrated in FIG. 35. The result is a quadrupole with optimum characteristics (highly uniform radial gradient). FIG. 30 shows contours of constant magnitude of B for a 28-wire quadrupole, and FIG. 31 shows the logarithm of the error in the radial gradient taken along the x-axis.

Figure 21:
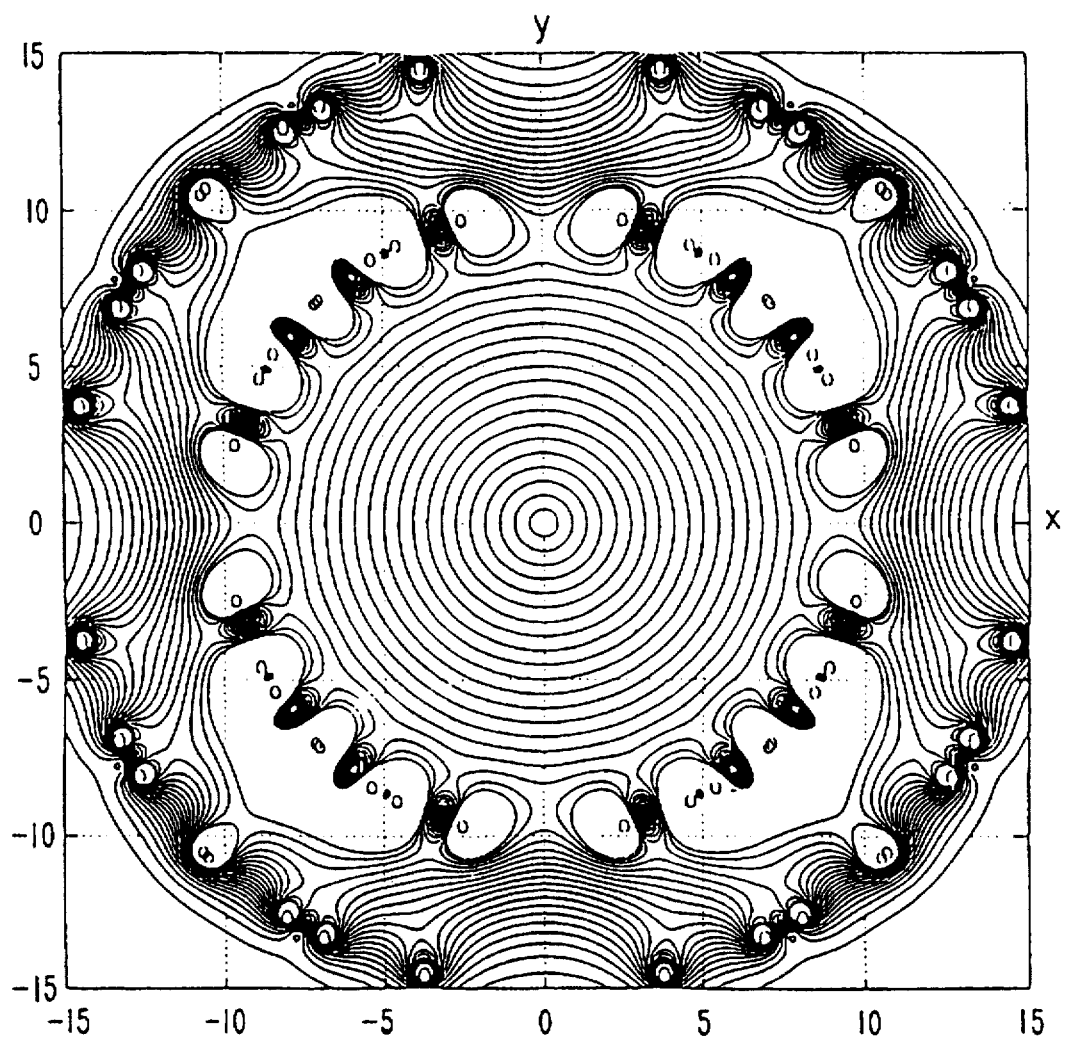
FIG. 21 shows the contours of constant B magnitude (not field lines) generated by a 32-wire quadrupole embodiment of the present invention with field cancellation coils (the uniform spacing of circular contours in the interior demonstrates the constant radial gradient)

FIG. 21 shows the contours of constant B magnitude (not field lines) generated by a circular 32-wire quadrupole. The uniform spacing of circular contours in the interior demonstrates the constant radial gradient. The figure also shows the field cancellation coils that may be applied to the quadrupole system. Referring to FIG. 21, external field cancellation in the circular quadrupole embodiment operates in a manner similar to that preferred for the dipole embodiment. An outer set of wires (preferably loops) are placed at the same angular locations as the main (inner) set, and an opposite current applied (i.e., the current in each wire in the field-cancellation set is opposite in sense to the wire at the same azimuthal position in the main set). The magnitude of the current in each wire is the current in the main set times the square of the ratio of the inner and outer set radii. Therefore, if there is 1 kA in each wire in the inner set which is at a radius of 1, the current in each wire of the field cancellation set at a radius of 2 will be 250 kA. This is similar to the dipole embodiment except that in that case it is the ratio of the radii, and here the square of the ratio of the radii. The field falls off even more rapidly than in the dipole case for any given number of wires, which is understandable because the primary field in the quadrupole begins at a higher order.

The present invention is also of sextupole and higher magnetic and electric multipoles. In a quadrupole magnet, the radial gradient (first derivative with respect to the radius) of the field magnitude is ideally constant. In the sextupole magnet, the second radial derivative of the field magnitude is ideally constant. In the octupole magnet, the third radial derivative of the field magnitude is ideally constant, and so on for higher orders. In the sextupole configurations of the present invention, large fractions of the cross-sectional area contained within the wire perimeter have highly uniform second radial derivatives of the field magnitude. Similarly, in the octupole configurations of the present invention, large fractions of the cross-sectional area contained within the wire perimeter have highly uniform third radial derivatives of the field magnitude, and so on for higher order magnets. The equations for sextupole and higher order multipoles are similar to those for dipoles and quadrupoles, and the equations for all orders can be compactly expressed with a slight change of notation:

$$\begin{array}{c} J \\ C \\ j=1 \end{array} \left\{ w + \sum_{n=1}^{N} I_n \cos[(2j+1)m\varnothing_n]/R_n^{(2j+1)m} = 0 \right\},$$

where C is a collection of J equations to be solved, all identical except that the running index j changes from 1 to J from equation to equation, Σ is the sum of N terms in each equation over the index n. m is a parameter equal to 1 for dipoles, 2 for quadrupoles, 3 for sextupoles, etc., and I, Ø, R and w have the same meanings as before.

As a simple example, consider a 16-wire quadrupole, which will have two wires in the primary half-sector, and no wire on the x-axis. Then w=0, m=2, N=2, and J=2(N+w)−1=3, so there are 3 equations to be solved. Using the above formula, $I_2 \cos(14\varnothing_2)/R_2^{14} + I_1\cos(14\varnothing_1)/R_1^{14} = 0$ $I_2 \cos(10\varnothing_2)/R_2^{10} + I_1\cos(10\varnothing_1)/R_1^{10} = 0$ $I_2 \cos(6\varnothing_2)/R_2^{6} + I_1\cos(6\varnothing_1)/R_1^{6} = 0,$ where n is 2 in the first term of each equation, decreasing to 1 in the second term, and j is the maximum value of J=3 in the first equation, decreasing to 2 in the second and 1 in the third. There are six free parameters in this set of equations, the currents, radii, and angles, which must be reduced to three, since J=3. R1 and I1 can be immediately normalized to 1, and one of the other parameters can be chosen to be a particular value. A useful choice is to set $I_2$=1, and determine $R_2$, $\varnothing_2$ and $\varnothing_1$ by solving the equation set.

Examination of the dependence of terms on m in the above compact equation set shows that a solution obtained for a dipole case can be transformed to a quadrupole configuration by dividing the dipole wire angles $\varnothing_n$ by 2, and taking the square root of the dipole radii to obtain the quadrupole radii. The current remains unchanged in the transformation, since it does not depend on m. If the dipole solution was an optimum case, the quadrupole obtained by transformation will also be optimum. Higher order multipoles can be obtained by similar transformations, for sextupoles from dipoles by dividing the angles by three and taking the cube roots of the radii, etc.

The ferromagnetic and conducting shield methods described above for the general uniform field (dipole) configurations can also be applied to the quadrupole and higher multipole cases. The equations to be solved for the ferromagnetic shield in the quadrupole case are:

$$I_n\cos[(4j+2)\varnothing_n](1 + R_n^{8j+4}/R_s^{8j+4})/R_n^{4j+2} +$$
$$I_{n-1}\cos[(4j+2)\varnothing_{n-1}](1 + R_{n-1}^{8j+4}/R_s^{8j+4})/R_{n-1}^{4j+2} + \ldots +$$
$$I_1\cos[(4j+2)\varnothing_1](1 + R_1^{8j+4}/R_s^{8j+4})/R_1^{4j+2} +$$
$$wI_0(1 + R_0^{8j+4}/R_s^{8j+4})/R_0^{4j+2} = 0$$

$$I_n\cos[(4j-2)\varnothing_n](1 + R_n^{8j-4}/R_s^{8j-4})/R_n^{4j-2} +$$
$$I_{n-1}\cos[(4j-2)\varnothing_{n-1}](1 + R_{n-1}^{8j-4}/R_s^{8j-4})/R_{n-1}^{4j-2} + \ldots +$$
$$I_1\cos[(4j-2)\varnothing_1](1 + R_1^{8j-4}/R_s^{8j-4})/R_1^{4j-2} +$$
$$wI_0(1 + R_0^{8j-4}/R_s^{8j-4})/R_0^{4j-2} = 0$$

$$I_n\cos[(4j-4)\varnothing_n](1 + R_n^{8j-8}/R_s^{8j-8})/R_n^{4j-4} +$$
$$I_{n-1}\cos[(4j-4)\varnothing_{n-1}](1 + R_{n-1}^{8j-8}/R_s^{8j-8})/R_{n-1}^{4j-4} + \ldots +$$
$$I_1\cos[(4j-4)\varnothing_1](1 + R_1^{8j-8}/R_s^{8j-8})/R_1^{4j-4} +$$
$$wI_0(1 + R_0^{8j-8}/R_s^{8j-8})/R_0^{4j-4} = 0$$

.
.
.

$$I_n\cos(10\varnothing_n)(1 + R_n^{20}/R_s^{20})/R_n^{10} +$$
$$I_{n-1}\cos(10\varnothing_{n-1})(1 + R_{n-1}^{20}/R_s^{20})/R_{n-1}^{10} + \ldots +$$
$$I_1\cos(10\varnothing_1)(1 + R_1^{20}/R_s^{20})/R_1^{10} + wI_0(1 + R_0^{20}/R_s^{20})/R_0^{10} = 0$$

$$I_n\cos(6\varnothing_n)(1 + R_n^{12}/R_s^{12})/R_n^{6} +$$
$$I_{n-1}\cos(6\varnothing_{n-1})(1 + R_{n-1}^{12}/R_s^{12})/R_{n-1}^{6} + \ldots +$$
$$I_1\cos(6\varnothing_1)(1 + R_1^{12}/R_s^{12})/R_1^{6} + wI_0(1 + R_0^{12}/R_s^{12})/R_0^{6} = 0,$$

where all terms have the same meaning as in the dipole case. The quadrupole conducting shield systems are solutions to similar equations, the difference again being in the sign change in the terms in the shield radius:

$$I_n\cos[(4j+2)\varnothing_n](1 - R_n^{8j+4}/R_s^{8j+4})/R_n^{4j+2} +$$
$$I_{n-1}\cos[(4j+2)\varnothing_{n-1}](1 - R_{n-1}^{8j+4}/R_s^{8j+4})/R_{n-1}^{4j+2} + \ldots +$$
$$I_1\cos[(4j+2)\varnothing_1](1 - R_1^{8j+4}/R_s^{8j+4})/R_1^{4j+2} +$$
$$wI_0(1 - R_0^{8j+4}/R_s^{8j+4})/R_0^{4j+2} = 0$$

$$I_n\cos[(4j-2)\varnothing_n](1 - R_n^{8j-4}/R_s^{8j-4})/R_n^{4j-2} +$$
$$I_{n-1}\cos[(4j-2)\varnothing_{n-1}](1 - R_{n-1}^{8j-4}/R_s^{8j-4})/R_{n-1}^{4j-2} + \ldots +$$
$$I_1\cos[(4j-2)\varnothing_1](1 - R_1^{8j-4}/R_s^{8j-4})/R_1^{4j-2} +$$
$$wI_0(1 - R_0^{8j-4}/R_s^{8j-4})/R_0^{4j-2} = 0$$

$$I_n\cos[(4j-4)\varnothing_n](1 - R_n^{8j-8}/R_s^{8j-8})/R_n^{4j-4} +$$
$$I_{n-1}\cos[(4j-4)\varnothing_{n-1}](1 - R_{n-1}^{8j-8}/R_s^{8j-8})/R_{n-1}^{4j-4} + \ldots +$$
$$I_1\cos[(4j-4)\varnothing_1](1 - R_1^{8j-8}/R_s^{8j-8})/R_1^{4j-4} +$$
$$wI_0(1 - R_0^{8j-8}/R_s^{8j-8})/R_0^{4j-4} = 0$$

.
.
.

$$I_n\cos(10\varnothing_n)(1 - R_n^{20}/R_s^{20})/R_n^{10} +$$
$$I_{n-1}\cos(10\varnothing_{n-1})(1 - R_{n-1}^{20}/R_s^{20})/R_{n-1}^{10} + \ldots +$$
$$I_1\cos(10\varnothing_1)(1 - R_1^{20}/R_s^{20})/R_1^{10} + wI_0(1 - R_0^{20}/R_s^{20})/R_0^{10} = 0$$

$$I_n\cos(6\varnothing_n)(1 - R_n^{12}/R_s^{12})/R_n^{6} +$$
$$I_{n-1}\cos(6\varnothing_{n-1})(1 - R_{n-1}^{12}/R_s^{12})/R_{n-1}^{6} + \ldots +$$
$$I_1\cos(6\varnothing_1)(1 - R_1^{12}/R_s^{12})/R_1^{6} + wI_0(1 - R_0^{12}/R_s^{12})/R_0^{6} = 0,$$

where the terms again have the same meaning as in the dipole case.

The cases with circular shields can be expressed in the same compact notation as the unshielded cases:

$$\left. \begin{array}{l} \sum_{j=1}^{J} \left\{ w[1 \pm (R_0/R_s)^{2(2j+1)m}]/R_0^{(2j+1)m} + \right. \\ \left. \sum_{n=1}^{N} I_n \cos[(2j+1)m\emptyset_n][1 \pm (R_n/R_s)^{2(2j+1)m}]/R_n^{(2j+1)m} = 0 \right\} , \end{array} \right.$$

where all variables have the same meaning as in the compact form of the general unshielded case, $R_0$ is the radius to the wire on the x-axis, $R_s$ is the shield radius, the upper (+) signs in the new terms are chosen for the ferromagnetic shield cases, and the lower (−) signs chosen for the conducting shield cases.

The external field cancellation method described above for circular dipole and quadrupole systems also applies to the sextupole configuration, with the current in the field cancellation conductors being proportional to the cube of the ratio of the radii of the main field and field cancellation conductor circles. In the octupole configuration, the current in the field cancellation conductors is proportional to the fourth power of the inner and outer wire circle radii, and so on with higher multipoles. As with the quadrupole, the field cancellation is increasingly effective with higher order multipoles.

The magnetic quadrupole and sextupole embodiments of the invention are useful in focusing systems for charged particle beams. An ideal quadrupole field has the x component of B equal to some constant k times y (the local y coordinate), so $B_x=ky$, and $B_y=kx$, and the ideal sextupole has $B_x=ky^2$, and $B_y=kx^2$, and so on for higher multipoles. The quadrupole and higher multipole systems of the present invention come quite close to this ideal over a large fraction of the core region, and so are an efficient beam focuser. The useful cross-sectional area of the present invention is a much larger fraction of the total device area than is the case for existing multipole magnets. The open geometry offers advantages over the most commonly used iron core magnets in access for beam diagnostics. The low inductance allows high-speed pulsing to high fields and gradients for pulsed beam applications. For systems not requiring open access, the present invention in quadrupole and higher multipole forms can be surrounded by a ferromagnetic shield without degrading the field characteristics, just as in the dipole case. The invention in its electric quadrupole form is also useful for focusing charged particle beams in a fashion exactly analogous to the magnetic quadrupole version.

The concept of the invention of duplicating the dipole system, turning the duplicate conductive pathway set 90° about the long axis of the system, combining it with the original set and driving the first and second sets with currents in quadrature (sine and cosine time dependence) to produce a rotating field system can be extended to the quadrupole and higher multipole versions. In the quadrupole versions the system is duplicated and the duplicate rotated only 45°, and the two parts are driven in quadrature to produce a field configuration that rotates in time. The field configurations rotates at half the rate of the dipole rotating field system if driven with currents of the same frequency as the dipole system, while maintaining the uniformity of the radial gradient of the field magnitude. Similarly, the sextupole system can be duplicated, turned 30°, and fed with quadrature currents to produce a system whose magnetic field configuration rotates about the origin at a rate one-third that of the dipole rotation rate.

Quadrupole magnets are generally used in pairs for focusing charged particle beams. In passing through a quadrupole magnet along the magnet axis, a charged particle beam sees a focusing force in two opposite quadrants (e.g., quadrants 1 and 3), and a weaker defocusing force in the other two quadrants. If the beam is then passed through a second quadrupole magnet that is rotated 90° to the first, the parts of the beam that were defocused are now focused, and the parts that were focused are somewhat defocused. The net result is overall focusing. If the quadrupole field is rotated at a rate that is fast compared to a beam transit time through the magnet, the net effect is focusing in a single magnet, instead of the two or more now needed.

Another application of the quadrupole invention in both its electric and magnetic forms is separation of components of fluids. An electric dipole consists of two equal-magnitude charges of opposite sign separated by a small distance. The electric dipole moment is defined as the charge separation distance times the magnitude of one of the charges. An electric dipole in a constant electric field does not feel any net force, because both the positive and negative charges feel the same force, but in opposite directions. The dipole does feel a torque, however, that tends to align the dipole with the electric field. If there are no competing effects, a very small field will align a dipole with the field. If there are thermal effects, the aligning electric field competes with the randomizing effect of the thermal collisions, and then stronger electric fields result in a stronger (average) dipole alignment with the applied electric field.

If the electric field has a gradient, for example becomes weaker farther from a source or charge, then there is a translational force on a dipole in the field since the end of the dipole in the weaker field sees less force than the end in the stronger field. This applies to the extent that the dipole is aligned with the electric field. If the randomizing effects of thermal collisions are much stronger than the effect of the field in aligning the dipole, the average force will be near zero. The net result is that the net time-average force tending to move a dipole in a real (at some temperature) medium is a function of the applied field strength as well as the applied field gradient.

All the above arguments apply equally well to magnetic fields and dipoles. A magnetic dipole can be thought of as a small current loop, or conceptually as two small magnetic charges separated by a small distance, with all the above discussion applying. The magnetic charges, unlike electric charges, are purely conceptual, since no magnetic monopole has been isolated.

Dipoles can be induced or permanent. An example of a permanent magnetic dipole is a bar magnet or bit of magnetized iron. Any ferromagnetic material (iron, nickel, and others) in a magnetic field responds by developing an induced dipole moment, and it is this dipole that is attracted to the source of the field, which, again, must have a gradient for any net force to be produced.

A dielectric (nonconductor) placed in an electric field develops dipole moments that reduce the electric field in the material from that existing outside. The stronger this effect (stronger induced dipoles), the higher the dielectric constant of the material. If an isolated conductor is placed in an electric field, free charges will move in the conductor in such a way as to cancel the electric field in the conductor; this results in an induced dipole on the conductor. If the electric field has a gradient, the dielectric and the conductor will feel a net torque tending to align the dipole with the field and a net force in the direction of the gradient. If the dipole is perfectly aligned with the field, the net force on the dipole depends only on the strength of the gradient, not on the magnitude of the field. This is true even if the direction of the field and the direction of the gradient of the field are not the same.

The quadrupole versions of the present invention can use this effect to separate components of fluids or gases. For example, water has a dielectric constant of about 80, and oil about 3. A much larger dipole will be induced in a droplet of water than one of oil. If a small amount of water is dispersed in oil and an electric field gradient applied, the water will move in the direction of the gradient. This can be used to separate water from oil (or other liquids, such as gasoline; water in gasoline is a serious contaminant). How rapidly the water droplet moves in the oil is a function of the size of the droplet (larger is larger force), oil viscosity, Reynolds number, electric field strength (for induced dipoles) and strength of the field gradient.

Note that the electric quadrupole uses a very small amount of power since there is essentially no current flow. There must be some energy transfer to the medium since the entropy of the mixture is decreased by this process. A permanent-magnet quadrupole would also be feasible, but would have to be periodically cleaned, since the ferromagnetic contamination would not settle out.

Figure 22:
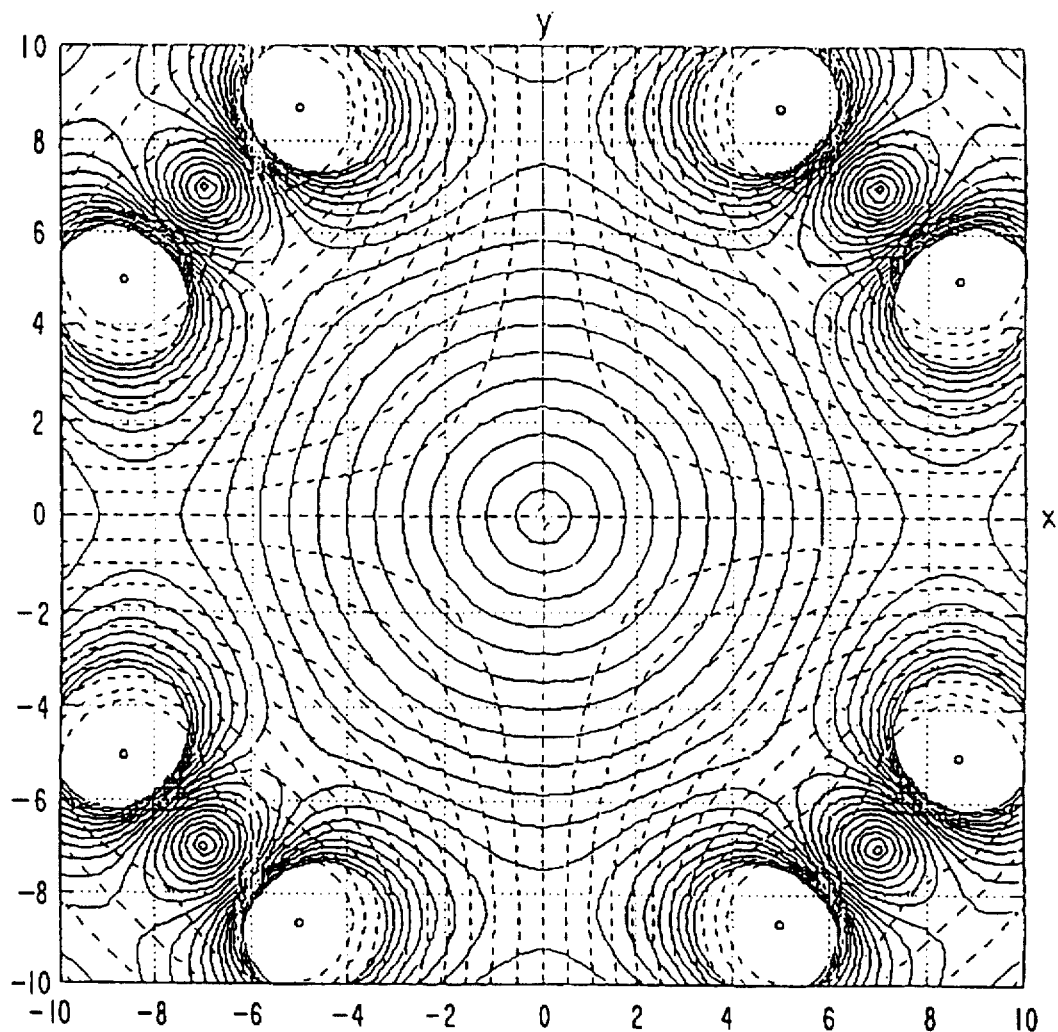
FIG. 22 shows, in the embodiment of FIG. 21, the contours of constant magnitude of B (solid lines) indicating that the gradient is radially outward (field is zero at the center), and B-field lines (dashed lines) showing that, in general, the gradient is not parallel to the field lines in the present invention.
Figure 23:
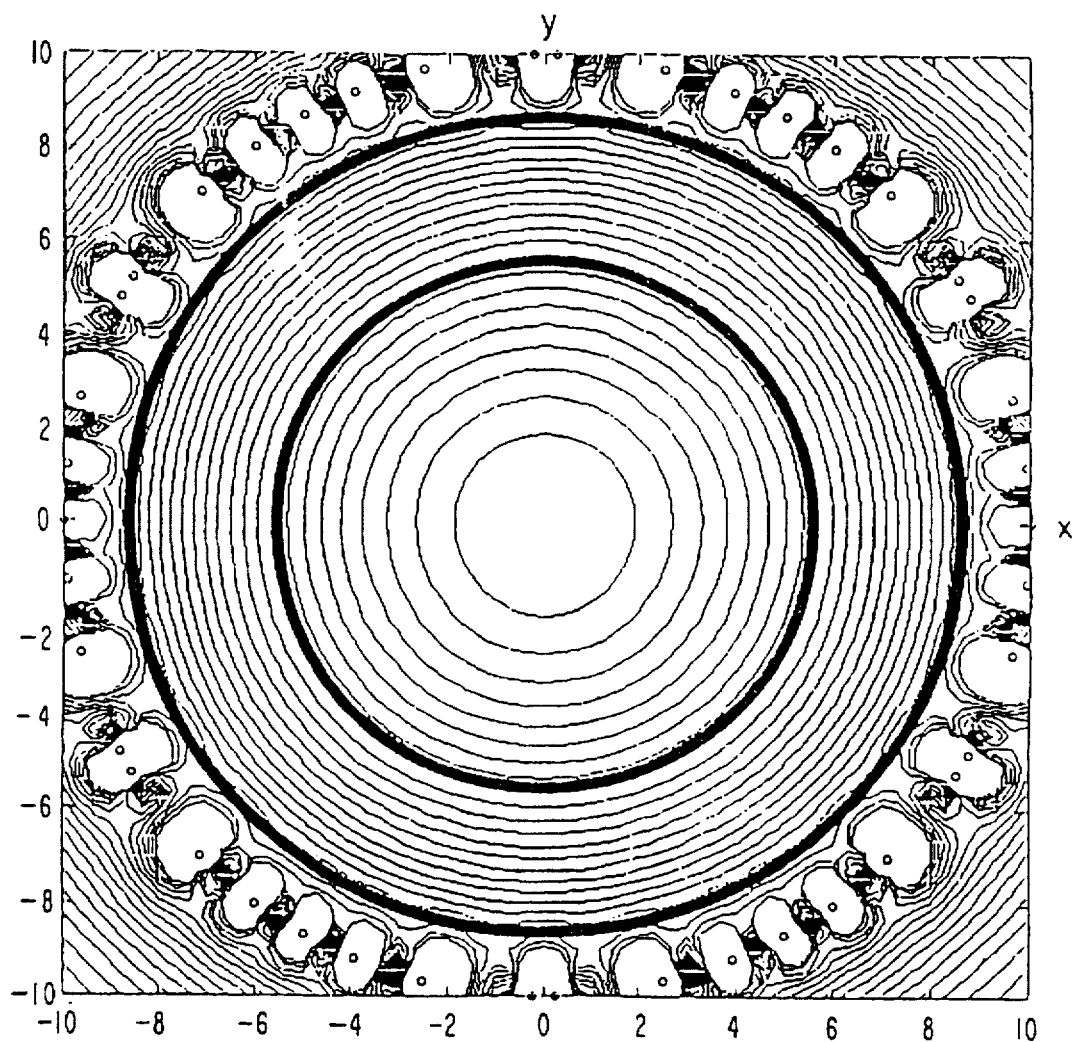
FIG. 23 shows a double cylinder (dark shaded circles) used to confine fluid to be separated to the high field, high gradient, large radii regions of the separator applications of the present invention (embodiment shown is a 42-wire optimum sextupole)

Note that many of the applications of the invention stress the production of highly uniform fields and gradients. These separation processes do not require high uniformity. In fact, another way to produce a large electric field gradient is with a single wire surrounded by a coaxial conducting cylinder, in the same configuration as the coaxial cable used for radio and television, but, of course, with open space between the conductors. This coaxial system produces a very high field and gradient near the wire, but the field and gradient fall off rapidly with radius so the useful area of high gradient is small. In the single-wire-coaxial configuration, the field and gradient are parallel, with the gradient radially inward. Another configuration that would produce large local gradients (near the wires) is a matrix (square, hexagonal, or some other pattern) of parallel fine wires with opposite potentials applied to nearest-neighbor wires. Again, the high fields and gradients are in a relatively small volume near the wires. The present invention in its quadrupole configurations produces a uniform gradient throughout the cylindrical volume, with a field that is zero on the long axis (coordinate origin in the cross-section), whose gradient is radially outward, with uniformity dependent on radius and the number of wires employed in the system. The field is not generally parallel to the gradient as shown in FIG. 22 with contours of constant magnitude of B delineated by solid lines, and B-field lines by dashed lines. The field is zero at the origin, and the evenly spaced circles of magnitude of B about the origin show that the gradient of B is uniform and radially outward over a large fraction of the area, even in this simple 8-wire quadrupole illustration (compare with FIG. 21). The present invention has more useful volume in the same size system than single-wire-coaxial or wire matrix systems. The higher order multipoles (sextupoles and above) concentrate the field and gradients even more toward the larger radius, larger area regions of the system. In a fluid or gas separation application, the effectiveness of the system would be enhanced in the present invention by directing the fluid to these outer radius regions by using a double cylinder that excludes fluid from the small radius regions as illustrated in FIG. 23, which shows a 42-wire sextupole (wires indicated by small circles) with lines of B-magnitude plotted. The two thin-wall cylinders, shown shaded, would restrict flow to the high field, high gradient region between them.

The effect is not restricted to liquids, but could also be used in gas streams, as electrostatic scrubbers are used now. These presently used devices remove particles in the gas stream with electric fields applied to induced static charges on the contaminants, but do not depend on a gradient-dipole process.

Electric gradients produce pressures in dielectric fluids. This is useful in the separation process to move components around. Electrostatic pumps may be based on this principle. There are also forces on liquid drops in air (or in other gases), which is useful for dehumidification.

The invention may also be applied on a molecular level, because water, for example, is a highly polar molecule. This provides a way to separate water and alcohol, having application in both synthetic fuel and liquor industries. However, the force on a dipole depends on its dipole moment, which is small for individual molecules. If the energy associated with the dipole in the field is much less than the thermal energy of the molecule, there will be little motion of the molecule in the direction of the field gradient. Methods for applying large fields and gradients, preferably pulsed to minimize electrical breakdown, must be employed.

The invention is further of two-dimensional uniform fields and multipoles of line currents determined using azimuthal harmonic decomposition. This aspect of the invention is as follows:

Two-dimensional magnetic and electric fields are produced by currents or charges that have no spatial dependence in one direction. Two-dimensional fields of line currents can be expanded about the origin of the coordinate system in a Taylor's series in the radial coordinate r and the resultant equations in conductor locations and currents can be solved to optimize desired field characteristics. The field characteristics considered here are the fields generally contained within a system of line currents, for example dipole or higher multipole fields used for charged particle beam guiding, or in magnetic resonance spectroscopy or imaging applications. All of the analysis may be readily applied to fields of electric charges or potentials, as will be understood by one skilled in the art.

The important characteristic of a dipole field in these applications is uniformity of the field magnitude over a large fraction of the interior area of the device. Similarly, an ideal quadrupole has a constant interior radial gradient of the field magnitude that is independent of azimuth, an ideal sextupole has a constant radial second derivative, and so on. A ideal device would also have all of its field contained within the device, and not require shielding to reduce leakage fields. It may, of course, be necessary to shield even such an ideal device to prevent the influence of externally generated fields.

Figure 36:
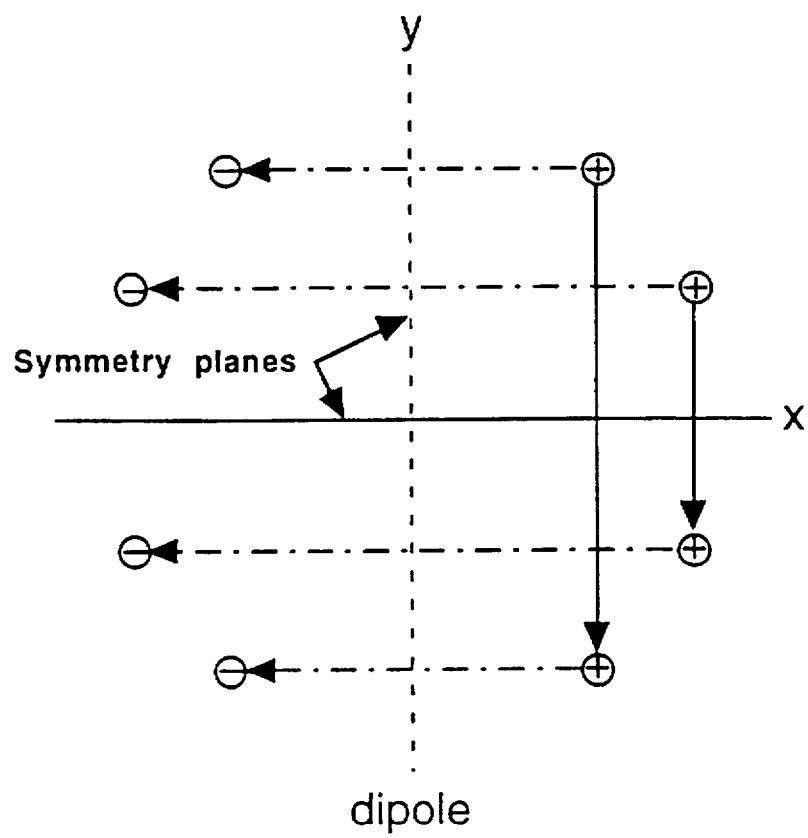
FIG. 36 illustrates the two-plane (x and y axis) symmetry of dipoles constructed employing the simplest methods of the invention.
Figure 37:
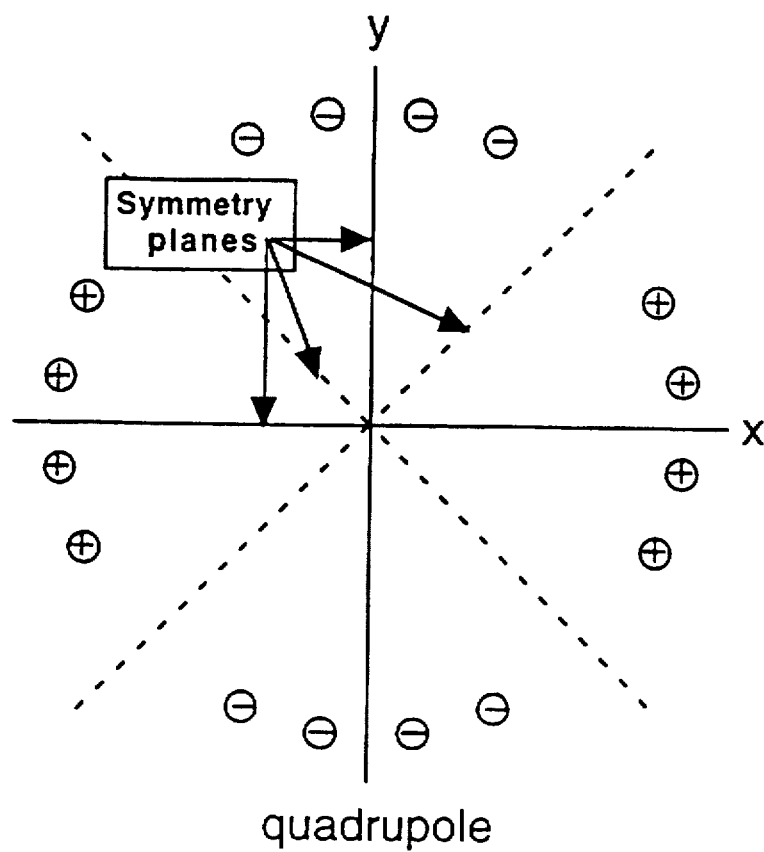
FIG. 37 illustrates the four-plane symmetry of quadrupoles constructed employing the simplest methods of the invention.

As described above and in patent applications Ser. Nos. 08/328,849 and 08/455,819, two-dimensional magnetic dipoles are constructable of current-carrying conductors that lie on a cylinder parallel to a common axis, with conductor locations symmetric about two perpendicular planes, most simply the x and y axes. Currents are opposite in direction in reflection about one plane, as shown in FIG. 36. The preferred dipoles have uniform field magnitude over as large an interior area as possible. The external field decreases with distance approximately as $r^{-2}$. The most straightforward quadrupoles of the invention have conductor-location symmetry about four planes, with current direction changing in reflection about two planes, as indicated in FIG. 37, with the external field decreasing with distance approximately as $r^{-3}$.

Deviations from optimum in these fields are often described in terms of multipole components, for example by sextupole or octupole components of a desired quadrupole field geometry. These field errors can arise because of inherent limitations in the use of a finite number of conductors, limitations in design methods, or errors in the mechanical location in assembly because of realities of construction and the need to make compromises for shielding, support, access, or other requirements.

The following analysis expands the field of a set of line currents in a Taylor series about the origin and derives sets of equations in powers of r and in related azimuthal harmonics that can be solved for conductor locations that optimize the field for desired characteristics, such as uniformity, interior access, or magnet shape.

The present analysis is not restricted to the two-plane symmetry of the most straightforward dipoles of the invention, and can be used to derive single-polarity dipoles, quadrupoles and higher multipoles that have fields with the same uniform interior characteristics as those of the most straightforward symmetric devices of the invention. The invention extends to the exterior of the device, using a coordinate inversion to develop a companion set of equations that allows locations and currents to be determined for the complete wire set that minimizes the external field (active shielding) without perturbing the internal field characteristics. The invention allows a wide choice of initial constraints, such as choice of magnet shape, restrictions on azimuthal wire location for best access, or current distribution among the conductors, while determining the values for the remaining parameters to optimize the field characteristics.

Derivations of wire positions and currents for optimum dipoles with two-plane symmetry and with extensions to higher multipoles was discussed above. These derivations began with the field of four line currents placed to form a simple dipole field. The series expansion of the field is in the radial coordinate r, but it is convenient to express the dipole field in terms of its x and y components. While the goal is optimization of the field magnitude, if the desired field is in the y direction, minimization of $B_x$ will achieve the same result, and the expansion of $B_x$ is much simpler than the expansion of $B_{mag}=(B_x^2+B_y^2)^{1/2}$. The desired field is in the y direction, so the $B_x$ component is an error term to be minimized. The equation for $B_x$ for a four-wire dipole is:

$$B_x = I(r\sin\phi - R\sin\emptyset)/[r^2 + R^2 - 2rR\cos(\phi-\emptyset)] + \quad (1)$$

$$I(r\sin\phi + R\sin\emptyset)/[r^2 + R^2 - 2rR\cos(\phi+\emptyset)] -$$

$$I(r\sin\phi - R\sin\emptyset)/[r^2 + R^2 + 2rR\cos(\phi+\emptyset)] -$$

$$I(r\sin\phi + R\sin\emptyset)/(r^2 + R^2 + 2rR\cos(\phi-\emptyset)),$$

where R and $\emptyset$ are the wire position coordinates, and r and $\phi$ are the field coordinates.

The Taylor series expansion in r about the origin of Eq. 1 contains only even powers in r. With some manipulation, the large number of terms condenses to the following form:

$$B_x=4[(1/R^3)\cos(3\emptyset)\sin(2\phi)r^2+(1/R^5)\cos(5\emptyset)\sin(4\phi)r^4+(1/R^7)\cos(7\emptyset)\sin(6\phi)r^6+\ldots] \quad (2)$$

At a given small radius, the $B_x$ component of the field varies sinusoidally in $\phi$, and these azimuthal harmonics decrease in amplitude with increasing harmonic number. Since the $B_x$ field component is essentially an error component, the best uniformity will be obtained if as many as possible of the lowest harmonics can be set to zero by appropriate choices of the free parameters. The error in the magnitude of B referenced to the origin has the same dependence. In the one-wire-per-quadrant case above, the only free parameter is the wire angle $\emptyset$, since the wire current and radius can be set to 1 without loss of generality. The choice of $\emptyset=30°$ sets the first term to zero for all r and $\phi$, and produces the best field uniformity for the 4-wire case.

For sets of N wires per quadrant, not including wires on the x axis, the dipole field error is by superposition:

$$B_x = 4[(I_1/R_1^3)\cos(3\emptyset_1) + (I_2/R_2^3)\cos(3\emptyset_2) + \ldots + \quad (3)$$

$$(I_N/R_N^3)\cos(3\emptyset_N)]\sin(2\phi)r^2 +$$

$$4[(I_1/R_1^5)\cos(5\emptyset_1) + (I_2/R_2^5)\cos(5\emptyset_2) + \ldots +$$

$$(I_N/R_N^5)\cos(5\emptyset_N)]\sin(4\phi)r^4 +$$

higher order terms of the same form.

This result is in the form of coefficients that depend only on the wire parameters of location and current, multiplying powers of r and azimuthal harmonics in $\phi$. The most uniform field results when as many as possible of the coefficients of the terms in $\sin(n\phi)r^n$ are set to zero by proper choice of the $I_n$, $R_n$, and $\emptyset_n$. This set of equations of the coefficients may be expressed in a compact form by writing:

$$\begin{matrix}J\\C\\j=1\end{matrix}\left\{ 0.5I_0/R_0^{(2j+1)} + \sum_{n=1}^{N} I_n\cos[(2j+1)\emptyset_n]/R_n^{(2j+1)} = 0 \right\} \quad (4)$$

where C indicates a collection of J equations to be solved, and wires on the x axis were most conveniently added by the terms with suffix zero. These equations provide first-quadrant wire coordinates, with others obtained by reflection across the axes.

This set of equations can be solved numerically if constraints are imposed that limit the number of variables to J=T/2−1, where T is the total number of wires in the system. The equations can also be solved for J less than these limits by imposing more constraints, but the resulting fields are less uniform, as shown in examples below. Two examples of two-plane-symmetric dipoles produced by this method are the simple 12-wire set of FIG. 38, and the highly uniform 50-wire set of FIG. 39. These equations can be extended to quadrupoles and higher multipoles with highly uniform appropriate radial derivatives by replacing in the equation sets each wire angle $\emptyset$ by q$\emptyset$ and each exponent (2j+1) by q(2j+1), where q =1 for dipoles, q =2 for quadrupoles, etc. This procedure can be used to convert existing dipole solutions to quadrupoles.

As indicated above, two-plane symmetry is not necessary for high field uniformity over a large area. A new set of dipoles (and higher multipoles) can be produced by eliminating one symmetry plane.

The simplest component of the configurations of interest contains one wire above the x axis at +$\emptyset$, and one below the x axis at −$\emptyset$, with two possible choices of current direction for the wires below the axis.

With both wires having the same current direction, and with the desired dipole field in the y direction, the $B_x$ (i.e., error) component of the field is:

$$B_x=I(r\sin\phi-R\sin\emptyset)/[r^2+R^2-2rR\cos(\phi-\emptyset)]+I(r\sin\phi+R\sin\emptyset)/[r^2+R^2-2rR\cos(\phi+\emptyset)], \quad (5)$$

where r and $\phi$ are the field coordinates, R and $\emptyset$ are the wire coordinates, and I the current in each wire. A Taylor's series expansion of $B_x$ in r for r<1 for N wires above the axis (and N below, by the single reflection), plus a wire on the x axis, produces, after some simplification:

$$B_x(r,\phi) = 2[0.5I_0/R_0^2 + (I_1/R_1^2)\cos(2\phi_1) + (I_2/R_2^2)\cos(2\phi_2) + \ldots + \quad (6)$$
$$(I_N/R_N^2)\cos(2\phi_N)]\sin(\phi)r +$$
$$2[0.5I_0/R_0^3 + (I_1/R_1^3)\cos(3\phi_1) + (I_2/R_2^3)\cos(3\phi_2) + \ldots +$$
$$(I_N/R_N^3)\cos(3\phi_N)]\sin(2\phi)r^2 +$$
$$2[0.5I_0/R_0^4 + (I_1/R_1^4)\cos(4\phi_1) + (I_2/R_2^4)\cos(4\phi_2) + \ldots +$$
$$(I_N/R_N^4)\cos(4\phi_N)]\sin(3\phi)r^3 +$$

higher order terms of the same form.

This result is in the form of coefficients depending only on the wire parameters of location and current, multiplying powers of r and azimuthal harmonics in $\phi$. Again, the most uniform field results when as many as possible of the coefficients of the terms in $\sin(n\phi)r^n$ are set to zero by proper choice of $I_n$, $R_n$, and $\phi_n$. An appropriate number of the wire currents and positions for a given number of wires are determined by solving the simultaneous equation sets of the coefficients. These solutions are for wires above the x axis, and currents and wire positions for wires below the axis are obtained by reflection across the x axis without current change as is implicit in the equation derivation. A wire on the x axis is also duplicated in the reflection, which accounts for the 0.5 multiplier in the first terms of the coefficient of the harmonics.

While there are three parameters per wire (R, $\phi$, and I), the maximum number of free variables (and corresponding number of equations to be solved) is J=T-1, where T is the total number of wires in the system. Note for example the field contours of the 12-wire optimum set shown in FIG. 40, with all currents identical in direction and magnitude. The radius of the wires nearest the axis was set to 0.75, leaving 6 angles and 5 radii to be determined by the simultaneous equation solution of the 11 equations of the coefficients of the harmonic terms through $\sin(11\phi)r^{11}$. Solutions derived using the maximum number of variables for a given number of wires appear to be unique; that is, no other solution exists that will produce equivalent uniformity characteristics. This will be discussed further below.

Figure 38:
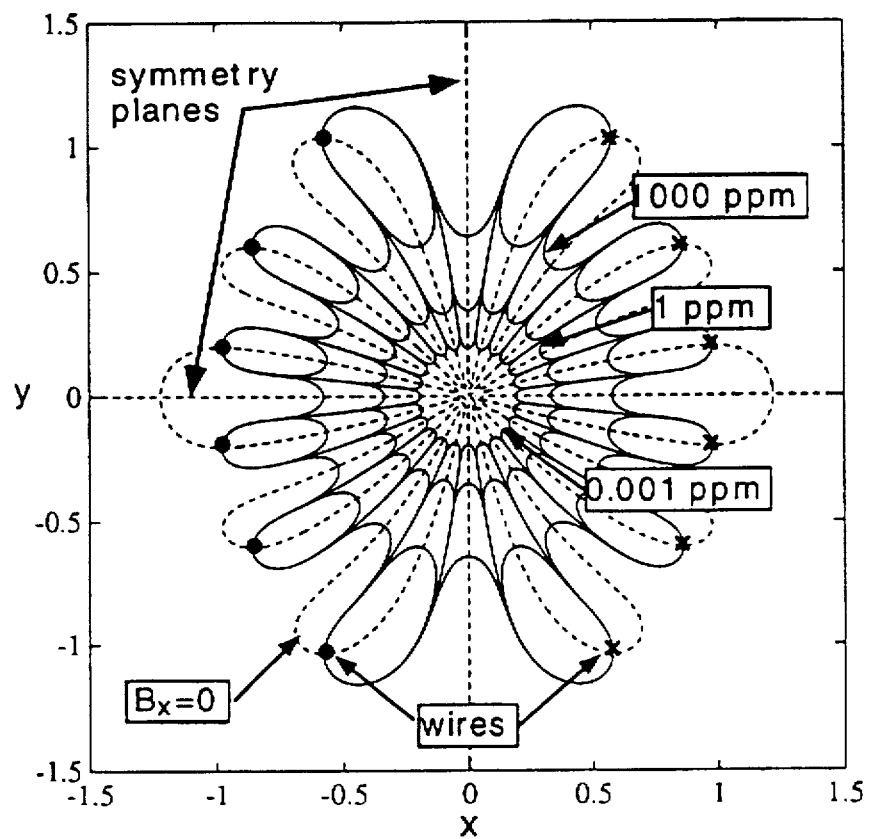
FIG. 38 illustrates a twelve-wire dipole of the invention having two planes of symmetry.
Figure 39:
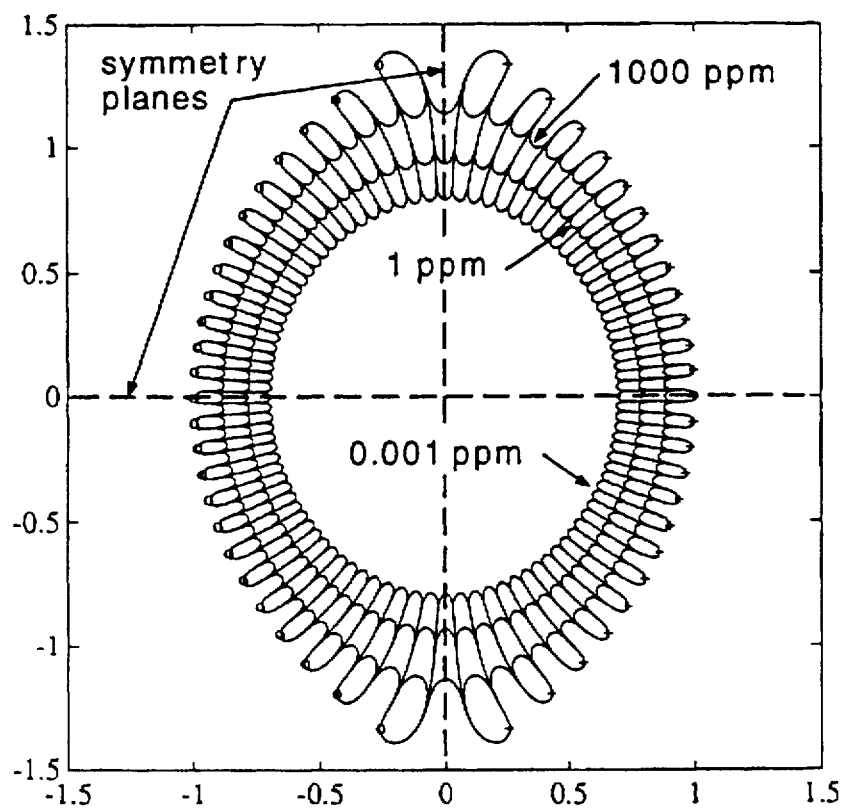
FIG. 39 illustrates a fifty-wire dipole of the invention having two planes of symmetry.

The utility of this configuration compared with conventional dipoles is the wide opening of one side while still maintaining the highly uniform dipole field. The price for this opening is somewhat decreased current efficiency, that is, higher current per wire to produce a given field magnitude at the coordinate origin. The opening can be made even wider by allowing the currents to increase with angle from wire-to-wire and allowing the system to extend farther in the ±y direction. With a more nearly planar magnet, the system will be more useful in measurement, spectroscopy or other sensing applications on objects that cannot be inserted into a system with even minimal confinement. A 12-wire optimum configuration derived from these equations is shown in FIG. 38. The system scale was chosen so the interior area is comparable to that of the single-plane symmetric system of FIG. 40, and it can be seen that the areas of given uniformity in the two systems are similar. This appears to be generally the case; assuming comparable radius scaling, the area of a given uniformity depends only on the smallest non-zero harmonic number.

If the current in the wire below the x axis is negative, the desired field is now in the x direction and the y component is the field error, so the appropriate component to minimize becomes:

$$B_y = I(r\cos\phi - R\cos\phi)/(r^2 + R^2 - 2rR\cos(\phi - \phi)) - I(r\cos\phi + R\cos$$
$$\phi)/[r^2 + R^2 - 2rR\cos(\phi + \phi)]. \quad (7)$$

and the Taylor's expansion in r produces:

$$B_y(r,\phi) = 2[(I_1/R_1^2)\sin(2\phi_1) + (I_2/R_2^2)\sin(2\phi_2) + \ldots + \quad (8)$$
$$(I_N/R_N^2)\sin(2\phi_N)]\sin(\phi)r +$$
$$2[((I_1/R_1^3)\sin(3\phi_1) + (I_2/R_2^3)\sin(3\phi_2) + \ldots +$$
$$(I_N/R_N^3)\sin(3\phi_N)]\sin(2\phi)r^2 +$$
$$2[((I_1/R_1^4)\sin(4\phi_1) + (I_2/R_2^4)\sin(4\phi_2) + \ldots +$$
$$(I_N/R_N^4)\sin(4\phi_N)]\sin(3\phi)r^3 +$$

higher order terms of the same form, which has a form similar to that of Eq. 6 with the substitution of sine for cosine in the harmonic coefficients. The maximum number of variables (and equations) allowed is again J=T-1, where T is the total number of wires in the system.

There are no terms for wires on the x axis in equation 8. Since the current direction changes polarity in the reflection across the x axis, a wire on the x axis would have no net current. There can be wires on the y axis ($\phi=\pi/2$), and in the above equations $\sin(n(\phi=\pi/2))$ will be zero or one, as n is odd or even. This corresponds to the terms for wires on the x axis in equation 6.

Solving these equations for the optimum field uniformities produces configurations that have the two-plane symmetry of the usual dipole configuration. That is, optimum configurations with currents opposite in the two half planes appear to be unique, and these one-plane-symmetry cases revert to the two-plane, with the odd harmonic components being zero by symmetry. Then, if only optimum (best uniformity for a given number of wires) solutions are desired, the odd harmonic terms can be eliminated and a smaller number of equations solved (J=T/2-1 for optimum solutions) for T wires. However, there are an infinite number of overconstrained sub-optimum configurations that can be derived from these equations, many of which have useful geometric characteristics.

Figure 41:
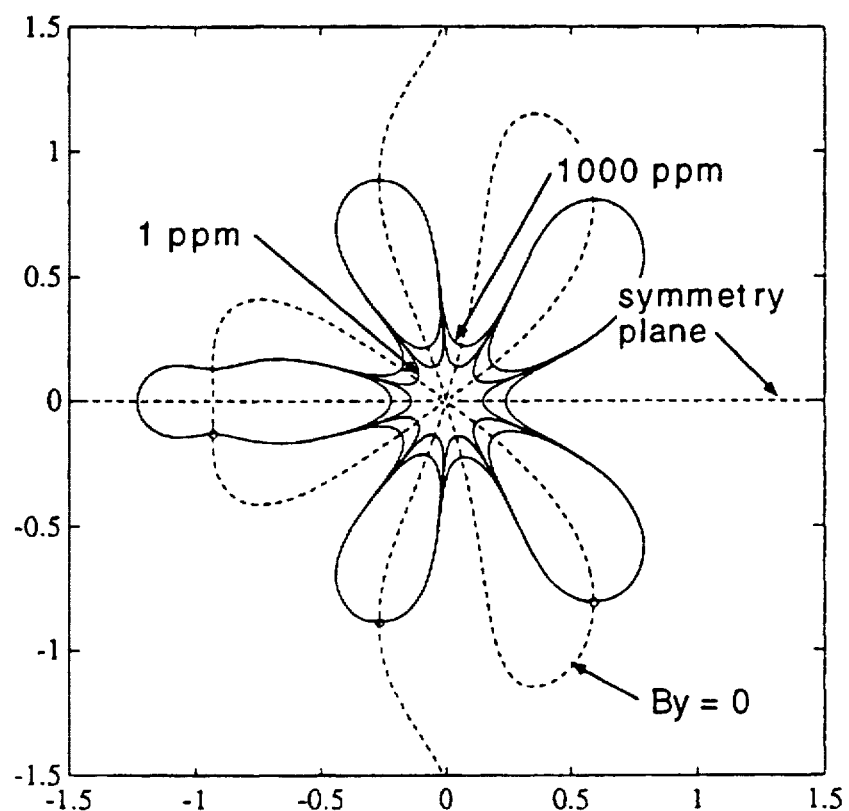
FIG. 41 illustrates an exemplary six-wire suboptimum dipole.

In all cases, sub-optimum solutions can be derived by overconstraining the system, either by assigning values to more variables than necessary for an optimum solution, or by fixing the value of the coefficients of one or more of the higher harmonics. A simple example of this is shown in FIG. 41. The ten $B_x=0$ origin intersections show that the lowest non-zero azimuthal harmonic is $\sin(5\phi)$, while in a 6-wire optimum configuration, the lowest non-zero harmonic would be $\sin(6\phi)$, with correspondingly improved area of uniformity. These sub-optimum configurations can have useful geometric characteristics, particularly in single-plane-symmetric two-current-direction systems.

The coefficient equations to be solved can be put in more compact form by writing:

$$\overset{J}{\underset{j=1}{C}} \left\{ 0.5I_0/R_0^{(j+1)} + \sum_{n=1}^{N} I_n \cos[(j+1)\phi_n]/R_n^{(j+1)} = 0 \right\} \quad (9)$$

$$\overset{J}{\underset{j=1}{C}} \left\{ \sum_{n=1}^{N} I_n \sin[(j+1)\phi_n]/R_n^{(j+1)} = 0 \right\} \quad (10)$$

for the coefficients of Eq. 8, where C indicates a collection of J equations to be solved, and J is defined as above.

Figure 42:
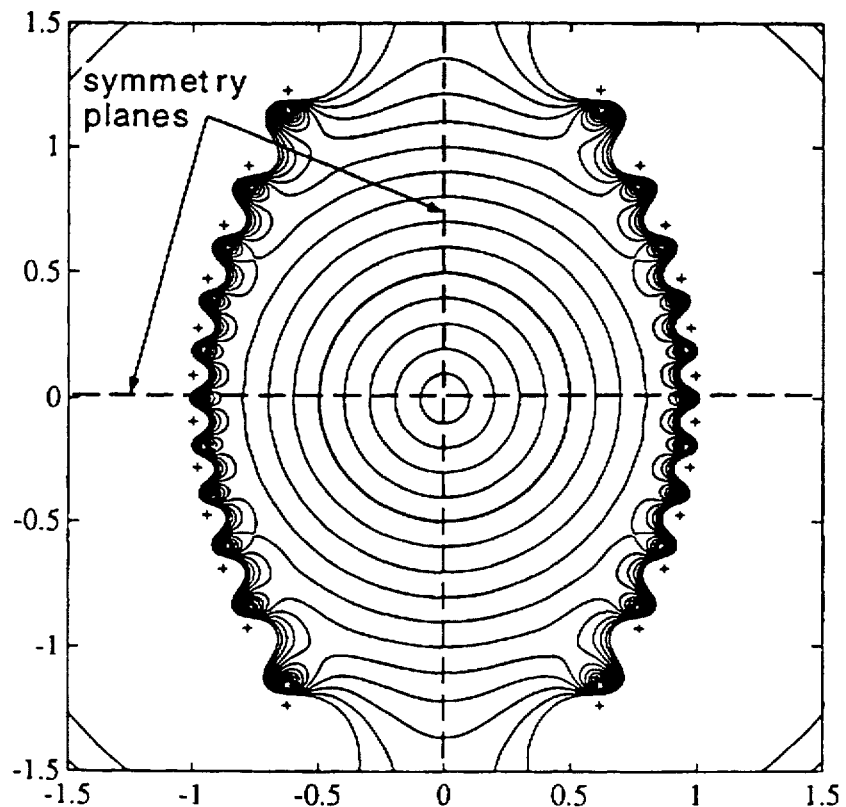
FIG. 42 illustrates a two-plane symmetric 24-wire quadrupole with all currents in the same direction.
Figure 43:
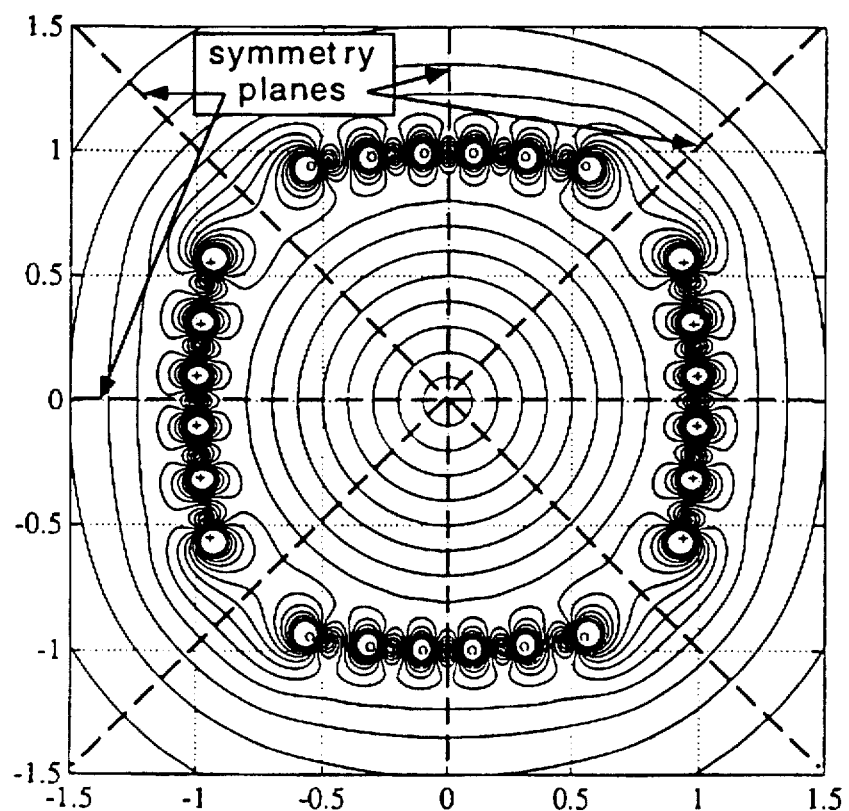
FIG. 43 illustrates a 24-wire four-plane symmetric quadrupole with currents in opposite directions.
Figure 44:
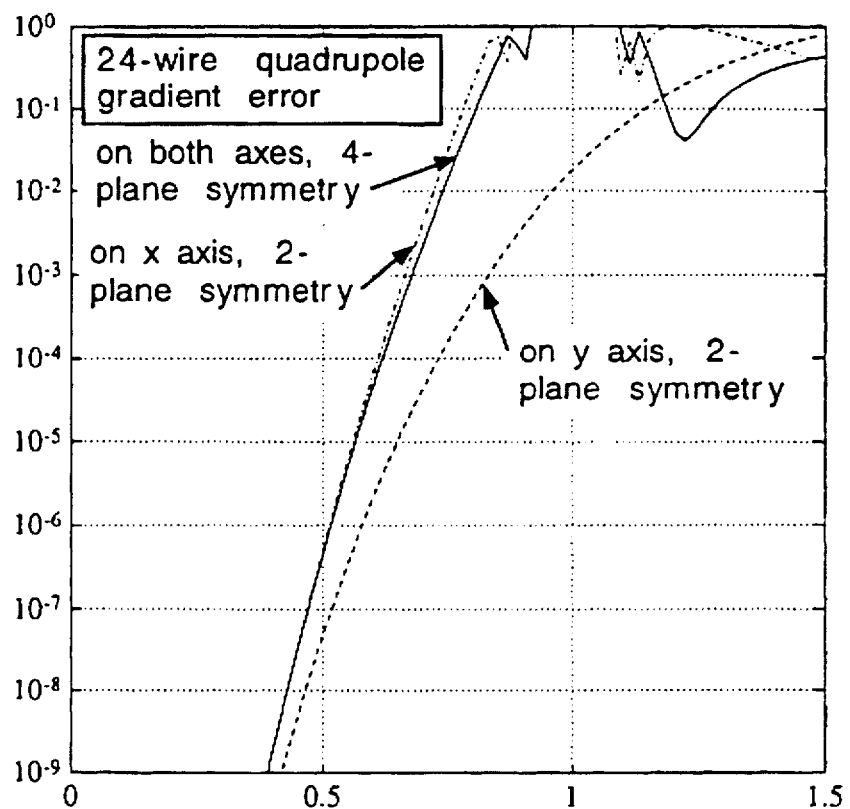
FIG. 44 compares the error in radial gradient on a line along the x axis for the two quadrupoles of FIGS. 42 and 43.

The above single-plane, single-polarity and two-polarity dipole configurations whose expansions contain odd as well as even azimuthal harmonics can be extended to quadrupoles and higher multipoles in the same way as in the two-plane solutions by replacing in the equation sets each wire angle $\emptyset$ by $q\emptyset$ and each exponent $(j+1)$ by $q(j+1)$, where $q=1$ for dipoles, $q=2$ for quadrupoles, etc., producing quadrupoles with two-plane symmetry. This procedure can be used to convert existing dipole solutions to quadrupoles, or to higher multipoles for $q>2$. FIG. 42 is a two-plane symmetric 24-wire quadrupole with all currents in the same direction, derived from the dipole of FIG. 40. A 24-wire four-plane symmetric quadrupole is shown in FIG. 43, and FIG. 44 compares the error in radial gradient on a line along the x axis for the two quadrupoles. The gradient uniformities of the two quadrupoles are very similar, with the advantage of large openings at the top and bottom for access to the core field in the unipolar version. A disadvantage is that the system requires more current than an optimum four-plane symmetric quadrupole.

The compact expressions for higher multipoles derived from single plane symmetric dipoles are then:

$$\sum_{j=1}^{J} \left\{ 0.5I_0/R_0^{q(j+1)} + \sum_{n=1}^{N} I_n \cos[q(j+1)\emptyset_n]/R_n^{q(j+1)} = 0 \right\} \quad (11)$$

$$\sum_{j=1}^{J} \left\{ \sum_{n=1}^{N} I_n \sin[q(j+1)\emptyset_n]/R_n^{q(j+1)} = 0 \right\} \quad (12)$$

for the extension of Eq. 10.

As mentioned above, the more direct approach is to expand the field magnitude as a Taylor's series about the origin, and solve the equation sets of the coefficients to reduce harmonics. This is much more complicated because the magnitude of B is the square root of the sum of the squares of the $B_x$ and $B_y$ components, and the expansions contain many more terms. However, it is worthwhile to determine if there are differences in the results of the two approaches. An expansion for the field magnitude a two-plane-symmetric quadrupole containing 4N wires all with current in the same direction, produces the equations:

$$B_{mag}(r,\emptyset) = 4[(I_1/R_1^2)\sin(2\emptyset_1) + (I_2/R_2^2)\sin(2\emptyset_2) + \ldots + (I_N/R_N^2)\sin(2\emptyset_N)]r + \quad (13)$$
$$4[(I_1/R_1^4)\sin(4\emptyset_1) + (I_2/R_2^4)\sin(4\emptyset_2) + \ldots + (I_N/R_N^4)\sin(4\emptyset_N)]\cos(2\emptyset)r^3 +$$
$$4[(I_1/R_1^6)\sin(6\emptyset_1) + (I_2/R_2^6)\sin(6\emptyset_2) + \ldots + (I_N/R_N^6)\sin(6\emptyset_N)]\cos(4\emptyset)r^5 +$$
higher order terms of the same form.

Since this is intended as a comparison and verification of the derivation for dipoles, the wire-on-axis (suffix-zero) terms have not been included, to minimize the expansion complexity. Note that the first term has no $\emptyset$ dependence and has radial dependence of $r^1$. In a perfect quadrupole, the radial derivative of the magnitude of the field is constant in the field variables r and $\emptyset$. To maximize the uniformity of this quadrupole, the wire locations and currents must be chosen so that the coefficients of the higher order terms (coefficients of cos $(2n)r^{2n+1}$ for $n>0$) are zero. Comparison of these coefficients with the terms of Eq. 11 with $q=2$ shows they are identical, offering some confidence that Eq. 11 produces optimum solutions, and all solutions for the unipolar two-plane-symmetric quadrupoles. Similar analysis for the other configurations (two-plane-symmetric two-current-direction quadrupoles, four-plane-symmetric quadrupoles, etc.) also verifies the derivation of the quadrupoles from the dipole expressions.

Active field cancellation may also be performed in this aspect of the invention. The magnetic field of a collection of current-carrying wires decreases with radial distance for $r>1$ as:

$$B_{mag} = c_1 r^{-1} + c_2 r^{-2} + c_3 r^{-3} + \text{higher order terms}, \quad (14)$$

where the c's are constants that depend on current magnitudes and wire locations. The wires are considered to be located within $r<1$, and the terms in this series decrease in magnitude with increasing powers of r. The first term is dominant for collections with net current, and the first term is zero for zero net current.

The external fields of the collections of currents described by the equations above can be decreased by the addition of currents located so that the $c_n=0$ in Eq. 14. The number of $c_n$ that can be set to zero will depend on the number of wire currents added. Since the added currents will perturb the interior uniform field characteristics, the system must be solved as a whole to maintain interior uniformity while minimizing external fields.

There are now two objectives to be met simultaneously: elimination of as many low-order azimuthal harmonics as possible in the system interior, that is for $r<1$, and a similar goal for $r>1$ (all wires are assumed to be near $r=1$). The first objective is approached as before, using a Taylor's expansion of the superposed $B_x$ components of the fields for small r, including all wires in the system, primary and field canceling. The number of field canceling wires need not be the same as the number of primary field wires.

For active shielding of single-plane-symmetric dipoles with unipolar currents where $r<1$, the field error term to be minimized is $$B_x(r,\emptyset) = 2[0.5I_{0a}/R_{0a}^2 + (I_{1a}/R_{1a}^2)\cos(2\emptyset_{1a}) + (I_{2a}/R_{2a}^2)\cos(2\emptyset_{2a}) + \ldots + \quad (15)$$
$$(I_{Na}/R_{Na}^2)\cos(2\emptyset_{Na}) \ldots -$$
$$0.5I_{0b}/R_{0b}^2 - (I_{1b}/R_{1b}^2)\cos(2\emptyset_{1b}) - (I_{2b}/R_{2b}^2)\cos(2\emptyset_{2b}) - \ldots -$$
$$(I_{Mb}/R_{Mb}^2)\cos(2\emptyset_{Mb})]\sin(\emptyset)r +$$
$$2[0.5I_{0a}/R_{0a}^3 + (I_{1a}/R_{1a}^3)\cos(3\emptyset_{1a}) + (I_{2a}/R_{2a}^3)\cos(3\emptyset_{2a}) + \ldots +$$
$$(I_{Na}/R_{Na}^3)\cos(3\emptyset_{Na}) -$$
$$0.5I_{0b}/R_{0b}^3 - (I_{1b}/R_{1b}^3)\cos(3\emptyset_{1b}) - (I_{2b}/R_{2b}^3)\cos(3\emptyset_{2b}) - \ldots -$$
$$(I_{Mb}/R_{Mb}^3)\cos(3\emptyset_{Mb})]\sin(2\emptyset)r^2 +$$
higher order terms of the same form.

where the a suffix refers to the primary wires, and the b suffix to the field canceling wires, N the number of primary wires above the x axis and M the number of field canceling wires above the x axis. The solution process includes the currents below the x axis by reflection. All currents are considered positive, hence the negative signs in the field canceling terms.

The second set of equations, in the azimuthal harmonics for $r>1$, can be derived by substituting $1/p$ for r in Eq. 1 and simplifying:

$$B_x = I(p \sin \emptyset - p^2 R \sin \emptyset)/[1 + p^2 R^2 - 2pR\cos(\emptyset - \emptyset)]. \quad (16)$$

A Taylor series expansion of this equation in p about $p=0$ for a superposition of all wires in the system produces a set of equations with a form similar to Eq. 16:

$$B_x(p,\emptyset) = 2[(0.5I_{0a} + I_{1a} + I_{2a} + \ldots + I_{Na} - 0.5I_{0b} - I_{1b} - I_{2b} - \ldots - I_{Mb})\sin(\emptyset)p + 2[0.5I_{0a}R_{0a} + (I_{1a}R_{1a})\cos(\emptyset_{1a}) + (I_{2a}R_{2a})\cos(\emptyset_{2a}) + \ldots + (I_{Na}R_{Na})\cos(\emptyset_{Na}) - 0.5I_{0b}R_{0b} - (I_{1b}R_{1b})\cos(\emptyset_{1b}) - (I_{2b}R_{2b})\cos(\emptyset_{2b}) - \ldots - (I_{Mb}/R_{Mb})\cos(\emptyset_{Mb})]\sin(2\emptyset)p^2 +$$

higher order terms of the same form.

(17)

To determine the locations and currents for the N primary wires and M field canceling wires for the best interior uniformity and most rapid exterior field decrease with radius, the equations of the coefficients of $\sin(n\emptyset)r^n$ and $\sin(n\emptyset)p^n$ must be simultaneously solved. The equations of the coefficients can be put in the compact form by writing:

$$\frac{J_p}{C} \left\{ 0.5[I_{0a}/R_{0a}^{(j+1)} - I_{0b}/R_{0b}^{(j+1)}] + \sum_{n=1}^{N} I_{na}\cos[(j+1)\emptyset_{na}]/R_{na}^{(j+1)} - \sum_{m=1}^{M} I_{mb}\cos[(j+1)\emptyset_{mb}]/R_{mb}^{(j+1)} = 0 \right\},$$

(18)

and $$\frac{J_s}{C} \left\{ 0.5[I_{0a}R_{0a}^{(j-1)} - I_{0b}R_{0b}^{(j-1)}] + \sum_{n=1}^{N} I_{na}\cos[(j-1)\emptyset_{na}]R_{na}^{(j+1)} - \sum_{m=1}^{M} I_{mb}\cos[(j-1)\emptyset_{mb}]R_{mb}^{(j-1)} = 0 \right\},$$

(19)

where $J_p = T_p - 1$ with $T_p$ being the total number of primary wires, and $J_s = T_s$ with $T_s$ the total number of secondary or field canceling wires.

Figure 40:
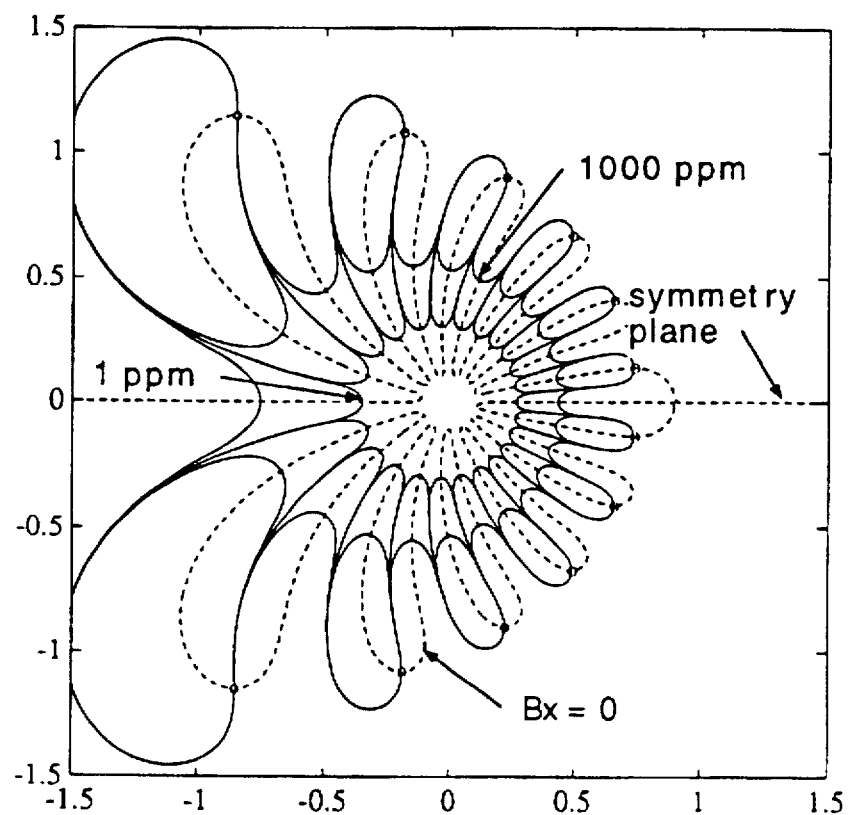
FIG. 40 illustrates a twelve-wire dipole of the invention having only a single plane of symmetry, with currents in the same direction and of identical magnitude and providing a large side-access opening to the area of high field uniformity.
Figure 45:
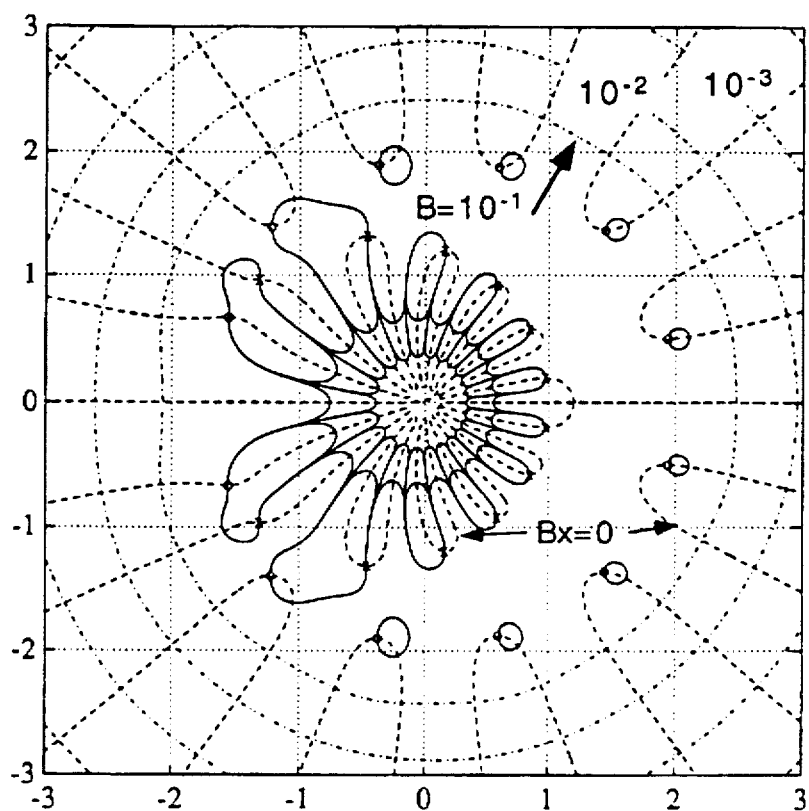
FIG. 45 illustrates 12-wire active shielding applied to a 12-wire dipole similar to that of FIG. 40.

An example is shown in FIG. 45, with 12-wire active shielding applied to a 12-wire dipole similar to that of FIG. 40. Comparison with FIG. 40 shows the modification of the locations of the primary wires that occurs when the field canceling wires are used if field uniformity is maintained. The currents in the field canceling wires are identical in magnitude to the currents in the primary wires, providing a convenient current return path.

A similar analysis for the one-plane-symmetric, two-current-direction case in $B_y$ (which is now the error term to be minimized) produces:

$$B_y(r,\emptyset) = 2[(I_{1a}/R_{1a}^2)\sin(2\emptyset_{1a}) + (I_{2a}/R_{2a}^2)\sin(2\emptyset_{2a}) + \ldots + (I_{Na}/R_{Na}^2)\sin(2\emptyset_{Na}) \ldots - (I_{1b}/R_{1b}^2)\sin(2\emptyset_{1b}) - (I_{2b}/R_{2b}^2)\sin(2\emptyset_{2b}) - \ldots - (I_{Mb}/R_{Mb}^2)\sin(2\emptyset_{Mb})]\sin(\emptyset)r + 2[(I_{1a}/R_{1a}^3)\sin(3\emptyset_{1a}) + (I_{2a}/R_{2a}^3)\sin(3\emptyset_{2a}) + \ldots + (I_{Na}/R_{Na}^3)\sin(3\emptyset_{Na}) \ldots - (I_{1b}/R_{1b}^3)\sin(3\emptyset_{1b}) - (I_{2b}/R_{2b}^3)\sin(3\emptyset_{2b}) - \ldots - (I_{Mb}/R_{Mb}^3)\sin(3\emptyset_{Mb})]\sin(2\emptyset)r^2 +$$

higher order terms of the same form, (20)

-continued $$B_y(p,\emptyset) = 2[(I_{1a}R_{1a})\sin(\emptyset_{1a}) + (I_{2a}R_{2a})\sin(\emptyset_{2a}) + \ldots + (I_{Na}R_{Na})\sin(\emptyset_{Na}) \ldots - (I_{1b}R_{1b})\sin(\emptyset_{1b}) - (I_{2b}R_{2b})\sin(\emptyset_{2b}) - \ldots - (I_{Mb}/R_{Mb})\sin(\emptyset_{Mb})]\sin(2\emptyset)p^2 + 2[(I_{1a}R_{1a}^2)\sin(2\emptyset_{1a}) + (I_{2a}R_{2a}^2)\sin(2\emptyset_{2a}) + \ldots + (I_{Na}R_{Na}^2)\sin(2\emptyset_{Na}) \ldots - (I_{1b}R_{1b}^2)\sin(2\emptyset_{1b}) - (I_{2b}R_{2b}^2)\sin(2\emptyset_{2b}) - \ldots - (I_{Mb}/R_{Mb}^2)\sin(2\emptyset_{Mb})]\sin(3\emptyset)p^3 +$$

higher order terms of the same form.

(21)

As in Eq. 8 there are no terms for wires on the x axis in Eqs. 20 and 21. These equations may be put in the compact format as follows:

$$\frac{J_p}{C} \left\{ \sum_{n=1}^{N} I_{na}\sin[(j+1)\emptyset_{na}]/R_{na}^{(j+1)} - \sum_{m=1}^{M} I_{mb}\sin[(j+1)\emptyset_{mb}]/R_{mb}^{(j+1)} = 0 \right\},$$

(22)

and $$\frac{J_s}{C} \left\{ \sum_{n=1}^{N} I_{na}\sin[(j-1)\emptyset_{na}]R_{na}^{(j-1)} - \sum_{m=1}^{M} I_{mb}\sin[(j-1)\emptyset_{mb}]R_{mb}^{(j-1)} = 0 \right\},$$

(23)

with summation parameters being defined as before.

Derivation and solution of the equations for active external field reduction for two-plane-symmetric dipoles follows the same process, and produces equations similar to Eqs. 22 and 23, with the odd harmonic terms being eliminated by the system symmetry. The new equations for the coefficients are:

$$\frac{J_p}{C} \left\{ \sum_{n=1}^{N} I_{na}\sin[(2j+1)\emptyset_{na}]/R_{na}^{(2j+1)} - \sum_{m=1}^{M} I_{mb}\sin[(2j+1)\emptyset_{mb}]R_{mb}^{(2j+1)} = 0 \right\},$$

(24)

and $$\frac{J_s}{C} \left\{ \sum_{n=1}^{N} I_{na}\sin[(2j-1)\emptyset_{na}]R_{na}^{(2j-1)} - \sum_{m=1}^{M} I_{mb}\sin[(2j-1)\emptyset_{mb}]R_{mb}^{(2j-1)} = 0 \right\},$$

Figure 46:
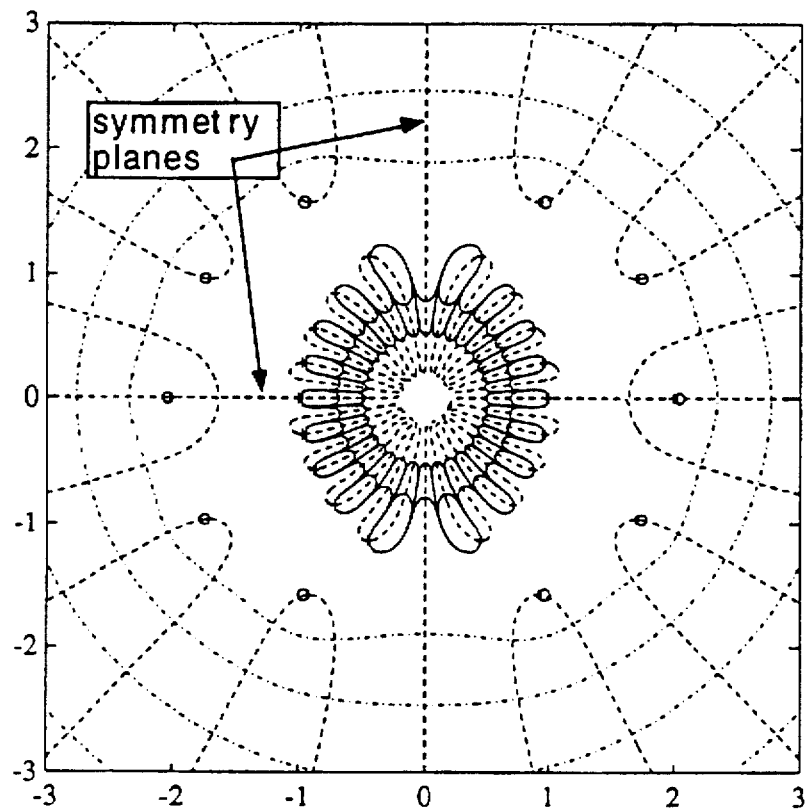
FIG. 46 illustrates active shielding for a case where N≠M with an 18-wire dipole and ten external field reduction currents.

(25)

where the collection limits are now defined as $J_p = T_p/2 - 1$ with $T_p$ being the total number of primary wires, and $J_s = T_s/2$ with $T_s$ the total number of secondary or field canceling wires. Equations from these two collections must be simultaneously solved given the number of primary and field canceling wires in the system. FIG. 46 shows an example of a case where N≠M with an 18-wire dipole with ten external field reduction currents.

The extension of the equations in the coefficients to multipoles for external field reductions follows the same pattern as in Eqs. 11 and 12 with the replacement of each angle $\emptyset$ by $q\emptyset$ and each exponent $(j\pm 1)$ by $q(j\pm 1)$, where $q=1$ for dipoles, 2 for quadrupoles, etc., so that Eqs. 18 and 19 extended to multipoles become:

$$\frac{J_p}{C}\left\{ 0.5[I_{0a}/R_{0a}^{q(j+1)} - I_{0b}/R_{0b}^{q(j+1)}] + \sum_{n=1}^{N} I_{nc}\cos[(j+1)q\emptyset_{nc}]/R_{nc}^{q(j+1)} - \right.$$

$$\left. \sum_{m=1}^{M} I_{mb}\cos[(j+1)q\emptyset_{mb}]/R_{mb}^{q(j+1)} = 0 \right\}, \quad (26)$$

and $$\frac{J_s}{C}\left\{ 0.5[I_{0a}R_{0a}^{q(j-1)} - I_{0b}R_{0b}^{q(j-1)}] + \sum_{n=1}^{N} I_{nc}\cos[q(j-1)\emptyset_{nc}]R_{nc}^{q(j-1)} - \right.$$

$$\left. \sum_{m=1}^{M} I_{mb}\cos[(j-1)q\emptyset_{mb}]R_{mb}^{q(j-1)} = 0 \right\}, \quad (27)$$

and Equations 22 and 23 become:

$$\frac{J_p}{C}\left\{ \sum_{n=1}^{N} I_{nc}\sin[(j+1)q\emptyset_{nc}]/R_{nc}^{q(j+1)} - \right.$$

$$\left. \sum_{m=1}^{M} I_{mb}\sin[(j+1)q\emptyset_{mb}]/R_{mb}^{q(j+1)} = 0 \right\}, \quad (28)$$

and $$\frac{J_s}{C}\left\{ \sum_{n=1}^{N} I_{nc}\sin[(j-1)q\emptyset_{nc}]R_{nc}^{q(j-1)} - \right.$$

$$\left. \sum_{m=1}^{M} I_{mb}\sin[(j-1)q\emptyset_{mb}]R_{mb}^{q(j-1)} = 0 \right\}, \quad (29)$$

and Equations 26 and 27 become:

$$\frac{J_p}{C}\left\{ 0.5[I_{0a}/R_{0a}^{q(2j+1)} + I_{0b}/R_{0b}^{q(2j+1)}] + \sum_{n=1}^{N} I_{nc}\cos[(2j+1)q\emptyset_{nc}]/R_{nc}^{q(2j+1)} - \right.$$

$$\left. \sum_{m=1}^{M} I_{mb}\cos[(2j+1)q\emptyset_{mb}]/R_{mb}^{q(2j+1)} = 0 \right\} \quad (30)$$

and $$\frac{J_s}{C}\left\{ 0.5[I_{0a}R_{0a}^{q(2j-1)} + I_{0b}R_{0b}^{q(2j-1)}] + \sum_{n=1}^{N} I_{nc}\cos[(2j-1)q\emptyset_{nc}]R_{nc}^{q(2j-1)} - \right.$$

$$\left. \sum_{m=1}^{M} I_{mb}\cos[(2j-1)q\emptyset_{mb}]R_{mb}^{q(2j-1)} = 0 \right\}. \quad (31)$$

Figure 47:
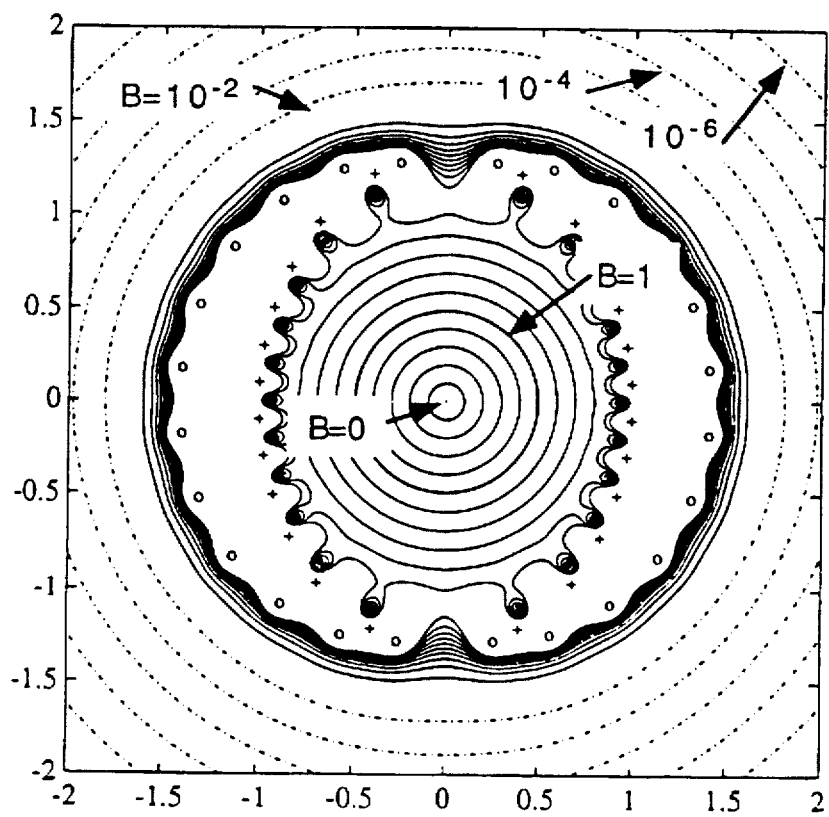
FIG. 47 shows contours of constant magnitude of B for a 24-wire, two-plane symmetric, single polarity current quadrupole derived from the 12-wire actively shielded single-polarity dipole.

FIG. 47 shows contours of constant magnitude of B for a 24-wire, two-plane symmetric quadrupole derived from the 12-wire actively shielded single-polarity dipole, using Eqs. 26 and 27. All primary currents are in the same direction and are identical, and all canceling currents are in the opposite direction and are equal to the primary currents.

Figure 48:
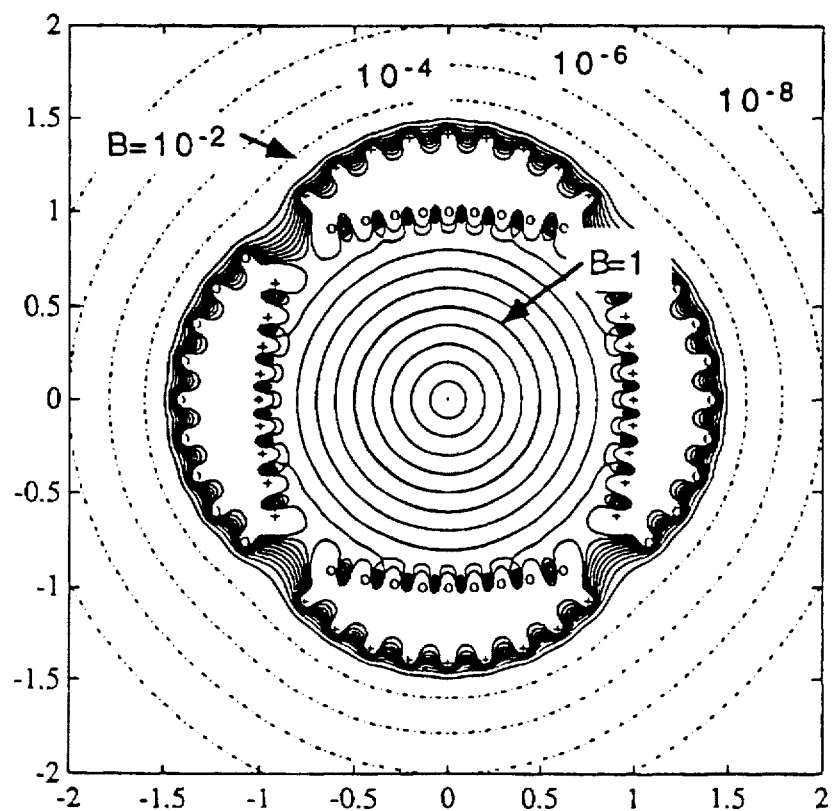
FIG. 48 illustrates a 36-wire, four-plane symmetric quadrupole actively shielded by 36 wires.

FIG. 48 shows a 36-wire four-plane-symmetric quadrupole actively shielded by 36 wires. The roughly circular contours of the magnitude of B are linearly changing steps in the interior, where the constant spacing indicates the constant radial gradient, and the steps are logarithmic outside the system. The radial lines are contours of $B_x=0$. The number of these lines indicates the lowest non-zero azimuthal harmonic, in this case $\sin(39\emptyset)$. Since the harmonic number and the rate of field decrease are the same, the exterior field varies as $r^{-39}$. For optimum configurations, each wire added (in sets of four in this four-plane-symmetric case) to the field canceling current set changes the exponent of r by one. A four-plane-symmetric quadrupole has an external field decrease of $r^{-3}$ with no active shielding, so the 36 wires added here improve that to $r^{-39}$. Just as in the primary wire sets, sub-optimum configurations are possible in which fewer harmonics are canceled than is possible with that number of wires, and these configurations may have useful geometric characteristics.

The improvement in the active shielding methods from circular-only to general configurations improves the utility of the uniform field system in many applications. The single-plane-symmetric dipoles and their extensions open up new sensor and imaging applications because of the wide open side possible for dipoles and wide openings in higher order multipoles derived from the dipoles.

The system of FIG. 40, or an actively shielded version thereof, may be placed over a moving belt on a production line, and rapid pulsed imaging or resonance spectroscopic measurements made. One such measurement might be the fat percentage in meat using chemical shift resonance spectroscopy, which requires very high field accuracy. These accuracies have heretofore been available only in laboratory solenoidal magnets, which have very limited access.

An additional application of the configurations with wide openings is in specialized MRI systems for limbs or heads, or for mammograms. The devices may be more efficient than present devices, because they can be relatively small, requiring less total field energy. Another application is that of plasma containment devices. There is a device which is an adjunct to tokamak confinement geometries that is referred to as an octupole (not to be confused with the octupoles of the present invention). This device is a set of four conductors with currents identical in magnitude and direction spaced 90° apart on a circle. Expansion of the field in azimuthal harmonics shows that there are no dipole, quadrupole, or sextupole components, but that the octupole component has an azimuthal sinusoidal variation, so it is not a octupole in the sense of the present invention. However, it improves the plasma confinement of certain research magnetic fusion devices. Other applications of the present invention include use of the rotating field versions of the invention as a motor geometry or an accelerator for conducting armatures ("coil gun").

The above equations for dipoles and quadrupoles, including those that have active external field reductions, can be modified to include the effects of ferromagnetic and conducting shields. Derivation of the equations for the shielded systems utilizes the method of images for both ferromagnetic and conducting shield materials, as previously discussed in detail.

The shields may be used with the single-plane-symmetry dipoles, both unipolar and bipolar, and the higher multipoles derived therefrom in the same way as in the previously described two-plane-symmetric dipoles and higher multipole derivatives. Shields may also be used with systems that utilize the active external field reduction currents. This use has the advantage of reducing the field magnitude in the shield material, thus avoiding nonlinearities produced by saturation or finite thickness effects that would occur if the combination of active and passive shielding were not used. This combination can allow more compact systems to be built in systems requiring complete shielding, since the passive shield can be closer to the field generating currents.

These methods and equations can also be used to design additions to existing transverse field magnets that can provide both active external field reduction and simultaneously improve the quality of the internal field. The method is similar to the solutions of the overconstrained equations that produce the previously mentioned suboptimum wire configurations. The method is best illustrated by the following example.

Figure 49:
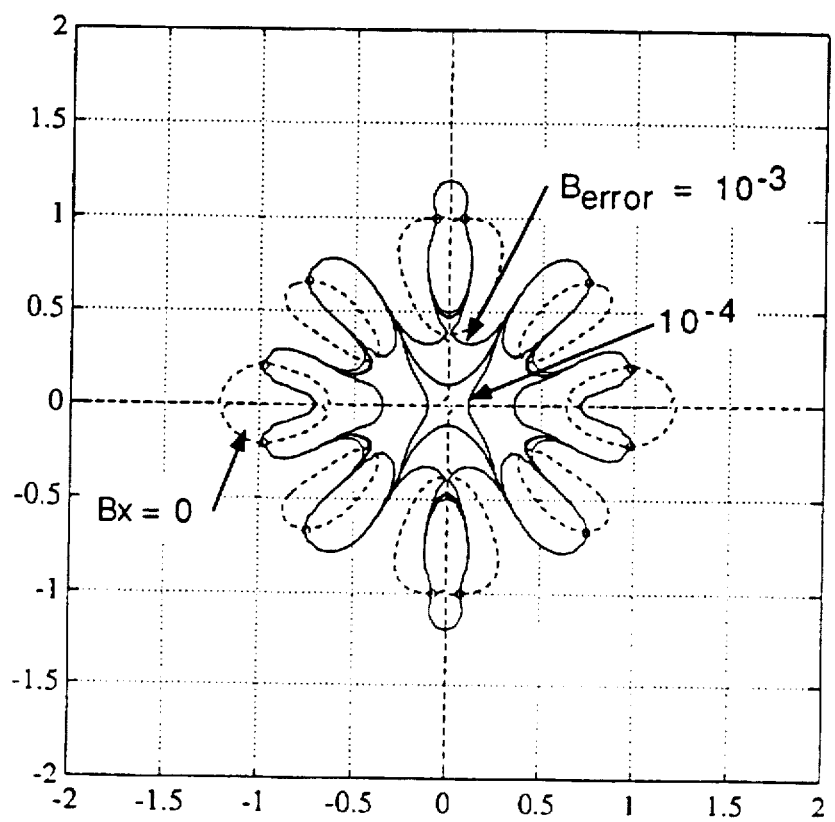
FIG. 49 illustrate a non-optimum 12-wire two-plane-symmetric dipole to be improved by addition of wires.

The existing wire set to be improved is taken to be the 12-wire two-plane-symmetric dipole shown in FIG. 49. This non-optimum configuration has moderately good accuracy, as shown by the solid lines in FIG. 50, which are curves of field error referenced to the field at the dipole center. The dashed curve is the field magnitude, which is unity at the system center, and decreases as $r^{-2}$ outside the wire circle as expected for a dipole. The number of wires that can be added is arbitrary, and is chosen here to be 12. The total system then has 12 primary wires, and 12 external wires that will be used to improve the internal field and decrease the external field.

If the locations of the primary wires were not already specified, there would be 11 equations to solve for 11 free variables. The 11 equations would be taken from the set shown in equations (24) and (25) as follows:

(1) $I_1 R_1 \cos(\emptyset_1) + I_2 R_2 \cos(\emptyset_2) + I_3 R_3 \cos(\emptyset_3) - I_4 R_4 \cos(\emptyset_4) - I_5 R_5 \cos(\emptyset_5) - I_6 R_6 \cos(\emptyset_6) = 0$ (2) $I_{1R1}^3 \cos(3\emptyset_1) + I_2 R_2^3 \cos(3\emptyset_2) + I_3 R_3^3 \cos(3\emptyset_3) - I_{4R4}^3 \cos(3\emptyset_4) - I_5 R_5^3 \cos(3\emptyset_5) - I_{6R6}^3 \cos(3\emptyset_6) = 0$ (3) $I_1 R_1^5 \cos(5\emptyset_1) + I_2 R_2^5 \cos(5\emptyset_2) + I_3 R_3^5 \cos(5\emptyset_3) - I_4 R_4^5 \cos(5\emptyset_4) - I_5 R_5^5 \cos(5\emptyset_5) - I_6 R_6^5 \cos(5\emptyset_6) = 0$ (4) $I_1 R_1^7 \cos(5\emptyset_1) + I_2 R_2^7 \cos(5\emptyset_2) + I_3 R_3^7 \cos(5\emptyset_3) - I_4 R_4^7 \cos(5\emptyset_4) - I_5 R_5^7 \cos(5\emptyset_5) - I_6 R_6^7 \cos(5\emptyset_6) = 0$ (5) $I_1 R_1^9 \cos(9\emptyset 1) + I_2 R_2^9 \cos(9\emptyset_2) + I_3 R_3^9 \cos(9\emptyset_3) - I_4 R_4^9 \cos(9\emptyset_4) - I_5 R_5^9 \cos(9\emptyset_5) - I_6 R_6^9 \cos(9\emptyset_6) = 0$ (6) $I_1 R_1^{11} \cos(11\emptyset_1) + I_2 R_2^{11} \cos(11\emptyset_2) + I_3 R_3^{11} \cos(11\emptyset_3) - I_4 R_4^{11} \cos(11\emptyset_4) - I_5 R_5^{11} \cos(11\emptyset_5) - I_6 R_6^{11} \cos(11\emptyset_6) = 0$ (7) $I_1/R_1^3 \cos(3\emptyset_1) + I_2/R_2^3 \cos(3\emptyset_2) + I_3/R_3^3 \cos(3\emptyset_3) - I_4/R_{43} \cos(3\emptyset_4) - I_5/R_5^3 \cos(3\emptyset_5) - I_6/R_6^3 \cos(3\emptyset_6) = 0$ (8) $I_1/R_1^5 \cos(5\emptyset_1) + I_2/R_2^5 \cos(5\emptyset_2) + I_3/R_3^5 \cos(5\emptyset_3) - I_4/R_4^5 \cos(5\emptyset_4) - I_5/R_5^5 \cos(5\emptyset) - I_6/R_6^5 \cos(5\emptyset_6) = 0$ (9) $I_1/R_1^7 \cos(7\emptyset_1) + I_2/R_2^7 \cos(7\emptyset_2) + I_3/R_3^7 \cos(7\emptyset_3) - I_4/R_4^7 \cos(7\emptyset_4) - I_5/R_5^7 \cos(7\emptyset_5) - I_6/R_6^7 \cos(7\emptyset_6) = 0$

(10) $I_1/R_1^9 \cos(9\emptyset_1) + I_2/R_2^9 \cos(9\emptyset_2) + I_3/R_3^9 \cos(9\emptyset_3) - I_4/R_4^9 \cos(9\emptyset_4) - I_5/R_5^9 \cos(9\emptyset_5) - I_6/R_6^9 \cos(9\emptyset_6) = 0$

(11) $I_1/R_1^{11} \cos(11\emptyset_1) + I_2/R_2^{11} \cos(11\emptyset_2) + I_3/R_3^{11} \cos(11\emptyset_3) - I_4/R_4^{11} \cos(11\emptyset_4) - I_5/R_5^{11} \cos(11\emptyset_5) - I_6/R_6^{11} \cos(11\emptyset_6) = 0$.  (32)

The subscripts 1, 2, and 3 refer to the existing wires, and the subscripts 4, 5, and 6 refer to the wires to be added. The currents of the existing wires are taken to be equal to 1, and their angles are fixed on a circle of radius 1. Other wire positions and currents could be assumed for the example existing coil. For this example, two of the added wires are restricted to a circle of radius r=2, and the added 3 wire currents, 3 azimuthal positions, and one radius will be determined by the equation solutions.

Equations 1–6 immediately above are pertinent to the azimuthal harmonics in the exterior, that is, to the external field reduction. Equations 7–11 are pertinent to the internal uniformity of the dipole. For this example, there are 7 free variables, and equations 1–6 and equation 7 were solved to determine their values. Equations 8–11 are omitted.

Figure 50:
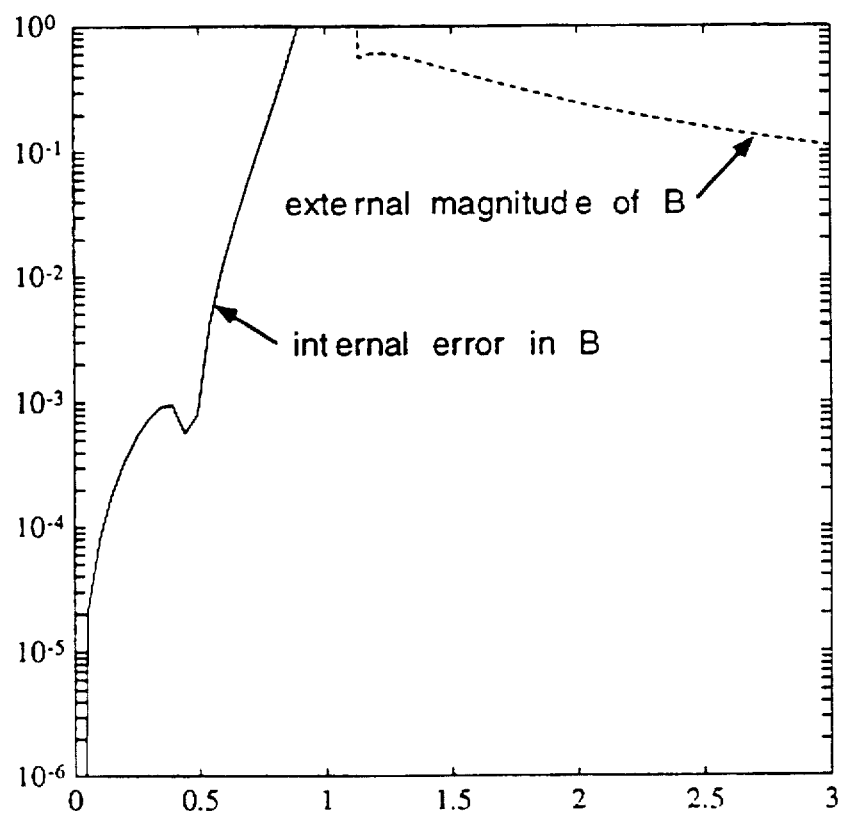
FIG. 50 shows curves of field error (solid) and field magnitude (dashed) referenced to the field at the dipole center for the dipole of FIG. 49.
Figure 51:
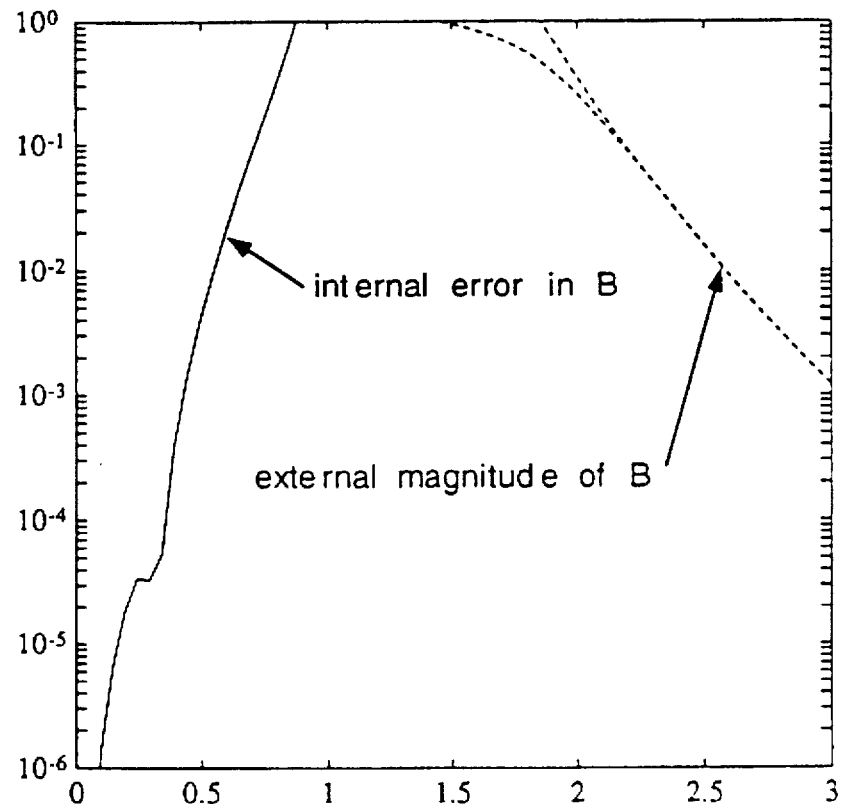
FIG. 51 shows curves of field error (solid) and field magnitude (dashed) referenced to the field at the dipole center for the dipole of FIG. 49 after addition of external wires at r=2.

The results are shown in FIG. 51, which should be compared with FIG. 50. The interior field uniformity has improved by a factor of approximately 10 at r=0.5, and the exterior field now decreases at a rate of $r^{-14}$. The interior field could be further improved by the addition of more wires with more equations to be solved, or by a different choice of equations solved. Fewer external wires could be added with correspondingly less effective field reduction.

Industrial Applicability

The various embodiments of the invention have utilities including the following:

Uniform constant dipole magnetic field:
    Magnetic Resonance Imaging (MRI) for:
        Medical applications
        Imaging of industrial solids, liquids and sheets
        Imaging of flows of fluids, slurries, mixtures, and powders
    Magnetic resonance microscopy
    Nuclear Magnetic Resonance (NMR) spectroscopy
    Charged particle beam steering and guiding
    Charged particle momentum analyzers
    Atomic clocks
    Isotope separators Uniform pulsed dipole magnetic field:
    Pulsed MRI for medical or industrial imaging
    High-field pulsed-beam charged particle momentum analyzer Rotating dipole magnetic field:
    Rotating field for NMR spectroscopy, including with solenoid
    Time-resolved charged-particle momentum analyzer Quadrupole, sextupole, and higher multipole magnetic field:
    Focusing magnet for charged particle beams
    Separator for removing ferromagnetic materials from fluids Rotating quadrupole and higher multipole magnetic field:
    Compact focusing devices for charged particle beams Uniform dipole electric field:
    Charged particle beam guiding, e.g., electrons in image tubes
    Charged particle energy analyzers Quadrupole, sextupole, and higher multipole electric field
    Focusing devices for charged particle beams
    Separators for liquids with different dielectric properties
    Separators for removing particles from fluids The invention is further illustrated by the following non-limiting examples.

EXAMPLE 1

A working model of the 16-wire uniform magnetic field system shown in cross-section in FIG. 7 was built, having a primary-wire cylinder radius of 5 cm, with the 8 primary loop coils made of 7 turns each of #17 Formvar-insulated magnet wire, and the 8 field-cancellation coils made of 4 turns of the same wire. All coils were operated in series, with sets of measurements made with and without current in the field cancellation coils. The relationship between applied current and the measured field in the core region inside the primary coils was that calculated within the accuracy of the current and field measurements possible at the low fields (1 mT) produced by the low current capacity of the wire used. The field variation along a radius was also that calculated, within measurement accuracy and resolution. With the use of the field cancellation coils, the field outside the system fell so rapidly to the 0.05 mT background that a rate of decrease with radius could not be determined.

EXAMPLE 2

A working model of the electric gradient separator embodiment of the invention was also built. Two glass 50 cc graduated cylinders were each filled with a mixture of clear vegetable oil (canola oil) mixed with 10% deionized water in a blender to a milky appearance. A simple four-conductor quadrupole field was generated by about 6 kV applied to four strips of 5 mm wide copper tape glued vertically and evenly spaced around on one of the cylinders. After about one hour, more than half the water had separated from the oil with the field applied, and had collected in the bottom of the cylinder. The water is not miscible with oil, and the drops tend to combine when brought together. Water is denser than the oil, and when the drops become large enough (drag and thermal mixing effects become small relative to mass and gravity), the drops sink. Other relatively large droplets (visually enough to account for the other half of the water) had collected on the sides of the cylinder, but had not coalesced and sunk to the bottom. The oil was clear enough to see through. The oil/water mixture in the cylinder without the field applied was visually unchanged, with no visible water in the bottom and retaining the original milky translucent appearance. The separation rate verified a rough calculation of the forces and velocities to be expected with small spheres of water in viscous oil at low Reynolds numbers.

The preceding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, patents, and publications cited above are hereby incorporated by reference.

What is claimed is:

1. An apparatus for generating an electromagnetic field having a region of homogeneity of a characteristic of said electromagnetic field, said apparatus comprising:

a central axis of said apparatus; and at least eight conductive pathways disposed about and substantially parallel to said central axis, azimuthal locations, current or charge magnitudes, and distances from said central axis of said conductive pathways being substantially defined by: solutions to one or more equations selected from the group consisting of $$\overset{J}{\underset{j=1}{C}} \left\{ 0.5 I_0/R_0^{q(j+1)} + \overset{N}{\underset{n=1}{\Sigma}} I_n \cos[q(j+1)\phi_n]/R_n^{q(j+1)} = 0 \right\}$$

and $$\overset{J}{\underset{j=1}{C}} \left\{ \overset{N}{\underset{n=1}{\Sigma}} I_n \sin[q(j+1)\phi_n]/R_n^{q(j+1)} = 0 \right\}$$

where N is a number of conductive pathways, $\emptyset_n$ are the azimuthal locations of said conductive pathways, $R_n$ are the distances from said central axis of said conductive pathways, $I_n$ are the current or charge magnitudes, J is an integer equal to one less than a total number of conductive pathways in said apparatus, C is a collection of J equations to be solved, all identical except that running index j changes from 1 to J from equation to equation, $\Sigma$ is a sum of N terms in each equation over index n, q is a positive integer, and a number of planes of symmetry of said apparatus is less than 2q;

wherein said characteristic comprises a characteristic selected from the group consisting of rate of rotation, field magnitude, radial gradient, and higher order radial derivatives of field magnitude.

2. The apparatus of claim 1 wherein said apparatus comprises a device selected from the group consisting of magnetic resonance imager, pulsed magnetic resonance imager, magnetic resonance microscope, nuclear magnetic resonance spectroscope, charged particle beam steerer, charged particle momentum analyzer, high-field pulsed-beam charged particle momentum analyzer, time-resolved charged-particle momentum analyzer, atomic clock, isotope separator, charged particle beam focuser, separator for removing ferromagnetic material from fluids, charged particle beam guider, charged particle energy analyzer, separator of fluids having different dielectric properties, separator of particles from fluids, and a rasterizer.

3. A method for generating an electromagnetic field having a region of homogeneity of a characteristic of the electromagnetic field, the method comprising the steps of:

a) establishing a central axis;

b) situating at least eight conductive pathways disposed about and substantially parallel to the central axis, azimuthal locations, current or charge magnitudes, and distances from the central axis of the conductive pathways being substantially defined by: solutions to one or more equations selected from the group consisting of $$\overset{J}{\underset{j=1}{C}} \left\{ 0.5 I_0/R_0^{q(j+1)} + \overset{N}{\underset{n=1}{\Sigma}} I_n \cos[q(j+1)\phi_n]/R_n^{q(j+1)} = 0 \right\}$$

and $$\overset{J}{\underset{j=1}{C}} \left\{ \overset{N}{\underset{n=1}{\Sigma}} I_n \sin[q(j+1)\phi_n]/R_n^{q(j+1)} = 0 \right\}$$

where N is a number of conductive pathways, $\emptyset_n$ are the azimuthal locations of the conductive pathways, $R_n$ are the distances from the central axis of the conductive pathways, $I_n$ are the current or charge magnitudes, J is an integer equal to one less than a total number of conductive pathways about the central axis, C is a collection of J equations to be solved, all identical except that running index j changes from 1 to J from equation to equation, $\Sigma$ is a sum of N terms in each equation over index n, q is a positive integer, and a number of planes of symmetry of the conductive pathways is less than 2q; and c) generating the electromagnetic field comprising a region of homogeneity of a characteristic selected from the group consisting of rate of rotation, field magnitude, radial gradient, and higher order radial derivatives of field magnitude.

4. The method of claim 3 wherein the generating step comprises generating the electromagnetic field within a device selected from the group consisting of magnetic resonance imager, pulsed magnetic resonance imager, magnetic resonance microscope, nuclear magnetic resonance spectroscope, charged particle beam steerer, charged particle momentum analyzer, high-field pulsed-beam charged particle momentum analyzer, time-resolved charged-particle momentum analyzer, atomic clock, isotope separator, charged particle beam focuser, separator for removing ferromagnetic material from fluids, charged particle beam guider, charged particle energy analyzer, separator of fluids having different dielectric properties, separator of particles from fluids, and a rasterizer.

5. An apparatus for generating a shielded electromagnetic field having a region of homogeneity of a characteristic of said electromagnetic field, said apparatus comprising:

a central axis of said apparatus;

at least four primary and four secondary conductive pathways disposed about and substantially parallel to said central axis, azimuthal locations, current or charge magnitudes, and distances from said central axis of said conductive pathways being substantially defined by: solutions to one or more equations selected from the group consisting of $$\underset{j=1}{\overset{J_p}{C}} \left\{ 0.5[I_{0a}/R_{0a}^{q(j+1)} - I_{0b}/R_{0b}^{q(j+1)}] + \sum_{n=1}^{N} I_{na}\cos[(j+1)q\varnothing_{na}]/R_{na}^{q(j+1)} - \sum_{m=1}^{M} I_{mb}\cos[(j+1)q\varnothing_{mb}]/R_{mb}^{q(j+1)} = 0 \right\},$$

and $$\underset{j=1}{\overset{J_s}{C}} \left\{ 0.5[I_{0a}R_{0a}^{q(j-1)} - I_{0b}R_{0b}^{q(j-1)}] + \sum_{n=1}^{N} I_{na}\cos[q(j-1)\varnothing_{na}]R_{na}^{q(j+1)} - \sum_{m=1}^{M} I_{mb}\cos[(j-1)q\varnothing_{mb}]R_{mb}^{q(j-1)} = 0 \right\},$$

and $$\underset{j=1}{\overset{J_p}{C}} \left\{ \sum_{n=1}^{N} I_{na}\sin[(j+1)q\varnothing_{na}]/R_{na}^{q(j+1)} - \sum_{m=1}^{M} I_{mb}\sin[(j+1)q\varnothing_{mb}]R_{mb}^{q(j+1)} = 0 \right\},$$

and $$\underset{j=1}{\overset{J_s}{C}} \left\{ \sum_{n=1}^{N} I_{na}\sin[(j-1)q\varnothing_{na}]R_{na}^{q(j-1)} - \sum_{m=1}^{M} I_{mb}\sin[(j-1)q\varnothing_{mb}]R_{mb}^{q(j-1)} = 0 \right\},$$

where N is a number of primary conductive pathways, M is a number of secondary conductive pathways, a is a suffix referring to a primary conductive pathway, b is a suffix referring to a secondary conductive pathway, ∅ are the azimuthal locations of said conductive pathways, R are the distances from said central axis of said conductive pathways, I are the current or charge magnitudes, $J_p$ is an integer equal to one less than a total number of primary conductive pathways in said apparatus, $J_s$ is an integer equal to one less than a total number of secondary conductive pathways in said apparatus, C is a collection of equations to be solved, all identical except that running index j changes from equation to equation from 1 up to $J_p$ for primary conductive pathways and $J_s$ for secondary conductive pathways, and q is a positive integer;

wherein said characteristic comprises a characteristic selected from the group consisting of rate of rotation, field magnitude, radial gradient, and higher order radial derivatives of field magnitude.

6. A method for generating a shielded electromagnetic field having a region of homogeneity of a characteristic of the electromagnetic field, the method comprising the steps of:

a) establishing a central axis;

b) situating at least four primary and four secondary conductive pathways disposed about and substantially parallel to the central axis, azimuthal locations, current or charge magnitudes, and distances from the central axis of the conductive pathways being substantially defined by: solutions to one or more equations selected from the group consisting of $$\underset{j=1}{\overset{J_p}{C}} \left\{ 0.5[I_{0a}/R_{0a}^{q(j+1)} - I_{0b}/R_{0b}^{q(j+1)}] + \sum_{n=1}^{N} I_{na}\cos[(j+1)q\varnothing_{na}]/R_{na}^{q(j+1)} - \sum_{m=1}^{M} I_{mb}\cos[(j+1)q\varnothing_{mb}]/R_{mb}^{q(j+1)} = 0 \right\},$$

and $$\underset{j=1}{\overset{J_s}{C}} \left\{ 0.5[I_{0a}R_{0a}^{q(j-1)} - I_{0b}R_{0b}^{q(j-1)}] + \sum_{n=1}^{N} I_{na}\cos[q(j-1)\varnothing_{na}]R_{na}^{q(j-1)} - \sum_{m=1}^{M} I_{mb}\cos[(j-1)q\varnothing_{mb}]R_{mb}^{q(j-1)} = 0 \right\},$$

and $$\underset{j=1}{\overset{J_p}{C}} \left\{ \sum_{n=1}^{N} I_{na}\sin[(j+1)q\varnothing_{na}]/R_{na}^{q(j+1)} - \sum_{m=1}^{M} I_{mb}\sin[(j+1)q\varnothing_{mb}]R_{mb}^{q(j+1)} = 0 \right\},$$

and $$\underset{j=1}{\overset{J_s}{C}} \left\{ \sum_{n=1}^{N} I_{na}\sin[(j-1)q\varnothing_{na}]R_{na}^{q(j-1)} - \sum_{m=1}^{M} I_{mb}\sin[(j-1)q\varnothing_{mb}]R_{mb}^{q(j-1)} = 0 \right\},$$

where N is a number of primary conductive pathways, M is a number of secondary conductive pathways, a is a suffix referring to a primary conductive pathway, b is a suffix referring to a secondary conductive pathway, ∅are the azimuthal locations of said conductive pathways, R are the distances from said central axis of said conductive pathways, I are the current or charge magnitudes, $J_p$ is an integer equal to one less than a total number of primary conductive pathways about the central axis, $J_s$ is an integer equal to one less than a total number of secondary conductive pathways about the central axis, C is a collection of equations to be solved, all identical except that running index j changes from equation to equation from 1 up to $J_p$ for primary conductive pathways and $J_s$ for secondary conductive pathways, and q is a positive integer; and d) generating the electromagnetic field comprising a region of homogeneity of a characteristic selected from the group consisting of rate of rotation, field magnitude, radial gradient, and higher order radial derivatives of field magnitude.

* * * * *